(12) United States Patent
Wilkas et al.

(10) Patent No.: US 11,735,466 B2
(45) Date of Patent: Aug. 22, 2023

(54) ASYMMETRIC DUAL END EFFECTOR ROBOT ARM

(71) Applicant: Persimmon Technologies Corporation, Wakefield, MA (US)

(72) Inventors: Scott Wilkas, Lexington, MA (US); Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 397 days.

(21) Appl. No.: 16/880,056

(22) Filed: May 21, 2020

(65) Prior Publication Data

US 2020/0373191 A1 Nov. 26, 2020

Related U.S. Application Data

(60) Provisional application No. 62/850,783, filed on May 21, 2019.

(51) Int. Cl.
| | |
|---|---|
| *H01L 21/68* | (2006.01) |
| *H01L 21/687* | (2006.01) |
| *B25J 11/00* | (2006.01) |
| *B25J 9/02* | (2006.01) |
| *B25J 9/10* | (2006.01) |
| *B25J 9/16* | (2006.01) |
| *B25J 9/00* | (2006.01) |

(52) U.S. Cl.
CPC ...... *H01L 21/68707* (2013.01); *B25J 9/0087* (2013.01); *B25J 9/02* (2013.01); *B25J 9/105* (2013.01); *B25J 9/1682* (2013.01); *B25J 11/0095* (2013.01)

(58) Field of Classification Search
None
See application file for complete search history.

(56) References Cited

U.S. PATENT DOCUMENTS

| | | | |
|---|---|---|---|
| 6,485,250 B2 * | 11/2002 | Hofmeister | ............... B25J 9/06 414/744.1 |
| 8,777,547 B2 * | 7/2014 | Kremerman | ...... H01L 21/67742 414/217 |
| 9,840,004 B2 | 12/2017 | Hosek et al. | |
| 10,580,682 B2 | 3/2020 | Hosek et al. | |
| 2012/0141235 A1 | 6/2012 | Krupyshev et al. | ........ 414/217.1 |
| 2014/0154033 A1 | 6/2014 | Blank et al. | .................. 414/217 |

FOREIGN PATENT DOCUMENTS

WO    WO-2016/127160 A1    8/2016

* cited by examiner

*Primary Examiner* — Michael S Lowe
(74) *Attorney, Agent, or Firm* — Harrington & Smith

(57) ABSTRACT

An apparatus including a drive having motors and coaxial drive shafts; an arm assembly having a first arm and a second arm; and a controller. The first arm includes a first upper arm, a first forearm, a first end effector, and a first transmission, where the first transmission includes a non-circular pulley, and where the first upper arm and the first forearm have unequal effective lengths. The second arm includes a second upper arm, a second forearm, a second end effector, and a second transmission, where the second upper arm and the second forearm have substantially equal effective lengths. The controller is configured to cause the drive to extend and retract the arms to move an upper substrate and a lower substrate on the substrate holding areas such that the arm assembly and upper substrate do not travel over the lower substrate.

20 Claims, 54 Drawing Sheets

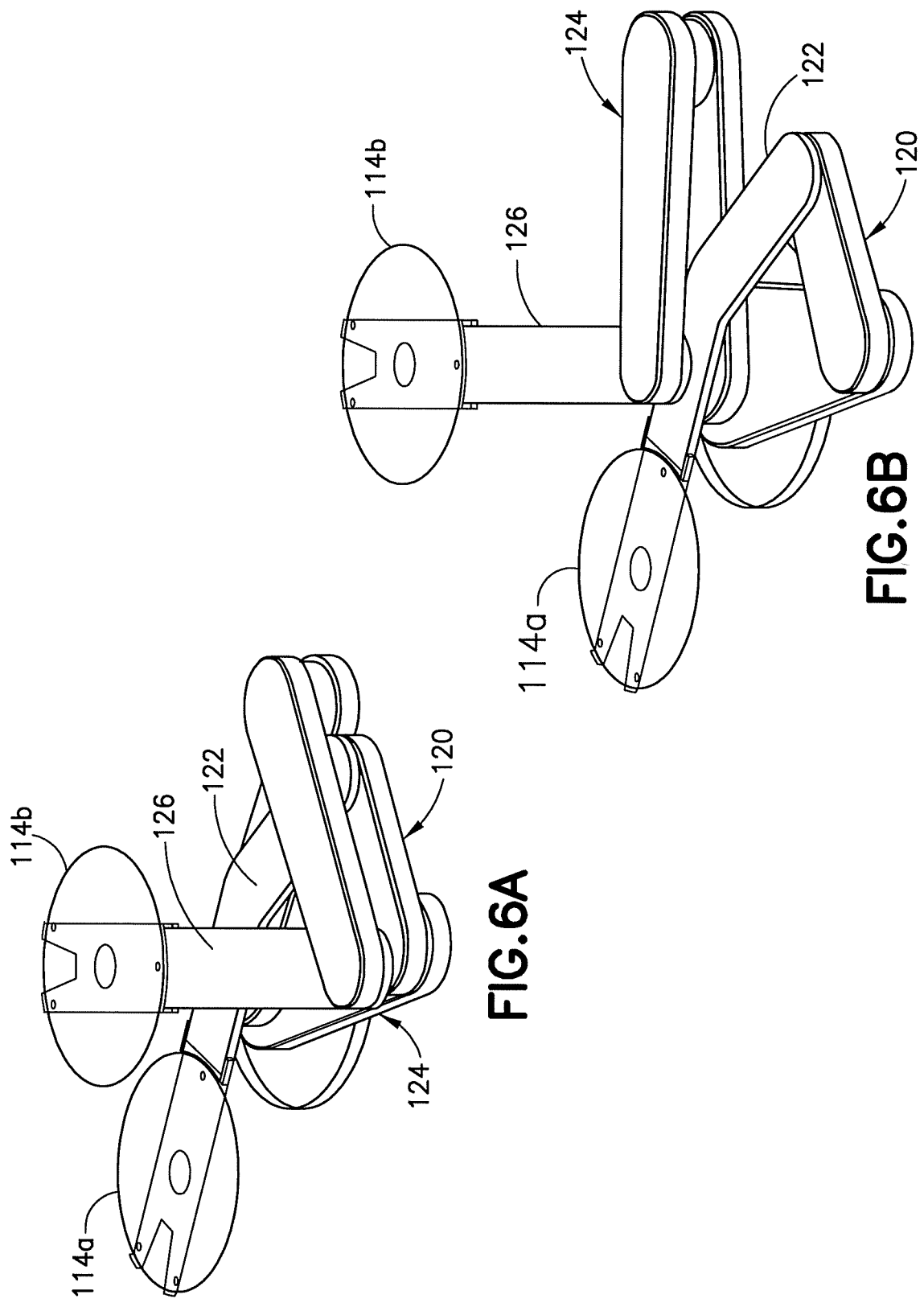

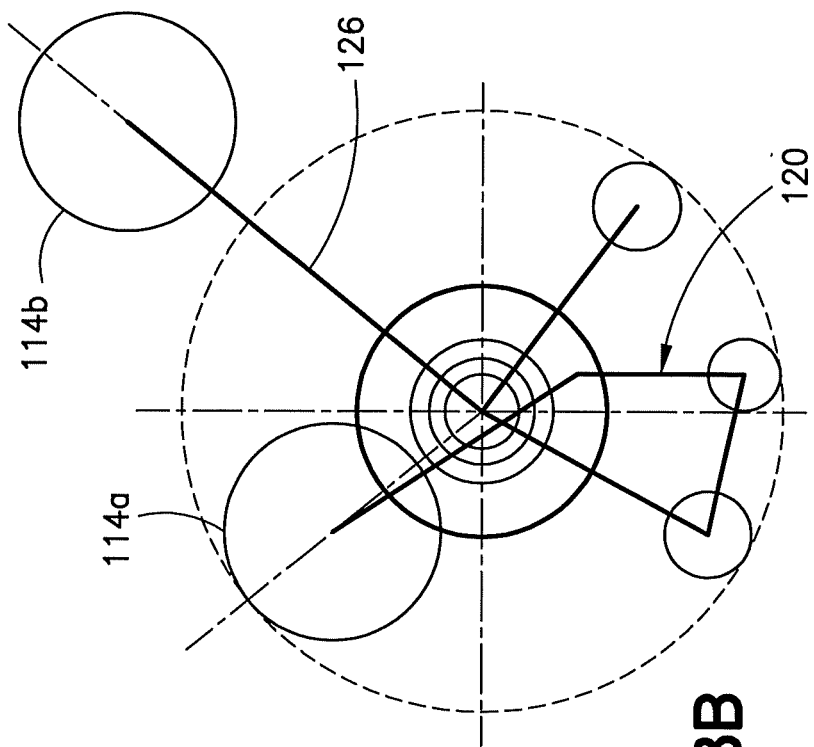
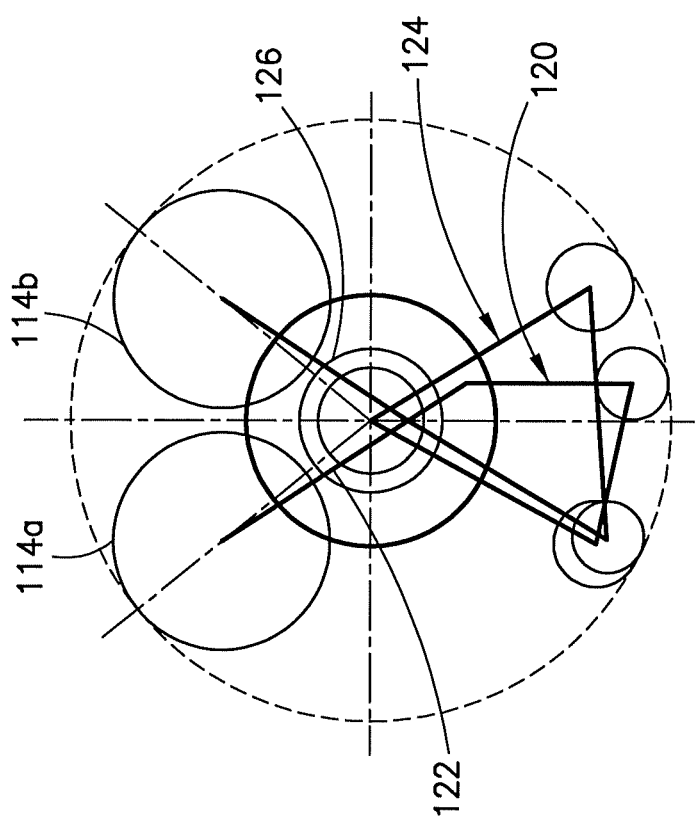

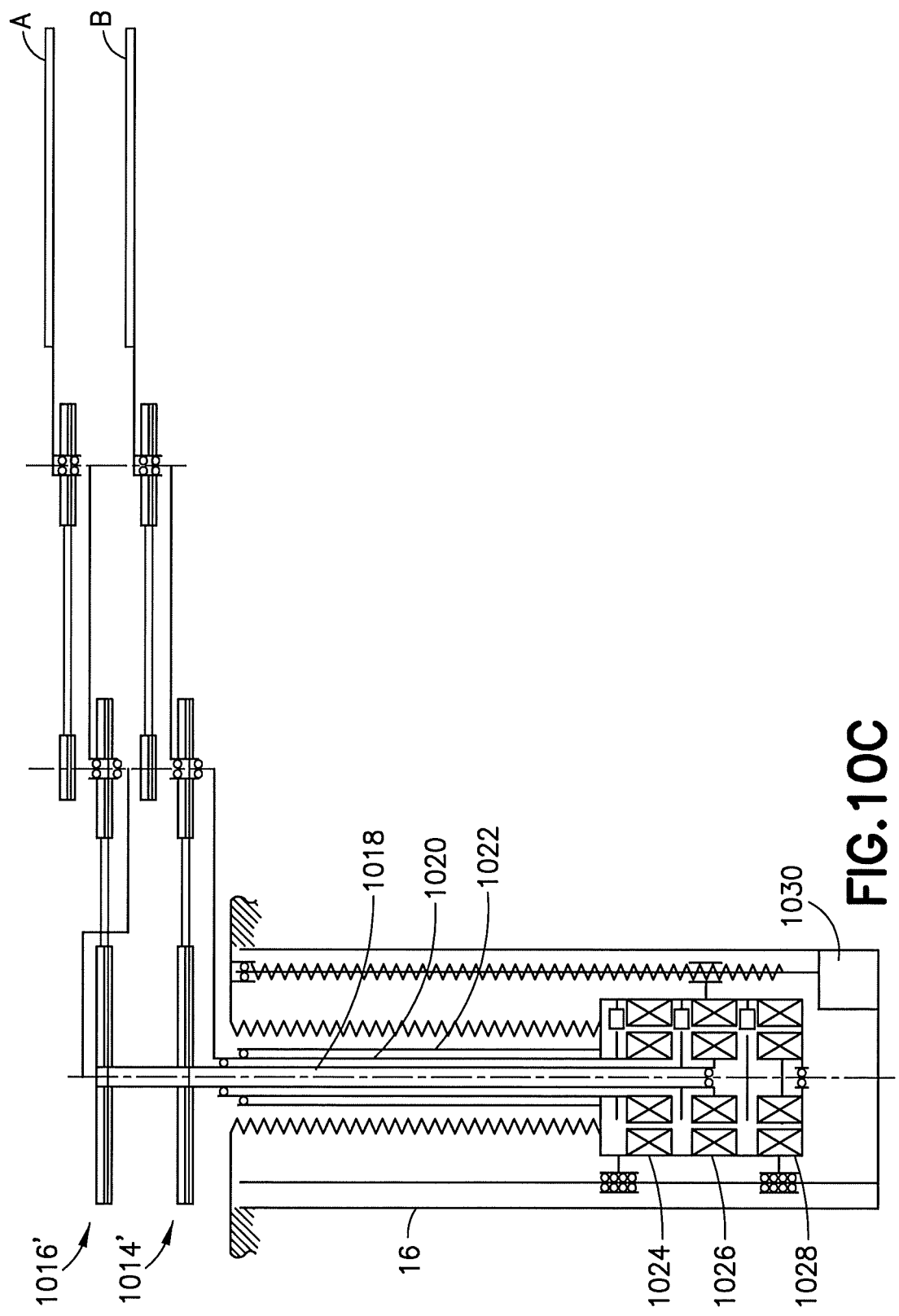

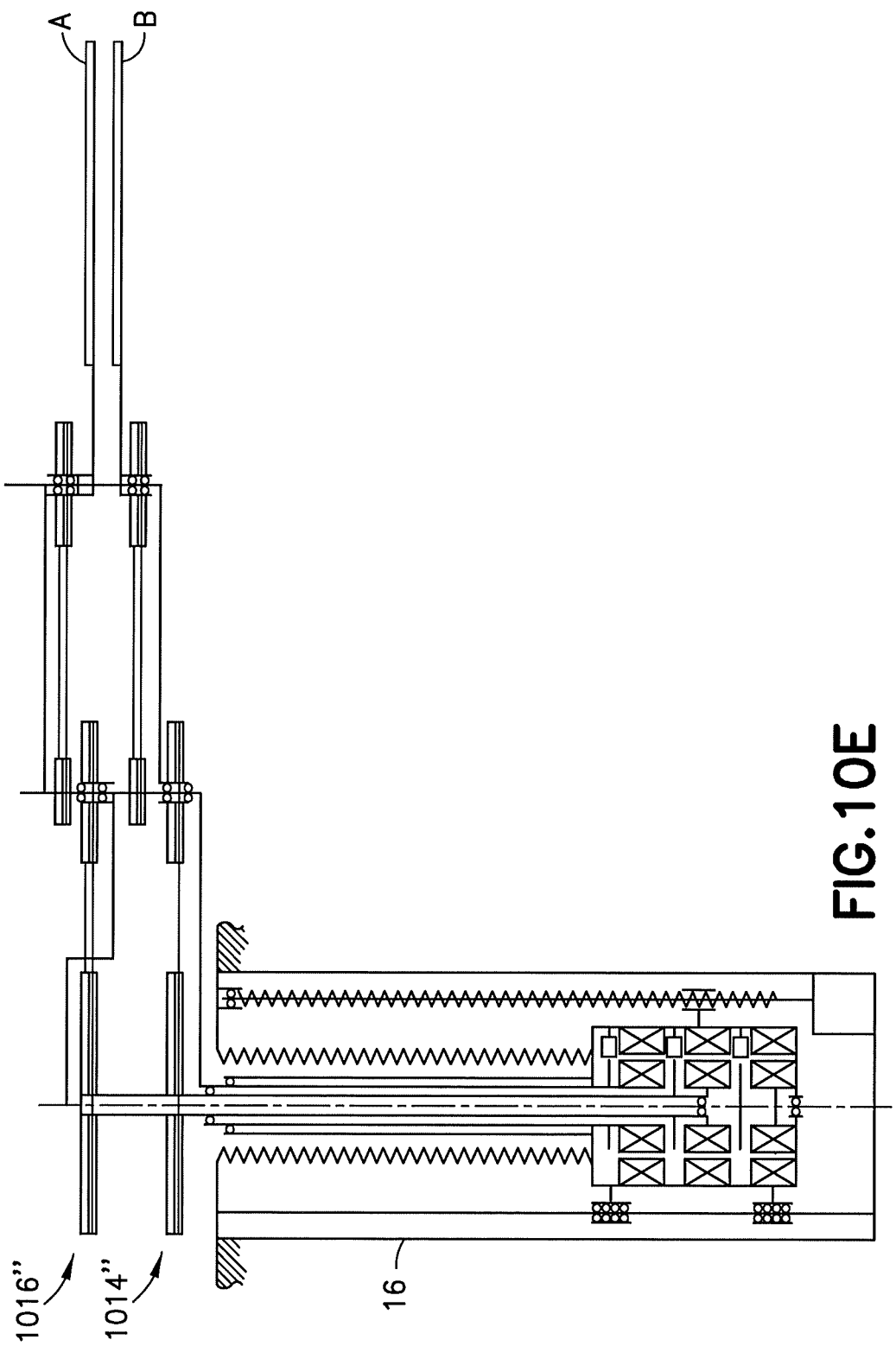

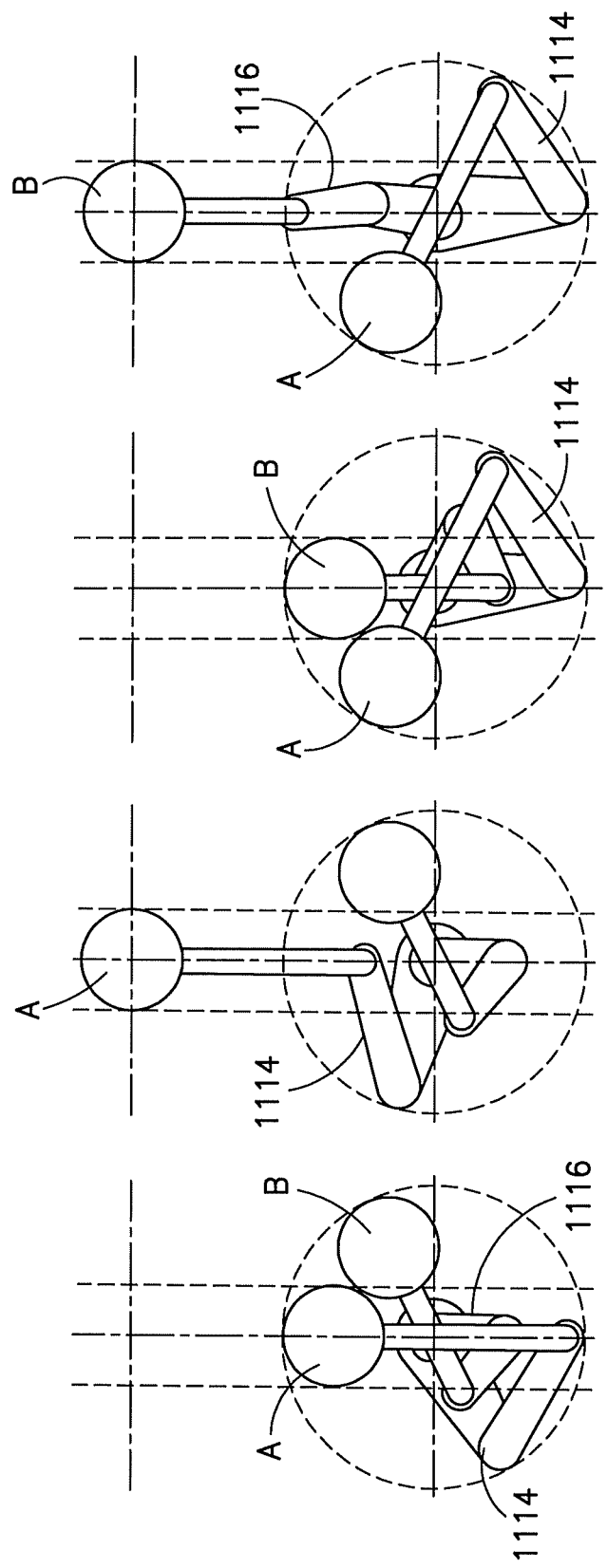

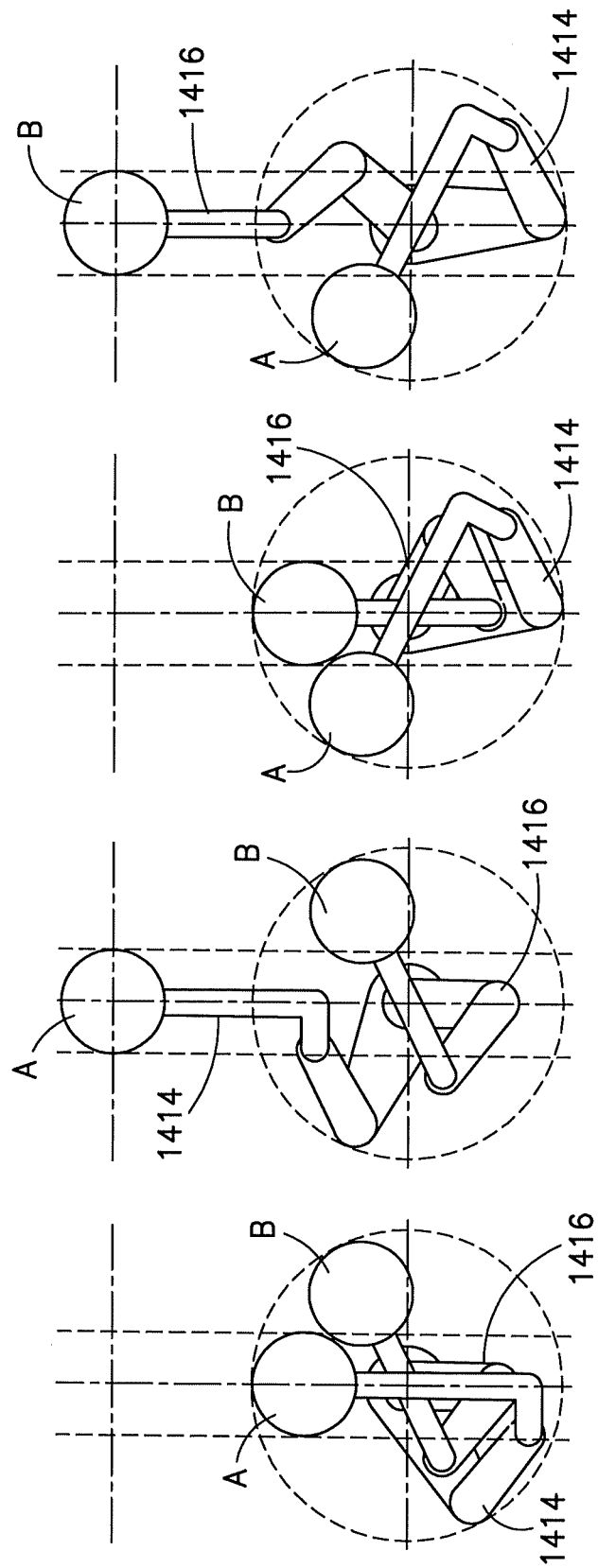

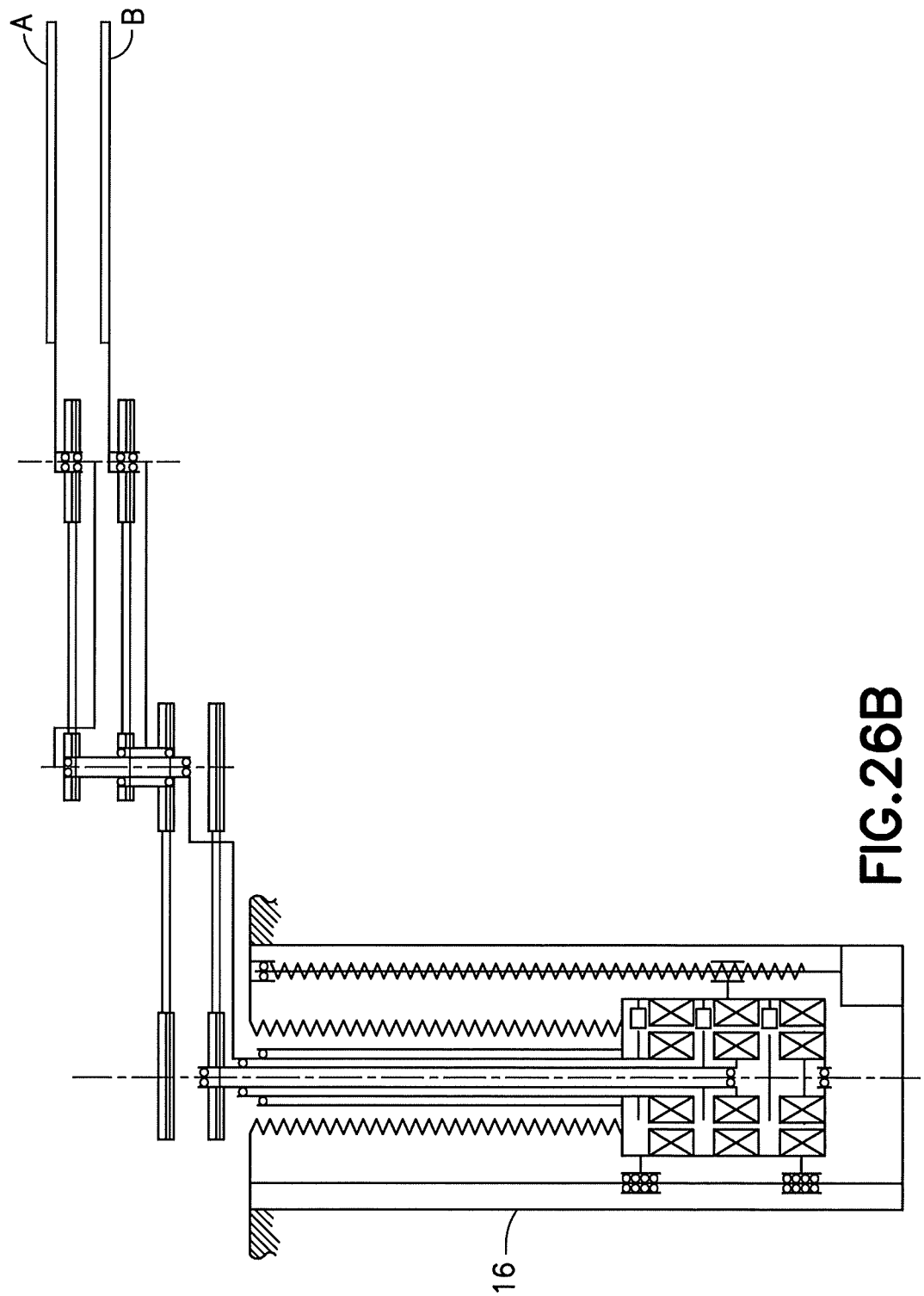

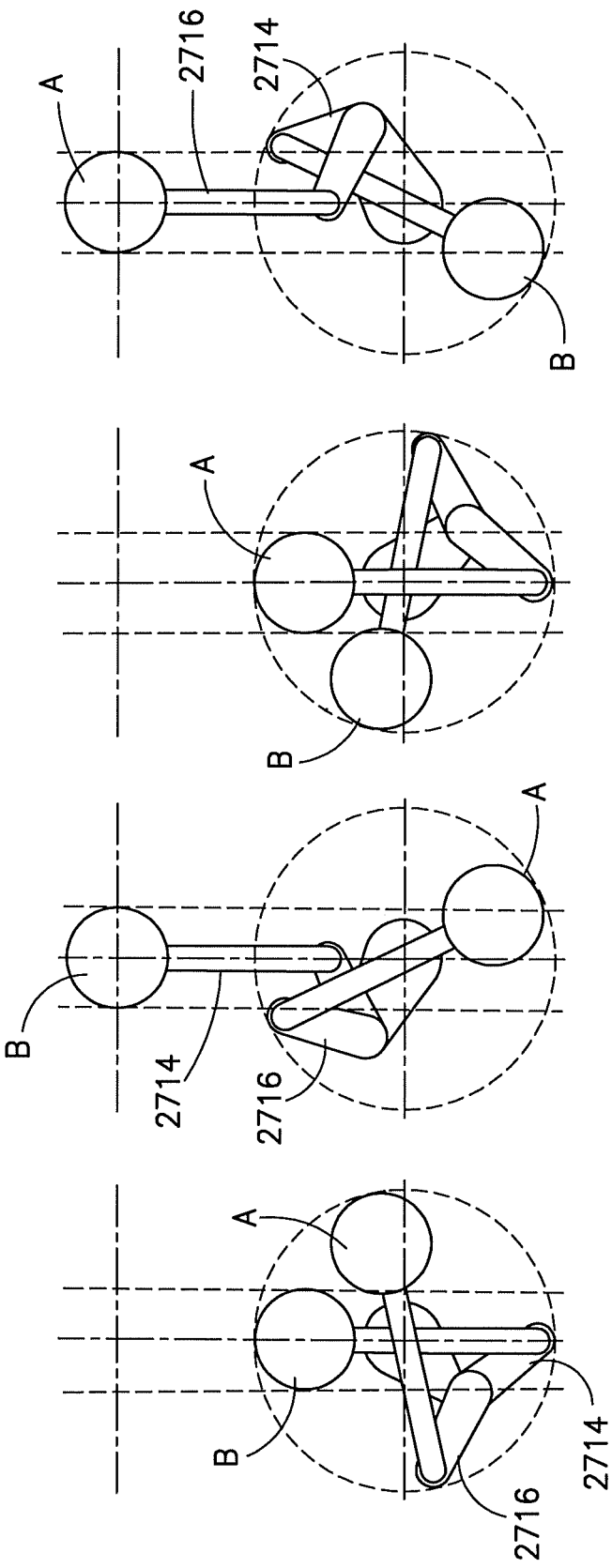

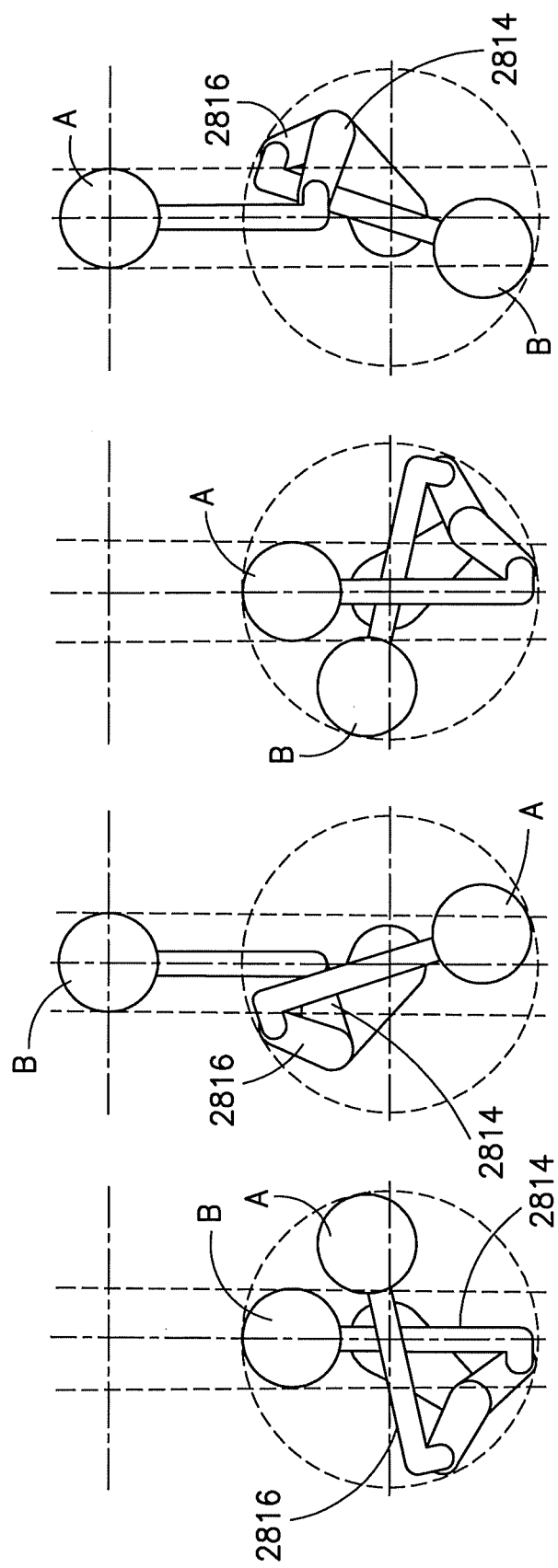

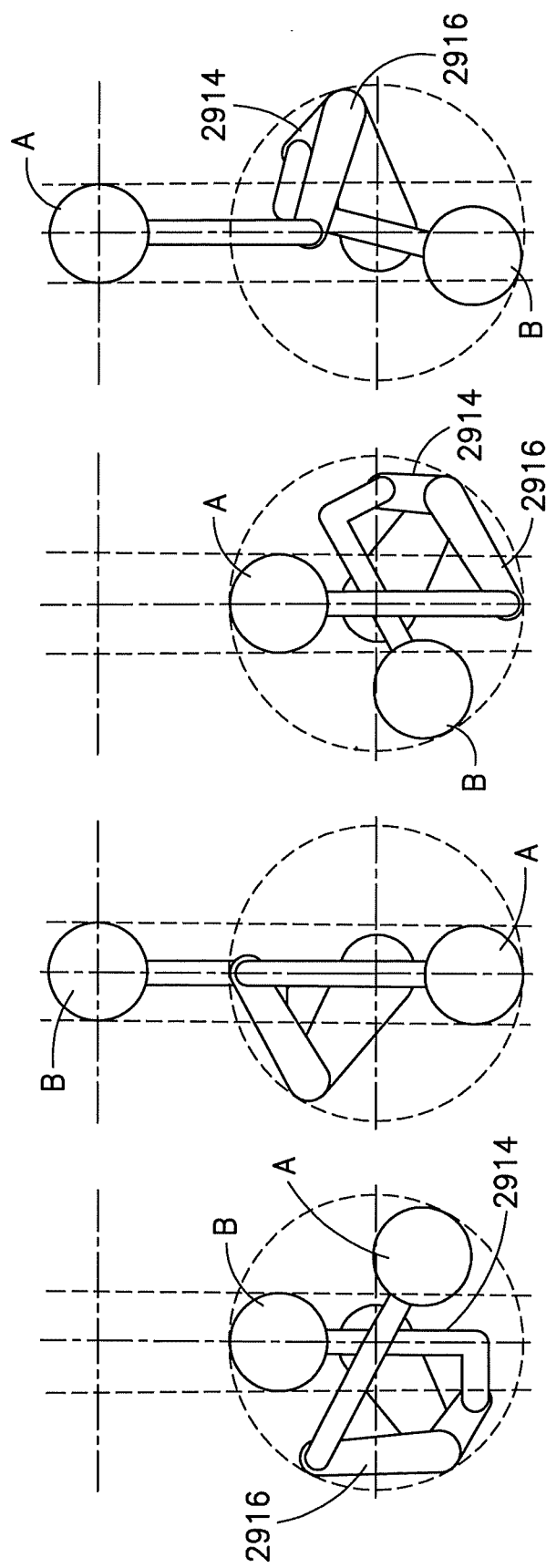

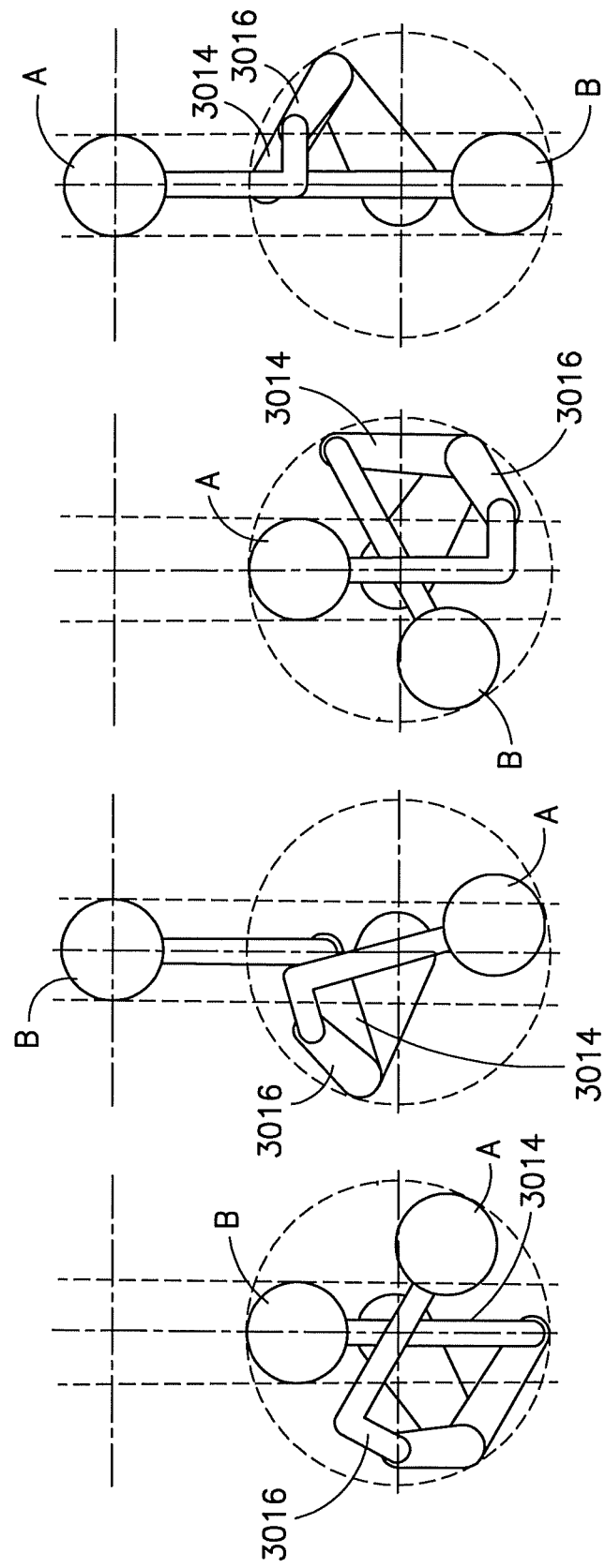

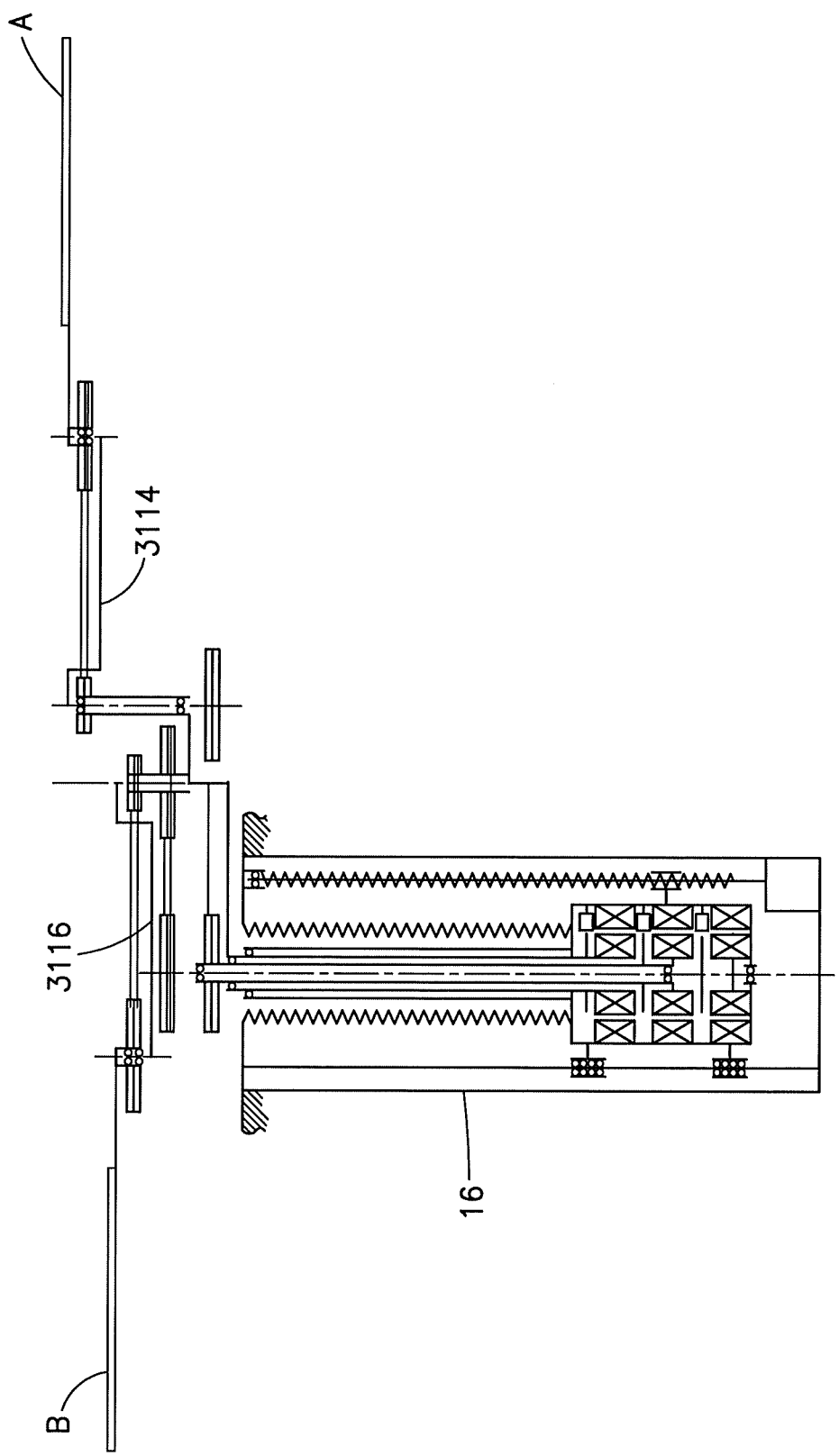

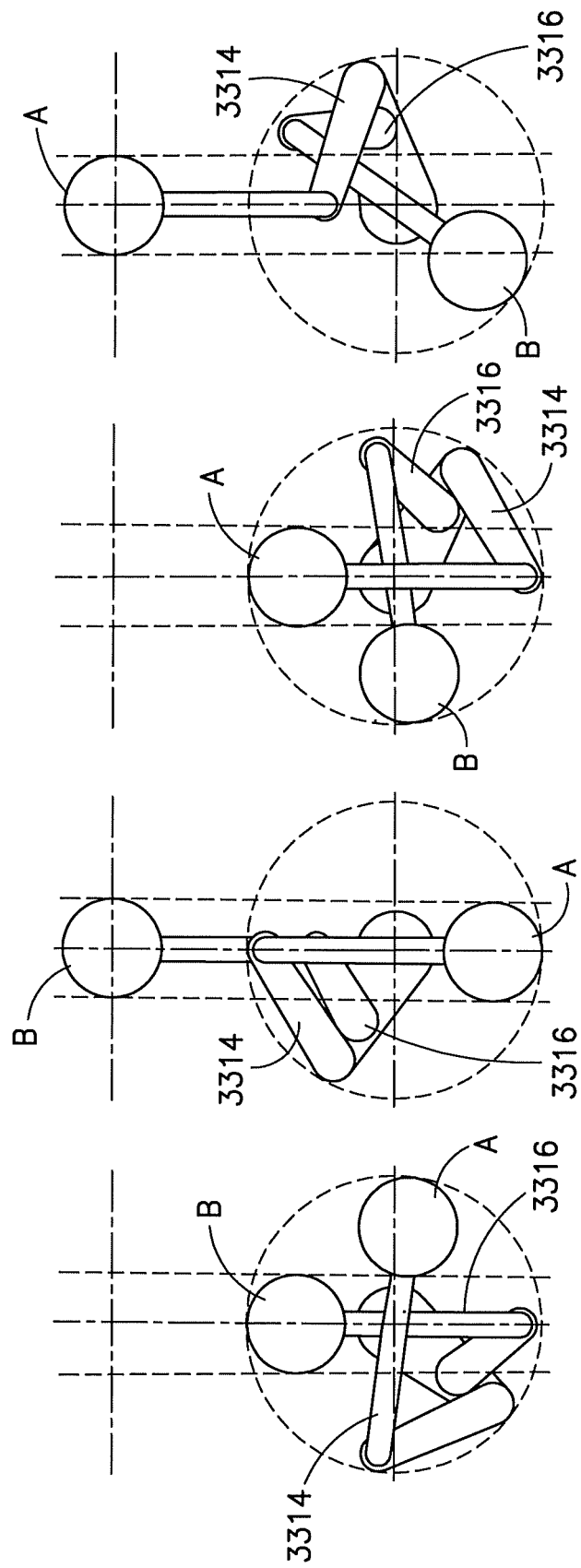

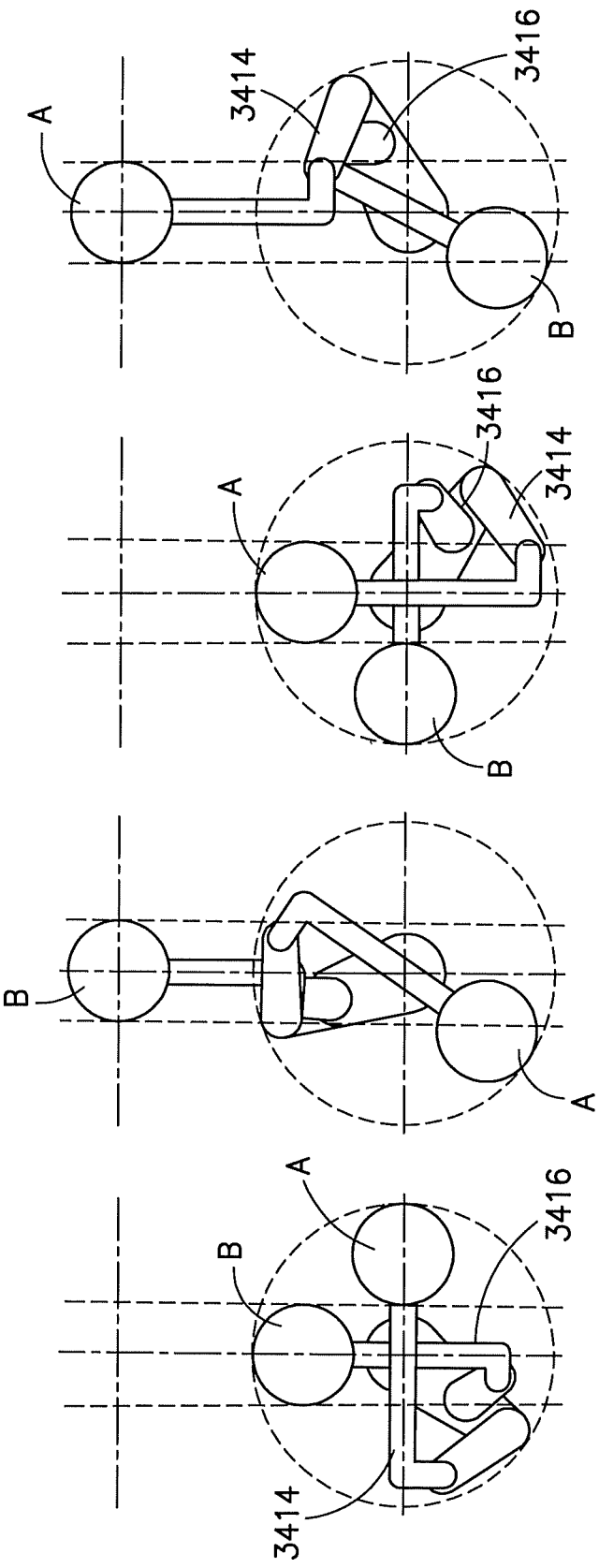

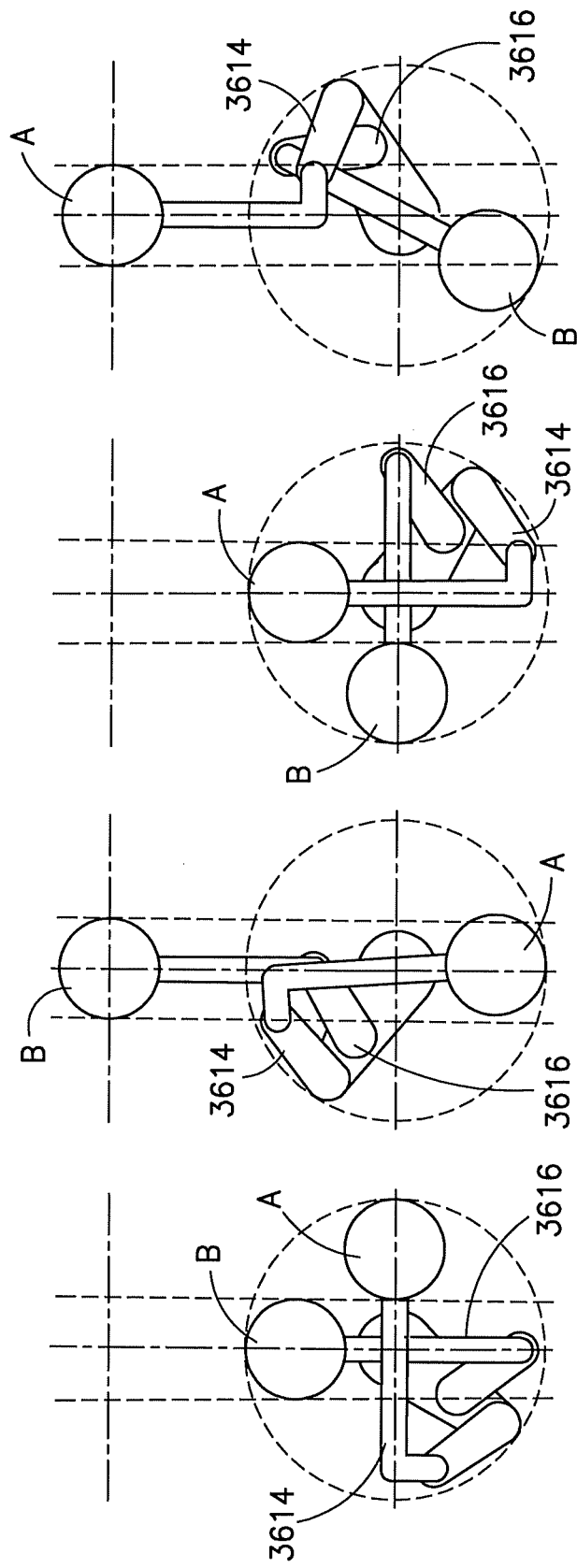

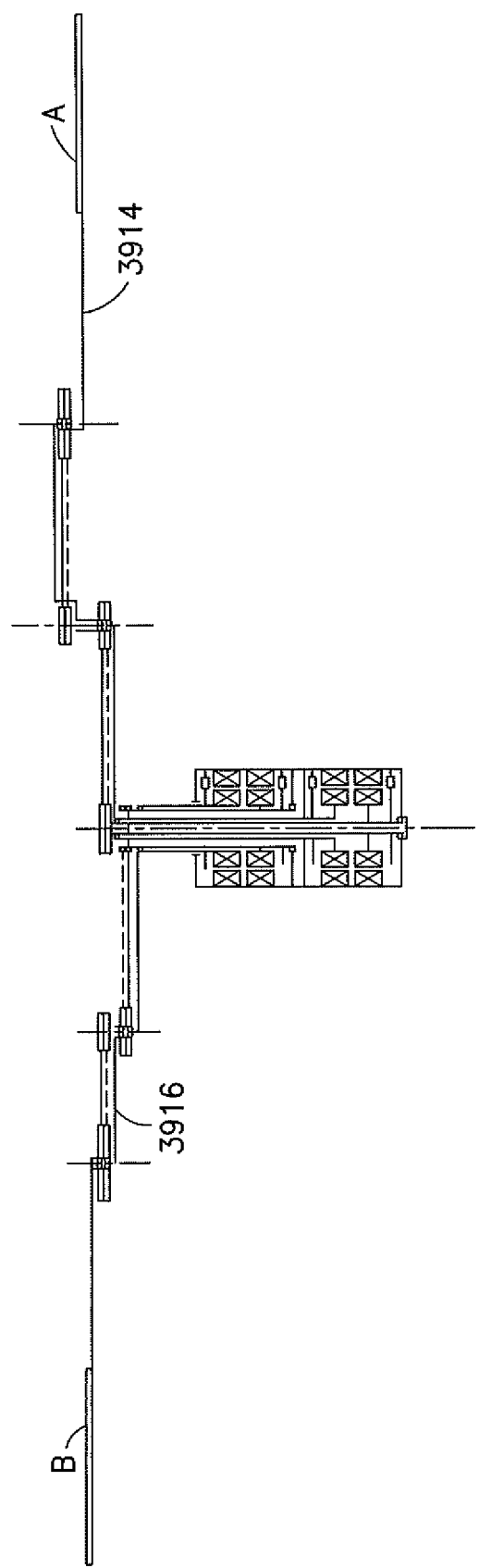

ASYMMETRIC DUAL END EFFECTOR ROBOT ARM

CROSS REFERENCE TO RELATED APPLICATION

This application claims priority under 35 USC 119(e) to U.S. provisional application No. 62/850,783 filed May 21, 2019 which is hereby incorporated by reference in its entirety.

BACKGROUND

Technical Field

The example and non-limiting embodiments relate generally to a robot and, more particularly, to a robot arm having asymmetric end effectors having substrate holding areas that are skewed relative to each other.

Brief Description of Prior Developments

Processes for the manufacturing of semiconductor, LED, Solar, MEMS, or other devices utilize robotics and other forms of automation to transport substrates and carriers associated with substrates to and from storage locations, processing locations, or other locations. Such transport of substrates may include moving individual substrates, groups of substrates with single arm transporting one or more substrates, or with multiple arms, each transporting one or more substrates. Much of the manufacturing, for example, as associated with semiconductor manufacturing, is done in a vacuum environment where footprint and volume are at a premium. Furthermore, much of the automated transport is conducted to obtain the maximum efficiency of substrate movement within a workspace volume. Accordingly, there is a desire to provide substrate transport automation that utilizes minimum footprint and workspace volume for a given range of transport applications with maximized efficiency of movement.

SUMMARY

The following summary is merely intended to be exemplary. The summary is not intended to limit the scope of the claims.

In accordance with one aspect, an example embodiment is provided with an apparatus comprising a drive comprising motors and coaxial drive shafts; an arm assembly connected to the coaxial drive shafts, where the arm assembly comprises a first arm and a second arm; and a controller configured to control the motors, where the first arm comprises a first upper arm connected to a first one of the coaxial drive shafts, a first forearm connected to the first upper arm, a first end effector connected to the first forearm, and a first transmission for rotating the first end effector on the first forearm, where the first transmission comprises at least one non-circular pulley, where the first end effector comprises a first substrate holding area, where the first upper arm and the first forearm have unequal effective lengths, where the second arm comprises a second upper arm connected to a second one of the coaxial drive shafts, a second forearm connected to the second upper arm, a second end effector connected to the second forearm, and a second transmission for rotating the second end effector on the second forearm, where the second end effector comprises a second substrate holding area, where the second upper arm and the second forearm have substantially equal effective lengths, where the controller is configured to cause the drive to extend and retract the arms to move an upper substrate and a lower substrate on the substrate holding areas such that the arm assembly and upper substrate do not travel over the lower substrate.

In accordance with another aspect, an example method is provided comprising extending and retracting a first arm of an arm assembly between a retracted position to an extended position, where the first arm is connected to a first coaxial drive shaft of a robot drive, and where the first arm comprises a first end effector with a first substrate holding area having a lower substrate thereon; extending and retracting a second arm of the arm assembly between a retracted position to an extended position, where the second arm is connected to a second coaxial drive shaft of the robot drive, and where the second arm comprises a second end effector with a second substrate holding area having an upper substrate thereon; and controlling the extending and retracting of the first and second arms such that the arm assembly and upper substrate do not travel over the lower substrate during the extending and retracting of the first and second arms between their respective retracted and extended positions.

In accordance with another aspect, an example embodiment is provided with a non-transitory program storage device readable by a machine, tangibly embodying a program of instructions executable by the machine for performing operations, the operations comprising: causing a robot drive to move a first arm of an arm assembly with extending and retracting the first arm between a retracted position to an extended position, where the first arm is connected to a first coaxial drive shaft of the robot drive, and where the first arm comprises a first end effector with a first substrate holding area having a lower substrate thereon; causing the robot drive to move a second arm of the arm assembly with extending and retracting the second arm between a retracted position to an extended position, where the second arm is connected to a second coaxial drive shaft of the robot drive, and where the second arm comprises a second end effector with a second substrate holding area having an upper substrate thereon; and controlling the extending and retracting of the first and second arms such that the arm assembly and upper substrate do not travel over the lower substrate.

BRIEF DESCRIPTION OF THE DRAWINGS

The foregoing aspects and other features are explained in the following description, taken in connection with the accompanying drawings, wherein:

FIGS. 6A-6C are perspective views illustrating movement of a second one of the arms of the apparatus shown in FIGS. 3-4;

FIGS. 8A-8C are schematic diagrams illustrating extension of the second arm shown in FIGS. 3-4 and 6A-6C between the retracted position and an extended position;

FIGS. 10B-10C are schematic side and cross sectional views of the robot having the arm assembly shown in FIG. 10A;

FIGS. 10D-10E are schematic side and cross sectional views of an alternate example of the robot similar to that shown in FIGS. 10B-10C;

FIGS. 11A-11D are schematic plan top views of the example shown in FIG. 10A having straight end effectors illustrating extension of the arms between retracted and extended positions;

FIGS. 14A-14D are schematic plan top views of an example similar to that shown in FIG. 10A and FIGS. 11A-11D having one L-shaped end effector and one straight end effector illustrating extension of the arms between retracted and extended positions;

FIGS. 26A-26B are schematic side and cross sectional views of the robot having the arm assembly shown in FIG. 24;

FIGS. 27A-27D are schematic plan top views of the arm assembly shown in FIG. 24 having straight end effectors illustrating extension of the arms between retracted and extended positions;

FIGS. 28A-28D are schematic plan top views of an arm assembly similar to that shown in FIG. 24 having L-shaped end effectors illustrating extension of the arms between retracted and extended positions;

FIGS. 29A-29D are schematic plan top views of an arm assembly similar to that shown in FIG. 24 having one L-shaped end effector and one straight end effector illustrating extension of the arms between retracted and extended positions;

FIGS. 30A-30D are schematic plan top views of another example of an arm assembly similar to that shown in FIG. 29A-29D having one L-shaped end effector and one straight end effector illustrating extension of the arms between retracted and extended positions;

FIGS. 32A-32B are schematic side and cross sectional views of the robot having the arm assembly shown in FIG. 31;

FIGS. 33A-33D are schematic plan top views of an embodiment similar to the arm assembly shown in FIG. 31 with a single upper arm and having straight end effectors illustrating extension of the arms between retracted and extended positions;

FIGS. 34A-34D are schematic plan top views of an embodiment similar to the arm assembly shown in FIG. 31 with a single upper arm and having L-shaped end effectors illustrating extension of the arms between retracted and extended positions;

FIGS. 36A-36D are schematic plan top views of the arm assembly shown in FIG. 31 illustrating extension of the arms between retracted and extended positions;

FIG. 39 is a schematic sectional view of a robot similar to FIG. 37C.

DETAILED DESCRIPTION OF EXAMPLE EMBODIMENTS

Figure 1A:
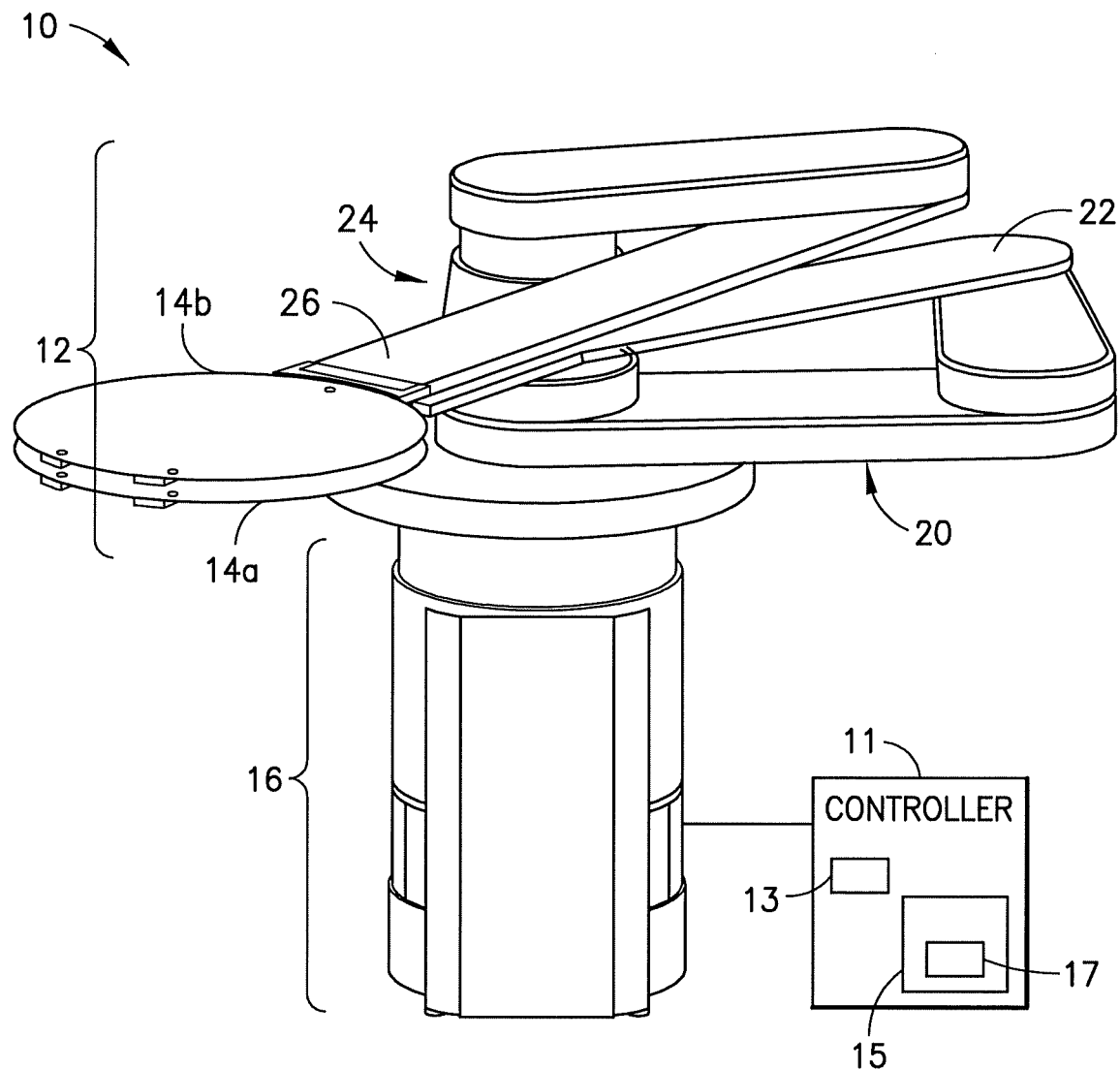
FIG. 1A is a perspective view of an apparatus comprising features as described herein.
Figure 1B:
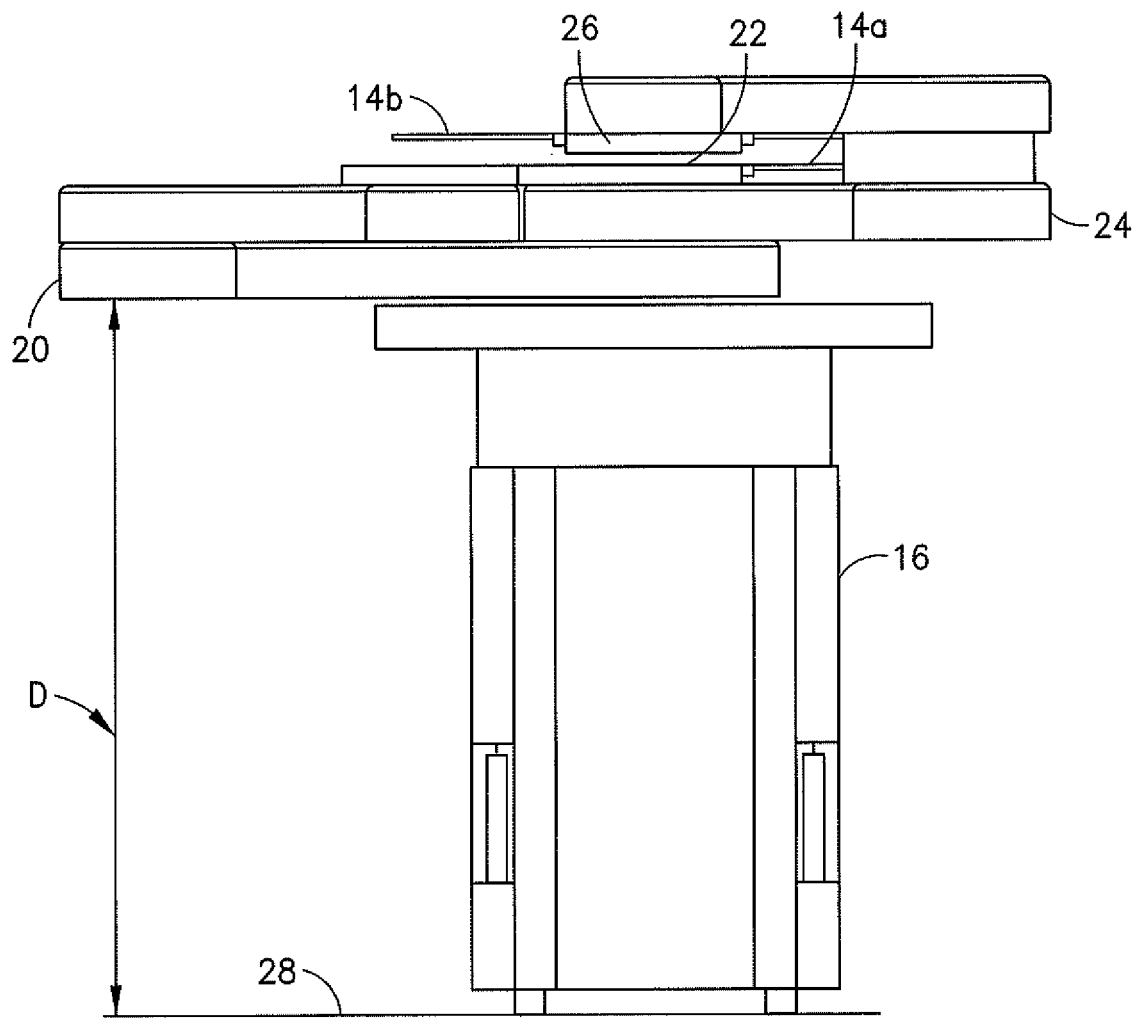
FIG. 1B is a side view of the apparatus shown in FIG. 1A.

Referring to FIGS. 1A and 1B, an apparatus for moving substrates is shown generally at 10 and is hereinafter referred to as "apparatus 10." Apparatus 10 comprises a robot having a substrate transport apparatus or arm assembly 12 (hereinafter "transport apparatus 12") configured to transport substrates 14*a*, 14*b* between and among, for example, substrate processing chambers and load locks. Apparatus 10 also comprises a drive unit 16 configured to drive arms and multiple effectors of the transport apparatus 12, thereby causing transport of the substrates. By way of example, robots having multiple end effectors are described in U.S. patent application Ser. No. 15/897,374, filed on Feb. 15, 2018, now U.S. Pat. No. 10,580,682, entitled "Material-Handling Robot With Multiple End-Effectors," which is hereby incorporated by reference in its entirety. The apparatus 10 may comprise, or be connected to, a controller 11. The controller 11 may comprises one or more processors 13 and one or more memory 15. The memory 15 may comprise software or computer code 17 which is configured to control movement of motors in the drive unit 16 and receive sensor signals from sensors in the drive unit 16 or the transport apparatus 12. It should be understood that all of the embodiments described herein are connected to some type of controller, such as the controller 11 for example, to control movements of the arms, such as for rotation about the center axis of the drive unit 16 and extension and retraction of the arms individually relative to the center axis of the drive unit. In alternative embodiments, other types of drive units could also be used.

The transport apparatus 12 comprises a plurality of arms with each arm being made extendable and rotatable via the drive unit 16. The plurality of arms comprises at least one unequal-link linkage or first arm 20 drivable with non-circular pulleys. The unequal-link linkage 20 in this example has an upper arm with a first effective length and a forearm rotatably connected to the upper arm with a second different effective length. The second effective length is shorter than the first effective length in this example. The effective length of the upper arm is measured between the axis of rotation of the upper arm at the drive unit 16 and the axis or rotation of the forearm on the upper arm. The effective length of the forearm is measured between the axis of rotation of the forearm on the upper arm and the axis or rotation of the end effector 22 on the forearm. An example of a non-circular pulley and unequal link lengths is shown in U.S. Pat. No. 9,840,004 which is hereby incorporated by reference in its entirety. The unequal-link linkage 20 includes a first end effector 22 to support a lower substrate 14a.

The plurality of arms also comprises at least one equal-link linkage or second arm 24. The equal-link linkage 24 includes a second end effector 26 to support an upper substrate 14b. The equal-link linkage 24 may comprise one or more circular pulleys rather than non-circular pulleys. The equal-link linkage 24 in this example has an upper arm with a third effective length and a forearm rotatably connected to the upper arm with a fourth effective length. The third effective length is substantially the same as the fourth effective length in this example. Thus, the term "equal-link" linkage is used to indicate a same or substantially same effective length for the upper arm and forearm in the same linkage.

The first end effector 22 and the second end effector 26 are asymmetric in this example. Thus, the apparatus 10 may be considered as having asymmetric dual arms with stacked end-effectors. As shown in FIG. 1B, the unequal-link linkage 20 is located at a distance D or greater from a floor surface or reference plane 28. The configuration of the transport apparatus 12 provides a maximum radial reach from a given containment diameter. By way of example, robots having arms with unequal link lengths are described in U.S. Pat. No. 9,149,936 issued on Oct. 6, 2015, and entitled "Robot Having Arm With Unequal Link Lengths," which is hereby incorporated by reference in its entirety.

Figure 2A:
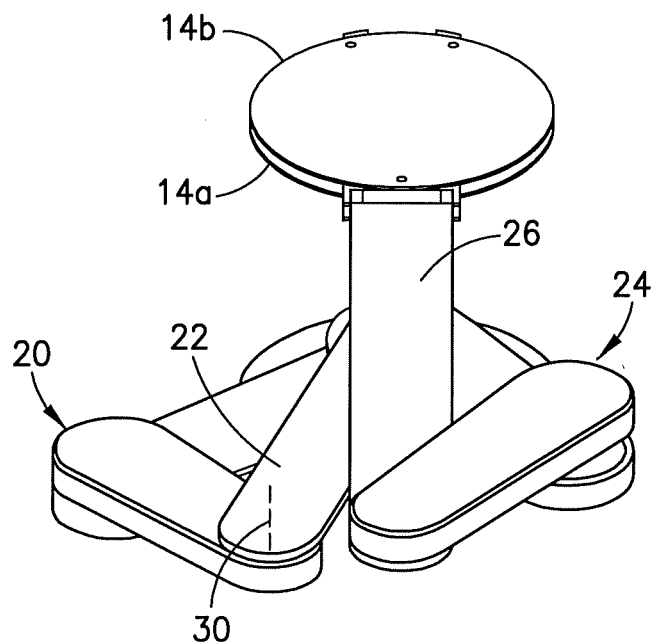
FIGS. 2A-2C are perspective view illustrating movement of one of the arms of the apparatus shown in FIGS. 1A-1B.
Figure 2B:
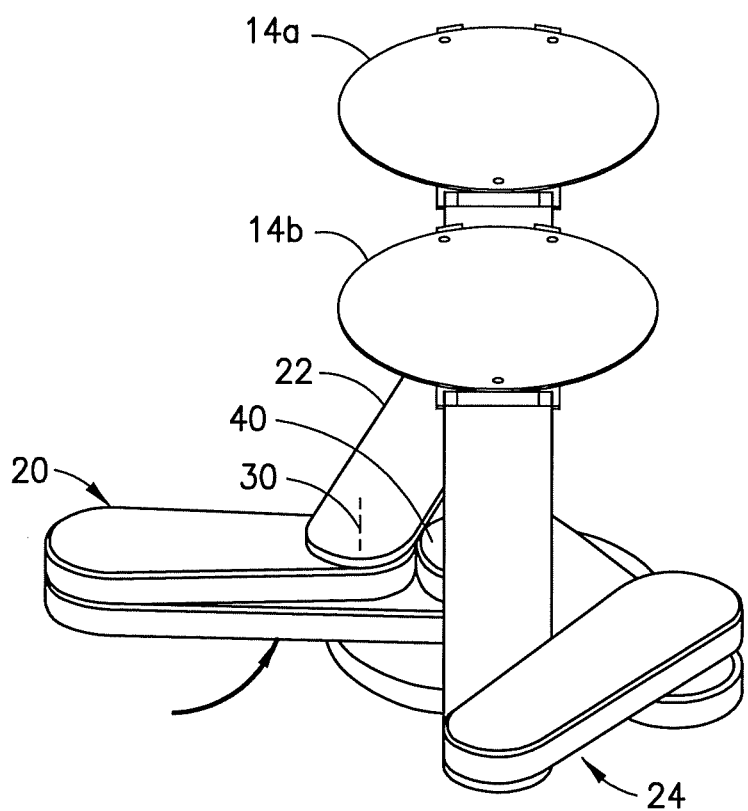
Figure 2C:
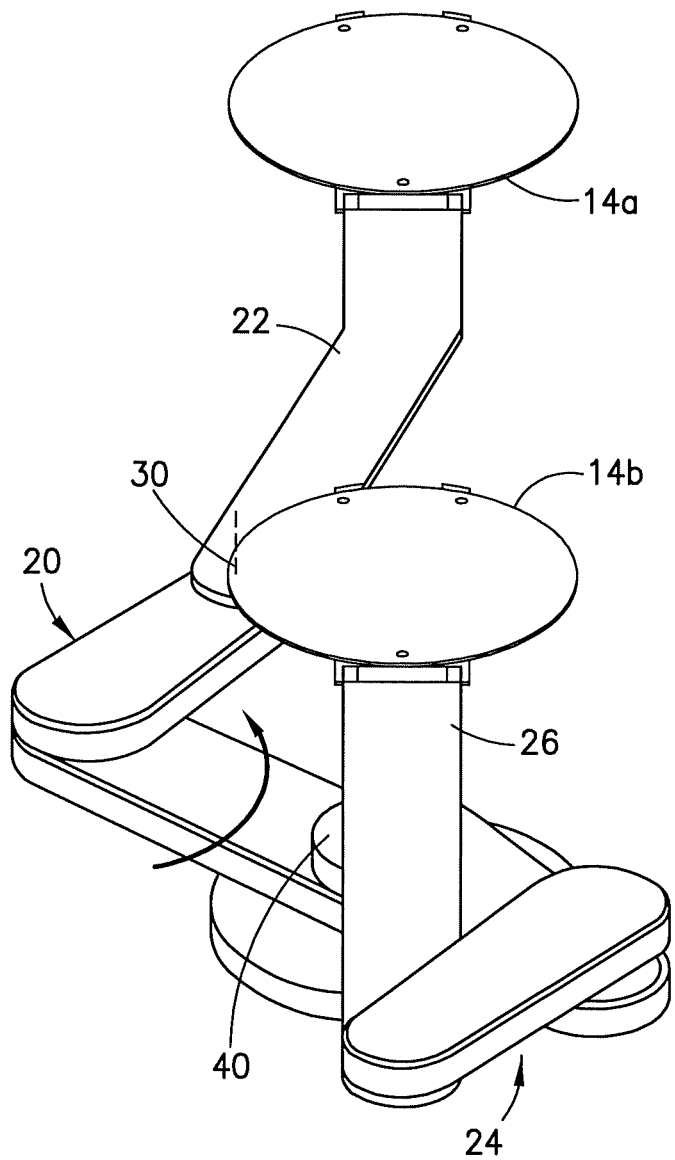

Referring to FIGS. 2A-2C, an initial position of the transport apparatus 12 is a retracted configuration in which a portion of the second end effector 26 is positioned over a portion of the first end effector 22 (FIG. 2A) such that the upper substrate 14b is positioned over the lower substrate 14a. FIG. 2B shows the first arm 20 being moved from its retract position of FIG. 2A towards its extended position as shown in FIG. 2C. Upon extension of the first end effector 22 supporting the lower substrate 14a, a wrist 30 on the unequal-link linkage 20 (the first lower arm) passes along a side of a shoulder 40 on the equal-link linkage 24 (the second upper arm). A similar movement happens during retraction of the same end effector. Upon full extension of the first end effector 22 supporting the lower substrate 14a and without movement of the equal-link linkage 24 (FIG. 2C), the length of the equal-link linkage 24 travel allows for containment of the wrist and maximum travel.

Figure 3:
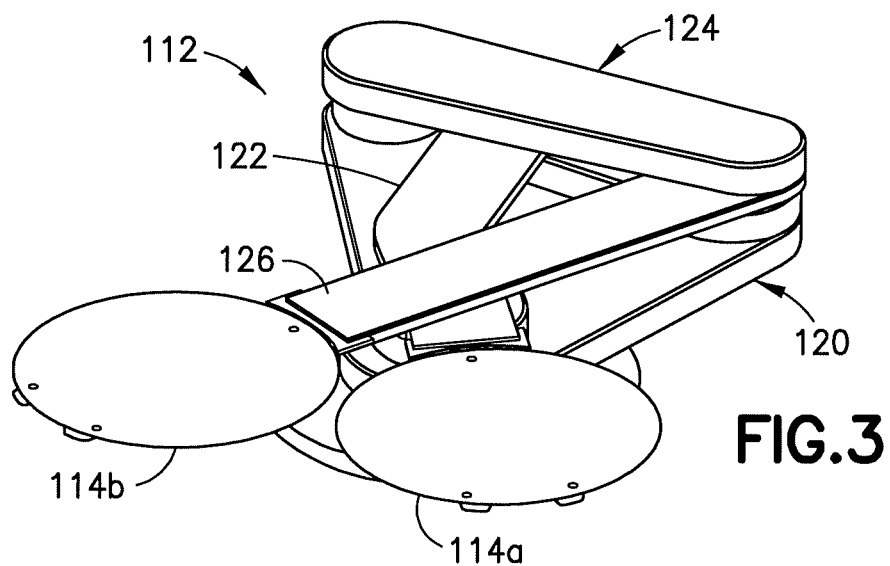
FIG. 3 is a perspective view of an alternate embodiment of an arm assembly.

Referring also to FIG. 3, a substrate transport apparatus for substrate processing and having skewed end effectors is shown generally at 112 and is hereinafter referred to as "transport apparatus 112." This example may also comprise the controller 11 as shown in FIG. 1, but with suitable software programming for moving the motors to provide no over-travel of substrates as further described below. This example shows an example of asymmetric dual arms with skewed end-effectors. This example may be used to provide a system where no components or material of the transport apparatus 112 or the upper substrate 114b travel over the lower end effector or lower substrate 114a.

Transport apparatus 112 comprises a first lower arm comprising an unequal-link linkage 120 with a first end effector 122, and a second upper arm comprising an equal-link linkage 124 and a second end effector 126. The first end effector 122 is asymmetric relative to the second end effector 126. The first end effector 122 has a substrate holding area which is also skewed relative to the substrate holding area of the second end effector 126. Thus, during an initial at rest position or retracted position, and also during movement of either or both the lower arm and the upper arm, the upper substrate 114b may be prevented from being positioned over the lower substrate 114a.

Figure 4:
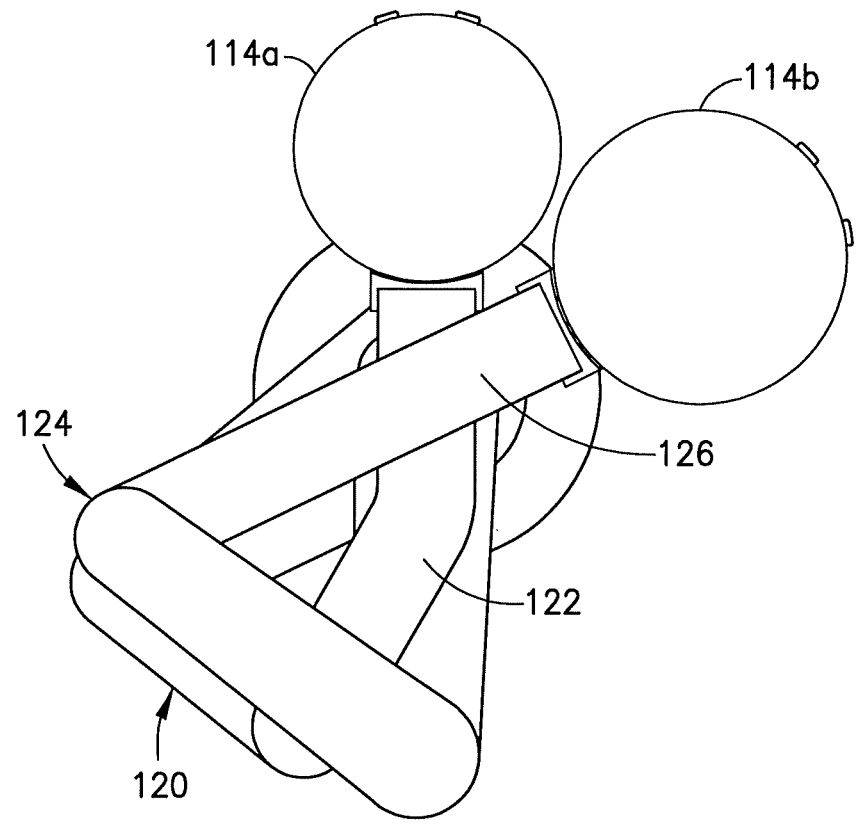
FIG. 4 is a top plan view of the arm assembly shown in FIG. 3.

FIG. 4 shows a top plan view of the transport apparatus 112 shown in FIG. 3. With the example shown in FIGS. 3-4, design of the linkages (versus design of the linkage shown in the stacked end-effectors of FIGS. 1A-1B and FIGS. 2A-2C) may be rotated to move the upper wafer (substrate 114b) on the second end effector 126 away from a lower wafer (substrate 114a) on the first end effector 122. Likewise, with the example shown in FIGS. 3-4, design of the links on the equal-link linkage 124 (versus design of the links on the equal-link linkage shown in the stacked end-effectors of FIGS. 1A-1B and FIGS. 2A-2C) may be stretched to locate an elbow of the equal-link linkage 124 away from a wrist of the unequal-link linkage 120. The unequal-link linkage 120 may comprise non-circular pulleys and belts or bands. In one type of example, the software in the controller used for the example of FIGS. 3-4 for controlling the motors in the drive unit may be the same as the software in the controller used for the example of FIGS. 1A-1B and 2A-2C.

Figure 5B:
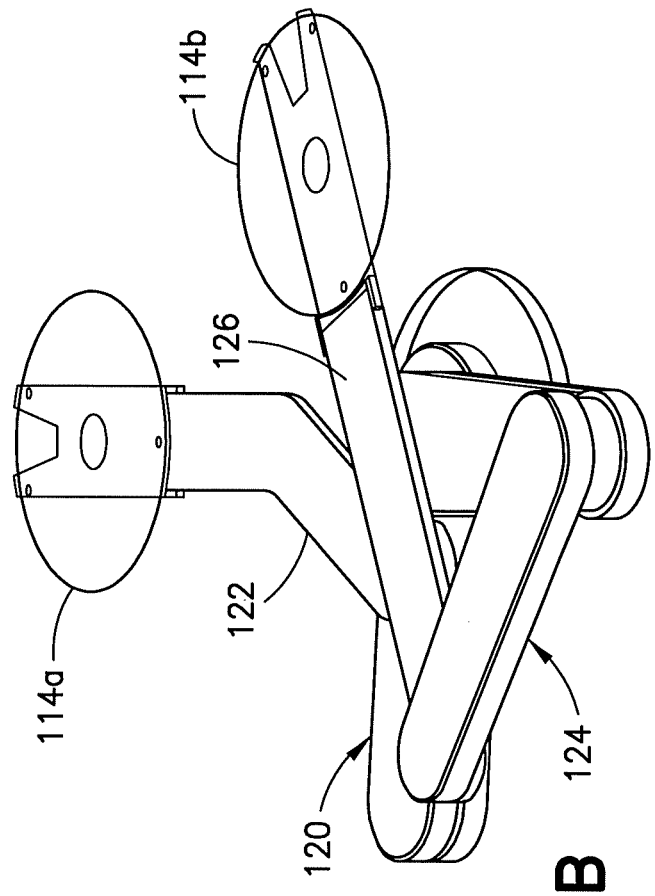
FIGS. 5A-5C are perspective views illustrating movement of a first one of the arms of the apparatus shown in FIGS. 3-4.
Figure 5A:
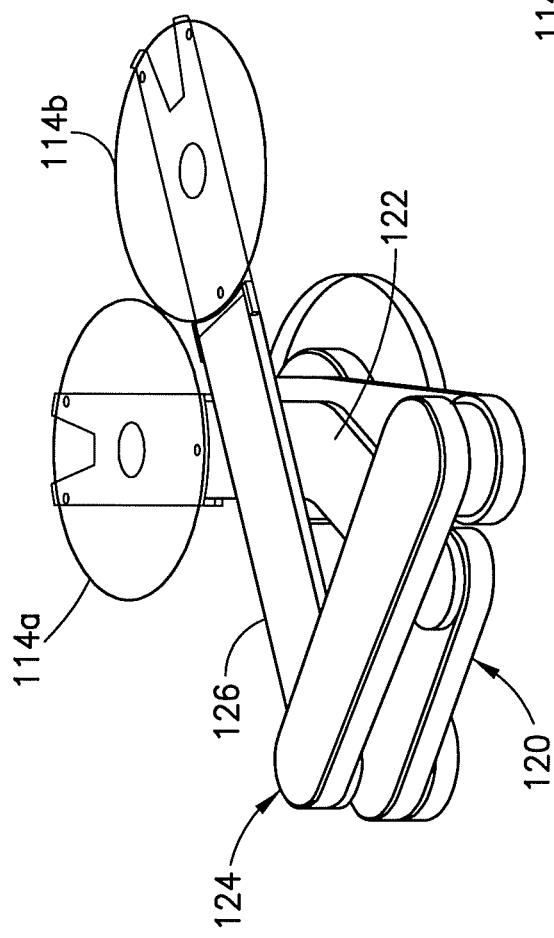
Figure 5C:
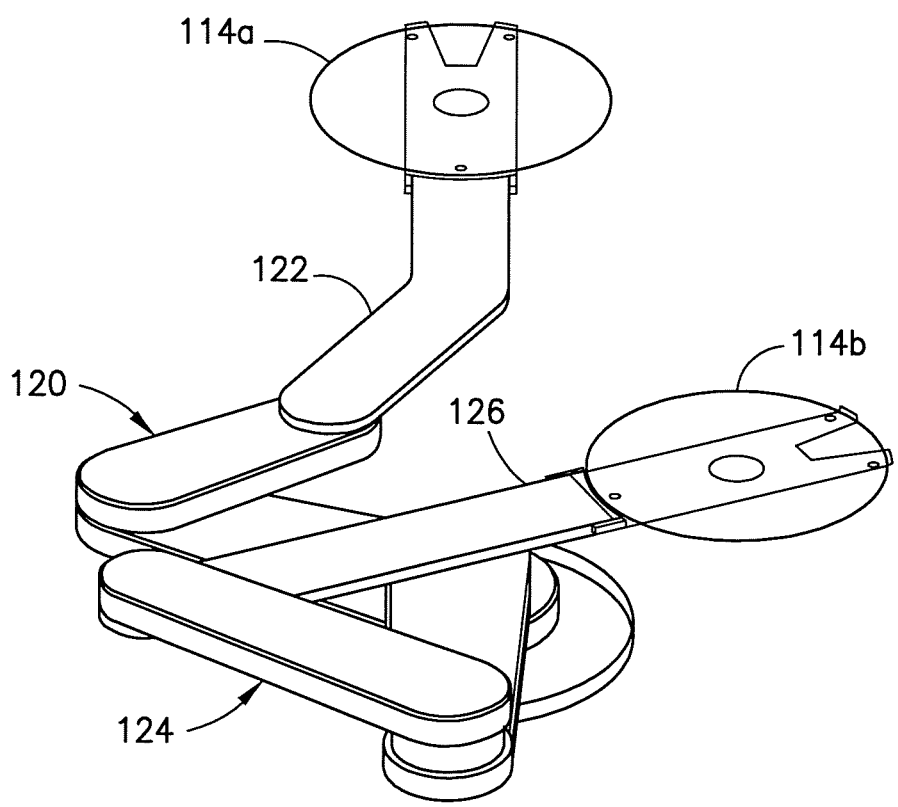

Referring also to FIG. 5A, at a rest or retracted position, the configuration of the asymmetric and skewed end effectors 122, 126 allows the wafer (substrate 114b) on the second end effector 126 to not be over the wafer (substrate 114a) on the first end effector 122. Referring also to FIG. 5B, as the unequal-link linkage 120 is extended, the first end effector 122 moves away from the second end effector 126. Referring to also FIG. 5C, as the unequal-link linkage 120 is further extended, the first end effector 122 moves farther away from the second end effector 126. With the construction of the upper and lower arms, the shape of the end effectors and the control of the motors by the controller 11, this example may be used to provide that at no point in time during extension and retraction of the unequal-link linkage 120 with the first end effector 122 is any portion of the transport apparatus 112 or the upper substrate 114b located above the lower substrate 114a.

Figure 6C:
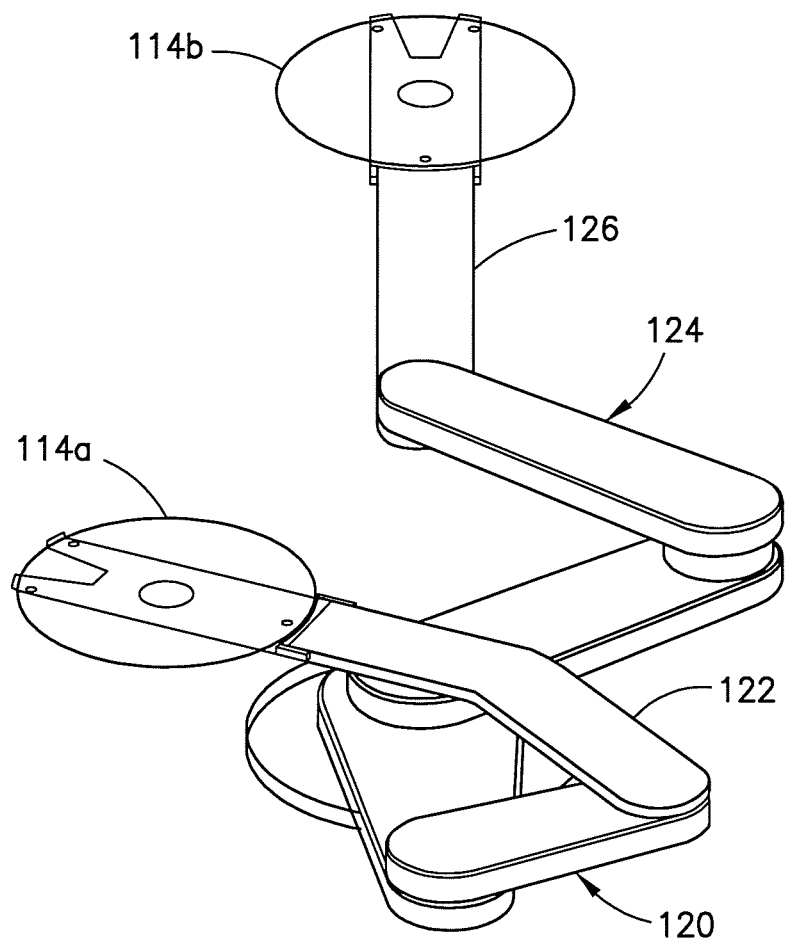

Referring also to FIG. 6A, at the at rest or retracted position, the configuration of the asymmetric and skewed end effectors allows the upper wafer (substrate 114b) on the second end effector 126 to be prevented from traveling over the lower wafer (substrate 114a) on the first end effector 122 (see also FIG. 5A). Referring also to FIG. 6B, as the equal-link linkage 124 is extended, the second end effector 126 moves away from the first end effector 122. Referring also to FIG. 6C, as the equal-link linkage 124 is further extended towards its fully extended position, the second end effector 126 moves even farther away from the first end effector 122. With the construction of the upper and lower arms, the shape of the end effectors and the control of the motors by the controller 11, this example may be used to provide that at no point in time during extension and retraction of the equal-link linkage 124 with the second end effector 126 is any portion of the transport apparatus 112 or the upper substrate 114b located above the lower substrate 114a or the substrate holding area of the lower end effector 122.

Figure 7A:
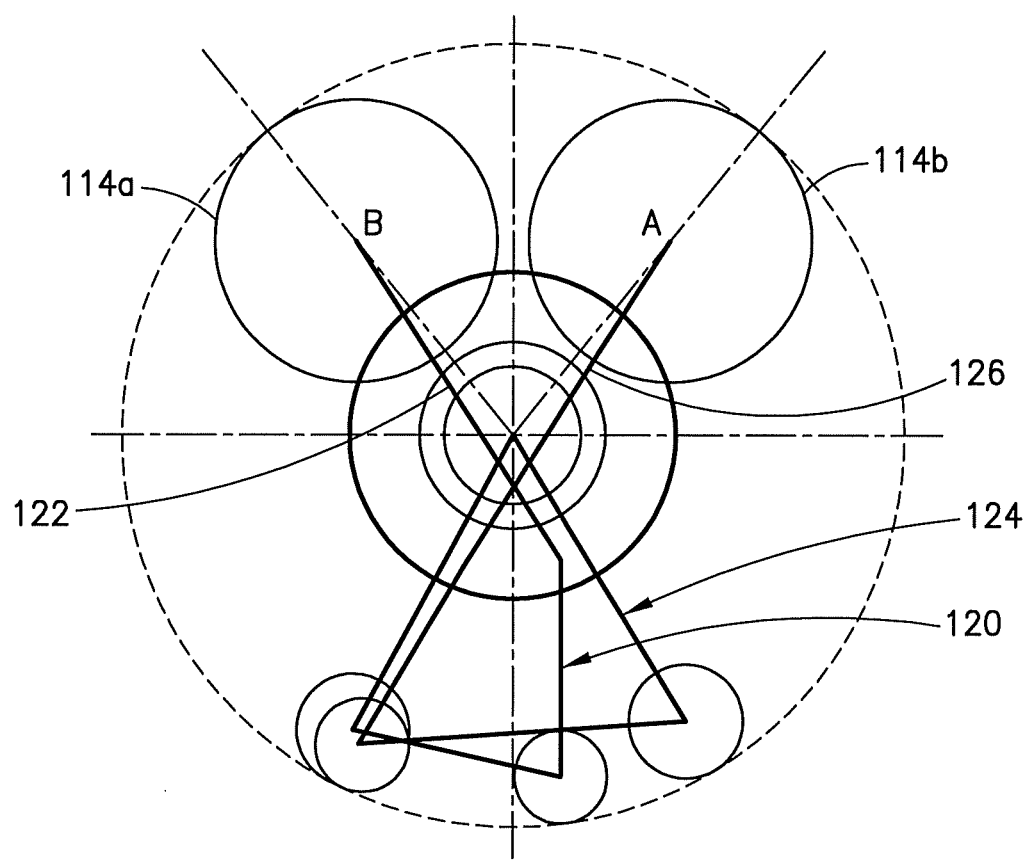
FIG. 7A is a schematic diagram illustrating location of the links of the arms and the substrates for the apparatus shown in FIGS. 3-4.

Referring to FIG. 7, a schematic top plan view of the transport apparatus 112 is shown with both arms in their retracted positions. The unequal-link linkage 120 may comprise and be moved with non-circular pulleys. The other linkage 124 may comprise either an equal-link linkage or an unequal link linkage with non-circular pulleys. Compared to the example shown in FIGS. 1A-1B, the design of the end effectors 122, 126 may be rotated from radial orientations to achieve additional clearance between them and between their respective elbows and wrists.

Figure 8C:
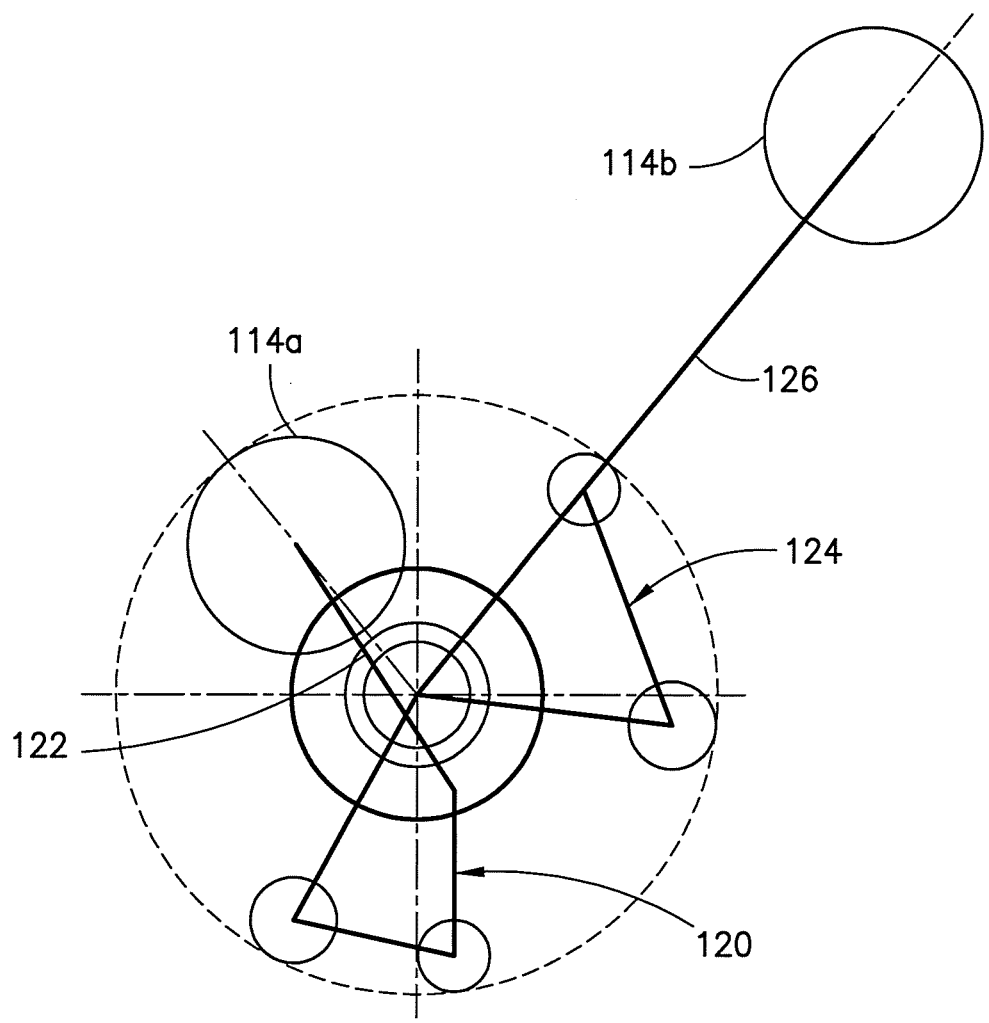

Referring to FIGS. 8A-8C, for the extension of the equal-link linkage 124, in an initial phase (FIG. 8A, the retracted position), the upper substrate 114b is not positioned over the lower substrate 114a. As shown in FIG. 8B, in a link-over-link position as the upper substrate 114b is being extended, an orientation of the end effectors 122, 126 changes as a center of the upper substrate 114b moves along a straight line. As shown in FIG. 8C, in a final phase in which the substrate 114b is in an extended position, the orientation of the end effectors 122, 126 relative to one another is constant as the end effector 126 is further extended, and the center of the upper substrate 114b continues to move along the straight line. With this example, the initial phase of extension has the orientation of the end effector 126 change while the center of the end effector moves along the straight line, and in the final phase of extension the orientation of the end effector 126 is kept constant with its center continuing to move along the straight line.

Figure 9B:
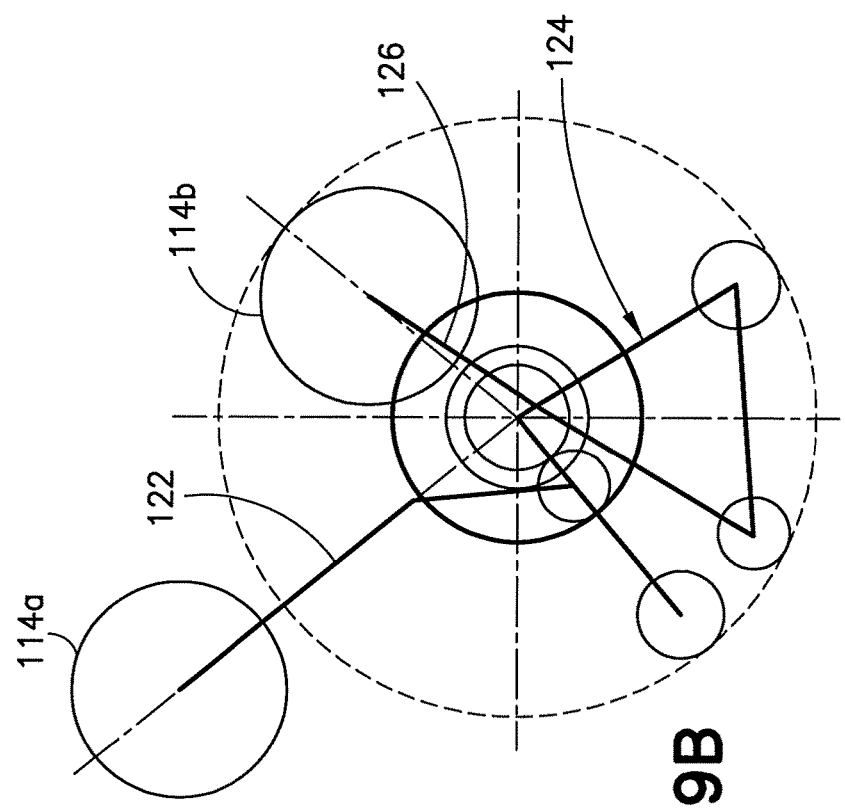
FIGS. 9A-9C are schematic diagrams illustrating extension of the second arm shown in FIGS. 3-4 and 5A-5C between the retracted position and an extended position.
Figure 9A:
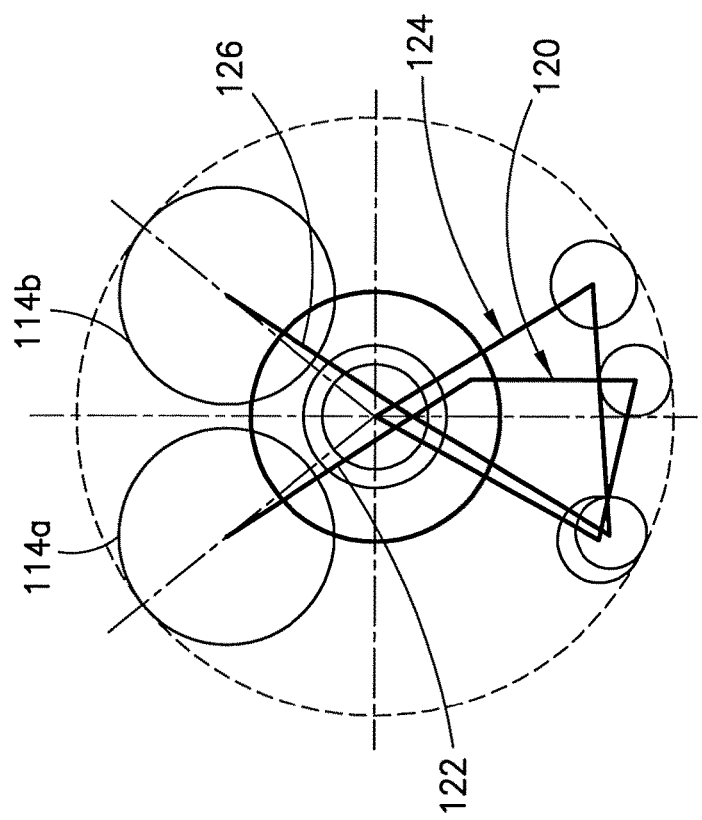
Figure 9C:
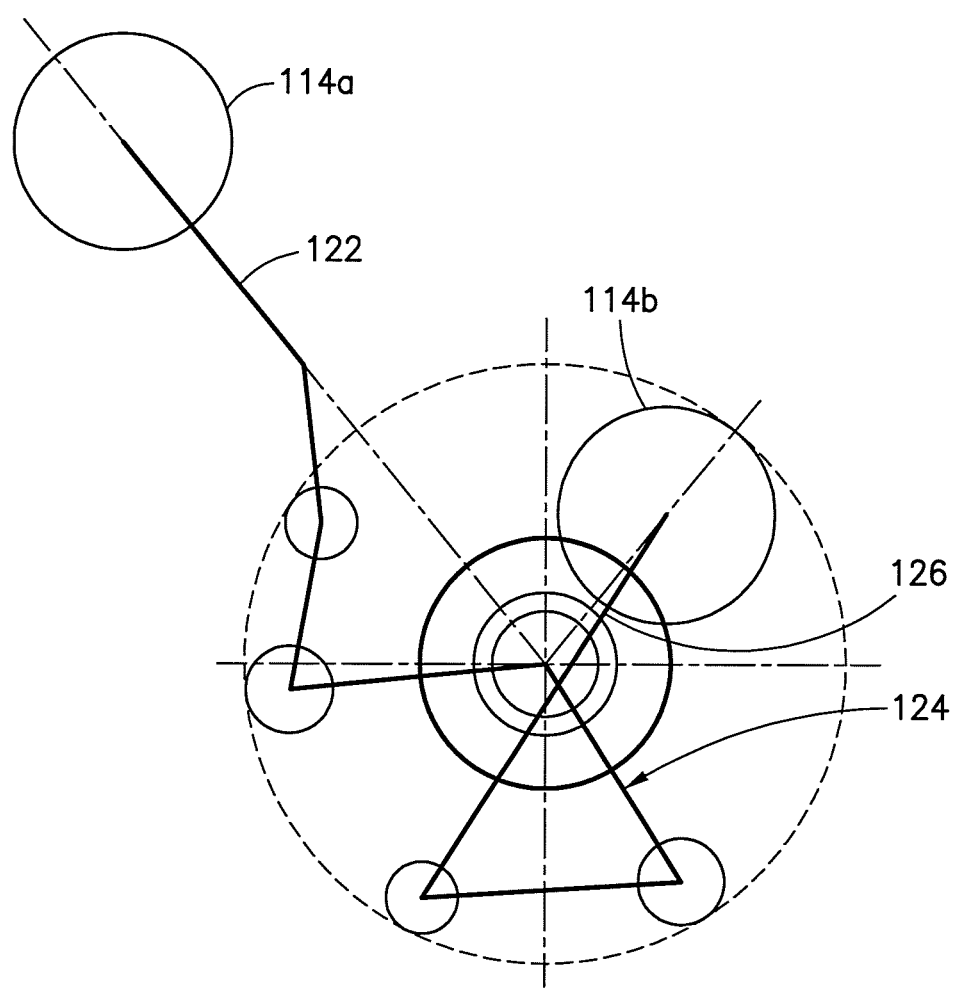

Referring also to FIGS. 9A-9C, for the extension of the unequal-link linkage 120, in an initial phase (FIG. 9A, a retracted position), again the upper substrate 114b is not positioned over the lower substrate 114a. As shown in FIG. 9B, in a link-over-link position as the end effector 122 is being extended, an orientation of the end effectors 122, 126 changes relative to one another as a center of the lower substrate 114a moves along a straight line. As shown in FIG. 9C, in a final phase in which the lower substrate 114a moves towards its extended position, the orientation of the end effectors 122, 126 relative to each other is constant, and the center of the lower substrate 114a continues to move along its straight line.

Figure 10A:
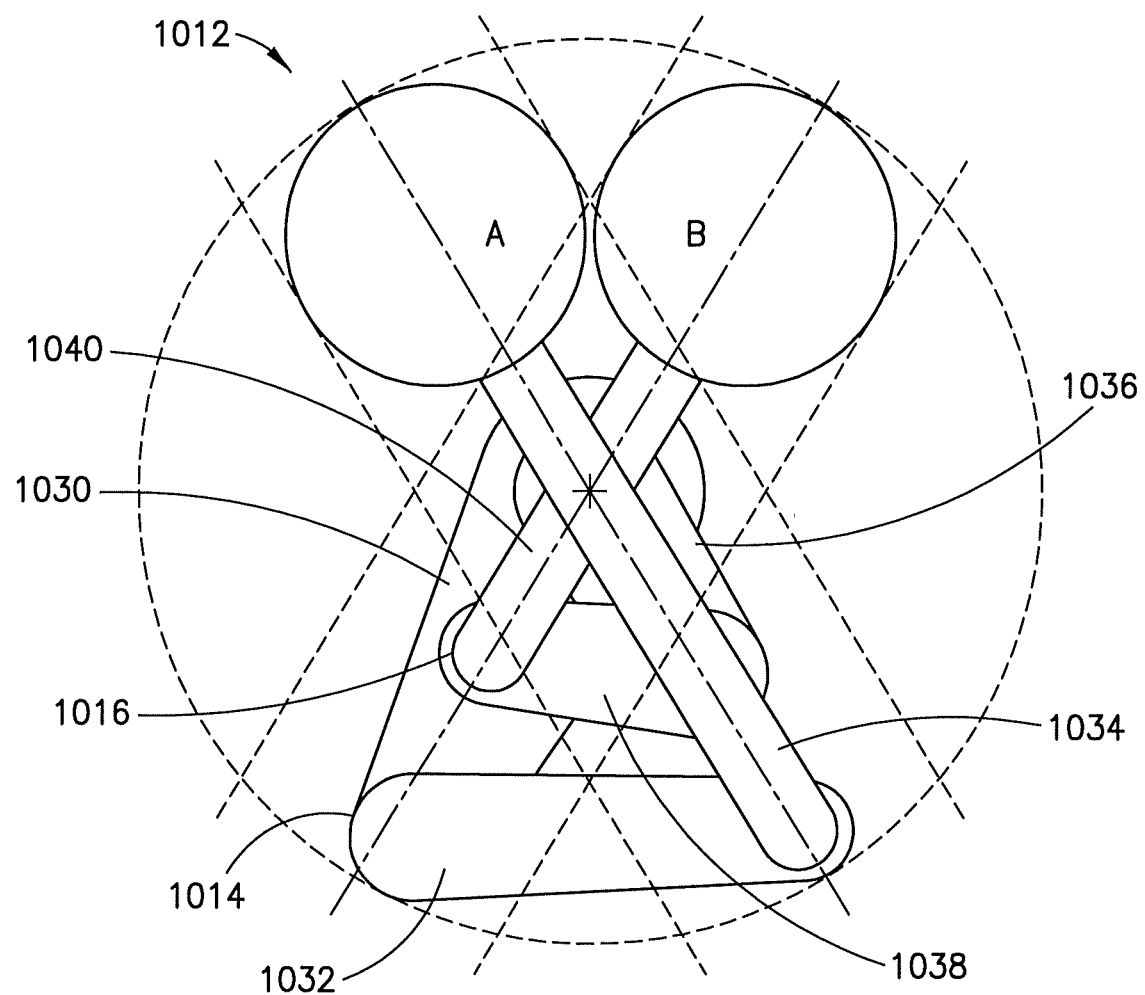
FIG. 10A is a top plan view of an alternate example of the arm assembly.
Figure 10B:
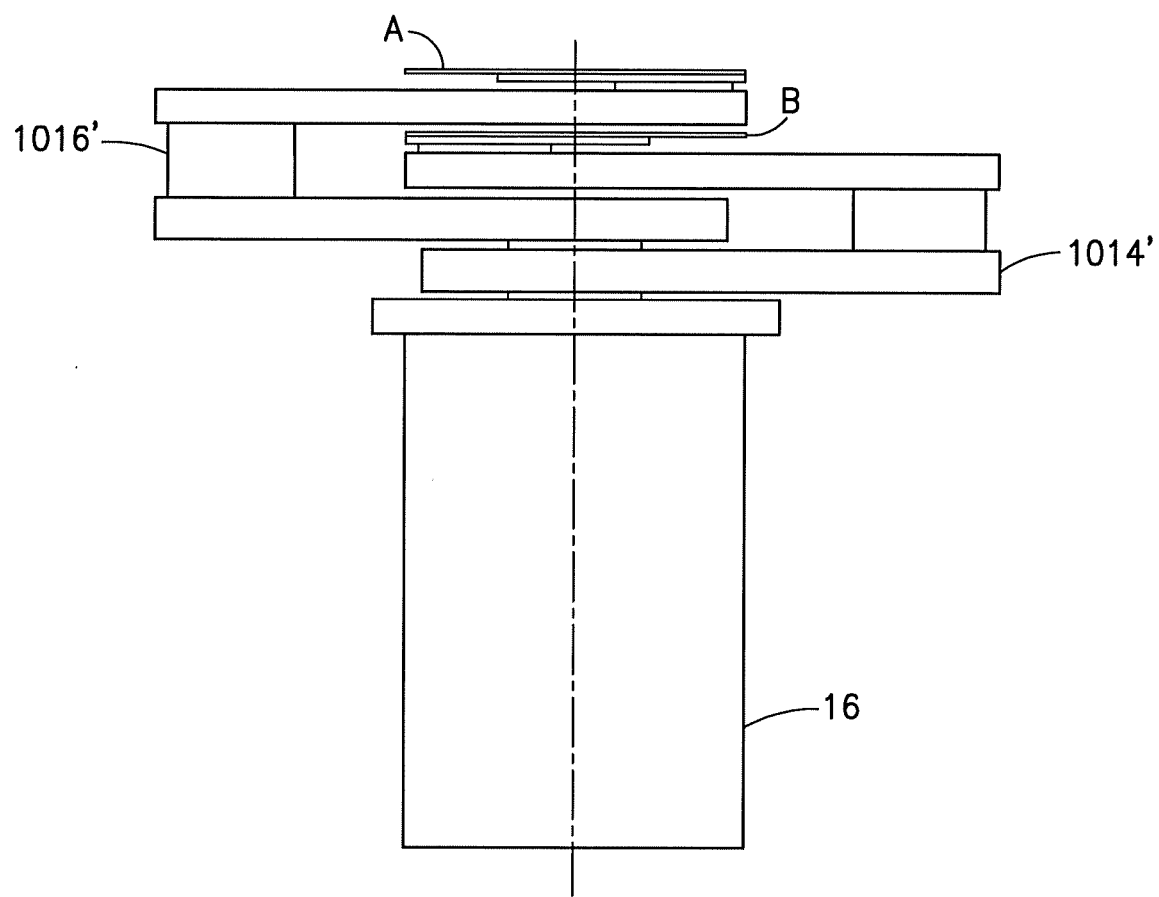
Figure 10D:
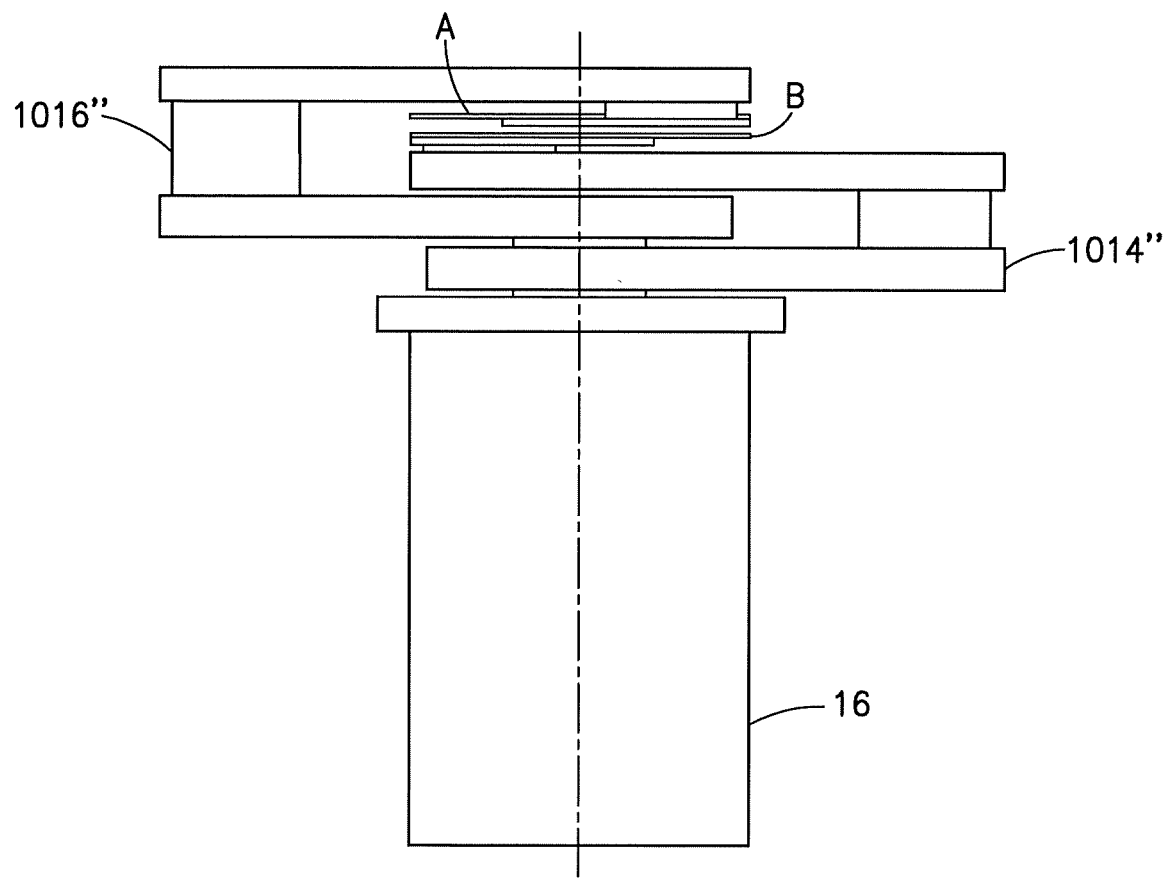
Figure 12D:
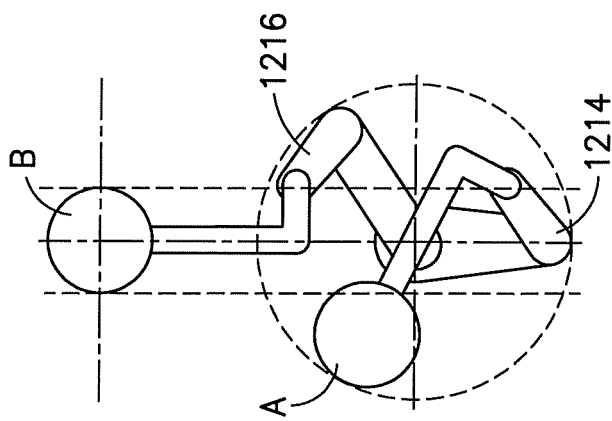
FIGS. 12A-12D are schematic plan top views of an example similar to that shown in FIG. 10A and FIGS. 11A-11D having L-shaped end effectors illustrating extension of the arms between retracted and extended positions.
Figure 12C:
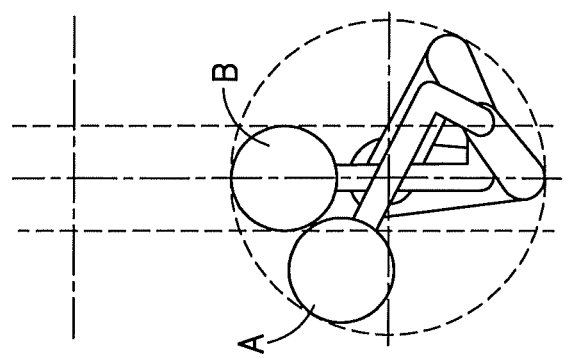
Figure 12B:
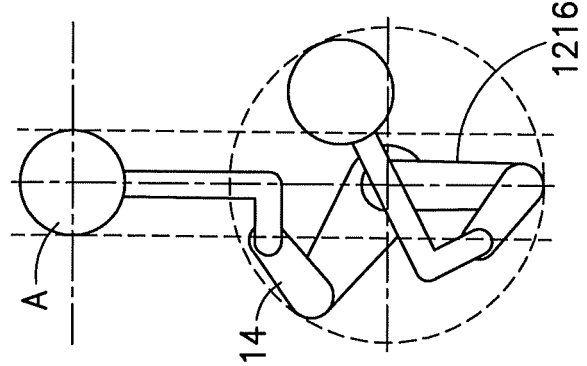
Figure 12A:
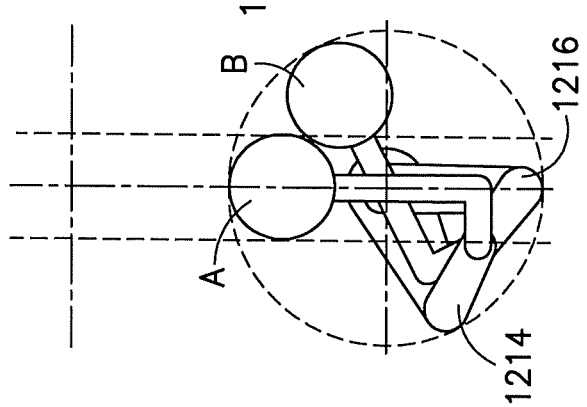
Figures 13A, 13B, 13C, 13D:
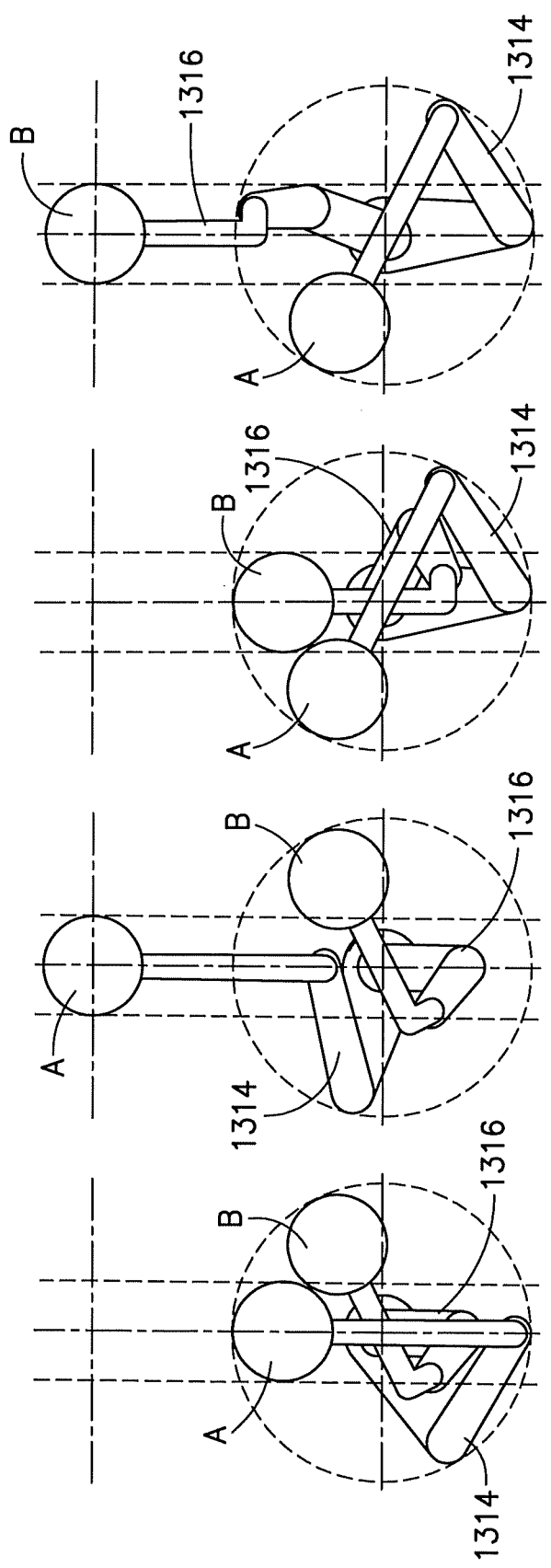
FIGS. 13A-13D are schematic plan top views of an example similar to that shown in FIG. 10A and FIGS. 11A-11D having one L-shaped end effector and one straight end effector illustrating extension of the arms between retracted and extended positions.

Features as described herein may be provided with a skewed dual extension arm configuration. Referring also to FIG. 10A, an example embodiment of a skewed dual extension arm configuration is shown. In this example the arm assembly 1012 comprises a first arm 1014 and a second arm 1016. The two arms 1014, 1016 are connected to a drive such as the drive 16 shown in FIGS. 10B and 10C. The drive 16 may comprise coaxial drive shafts 1018, 1020, 1022, motors 1024, 1026, 1028 for rotating the drive shafts, and a vertical drive 1030. The first arm 1014 has an upper arm 1030, a forearm 1032 and an end effector 1034 configured to support the substrate A thereon. The second arm 1016 has an upper arm 1036, a forearm 1038 and an end effector 1040 configured to support the substrate B thereon. The arms 1014, 1016 comprises pulleys and bands as part of a transmission from the drive. FIGS. 10B and 10C show an example of the transmission with the bands and pulleys. FIGS. 10B and 10C also show an example arrangement of links (upper arm, forearm, end effector) of arms 1014', 1016'. FIGS. 10D and 10E shown another alternate embodiment of an example arrangement of links (upper arm, forearm, end effector) of arms 1014", 1016".

Referring also to FIGS. 11A-11D, movement is illustrated of an example embodiment of an arm assembly with a constant wrist orientation. In this example there comprises an independent extension arm movement with a 3-axis spindle, both linkages 1114, 1116 of equal-link geometry, and constant orientation of end-effectors during extension and retraction.

Referring also to FIGS. 12A-12D, movement is illustrated of an example embodiment of an arm assembly with a constant wrist orientation. In this example there comprises an independent extension arm movement, a 3-axis spindle, both linkages 1214, 1216 of unequal-link geometry, and constant orientation of end-effectors during extension and retraction. This example comprises general 90 degree L-shaped end effectors. One or more of the end effectors could have a bend or curve of more or less than 90 degrees, such as the bent end effector shown in FIGS. 16A-16D for example.

Referring also to FIGS. 13A-13D, movement is illustrated of an example embodiment of an arm assembly with a constant wrist orientation. In this example there comprises an independent extension arm movement, a 3-axis spindle, one linkage 1314 of equal-link and the other 1316 of unequal-link geometry, and constant orientation of end-effectors during extension and retraction.

Referring also to FIGS. 14A-14D, movement is illustrated of an example embodiment of an arm assembly with a constant wrist orientation. In this example there comprises an independent extension arm, a 3-axis spindle, one linkage 1414 of unequal-link and the other 1416 of equal-link geometry, and constant orientation of end-effectors during extension and retraction.

Figure 15:
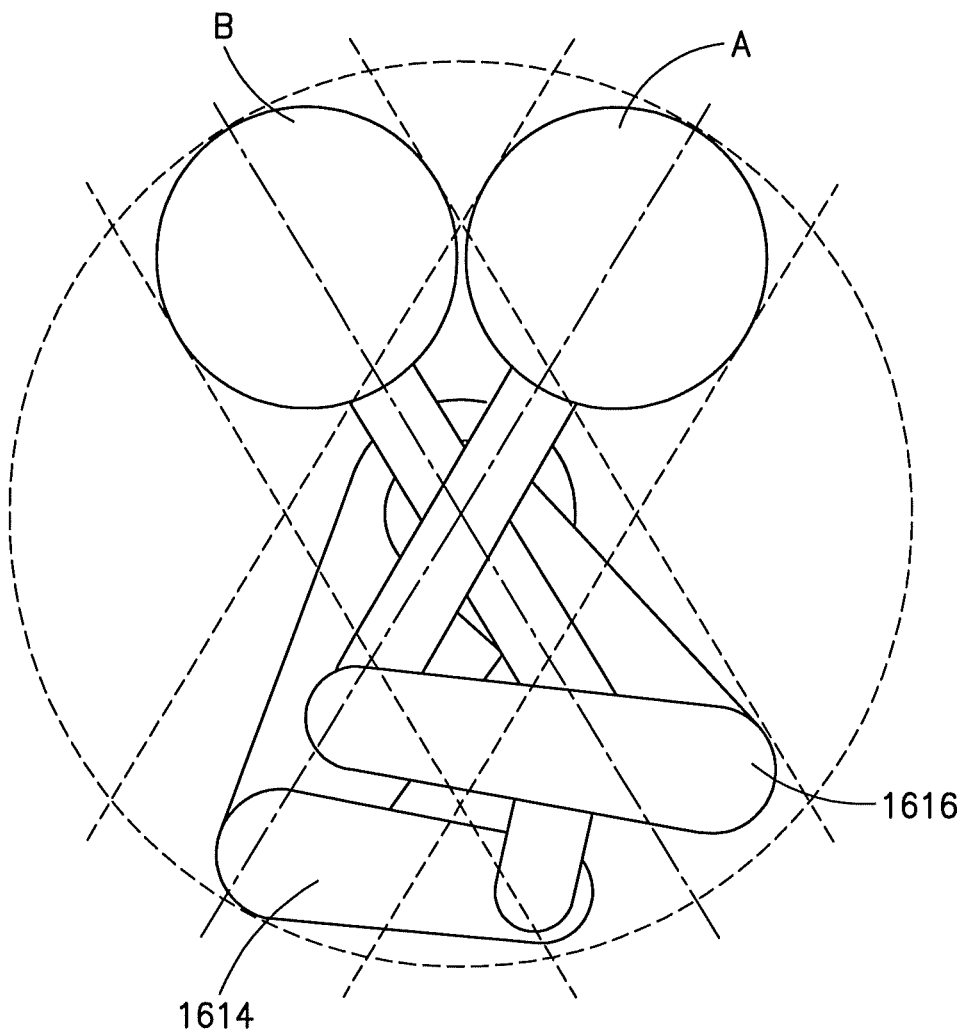
FIG. 15 is a top plan view of an alternate example of the arm assembly with one straight end effector and one bent shape end effector.
Figure 16:
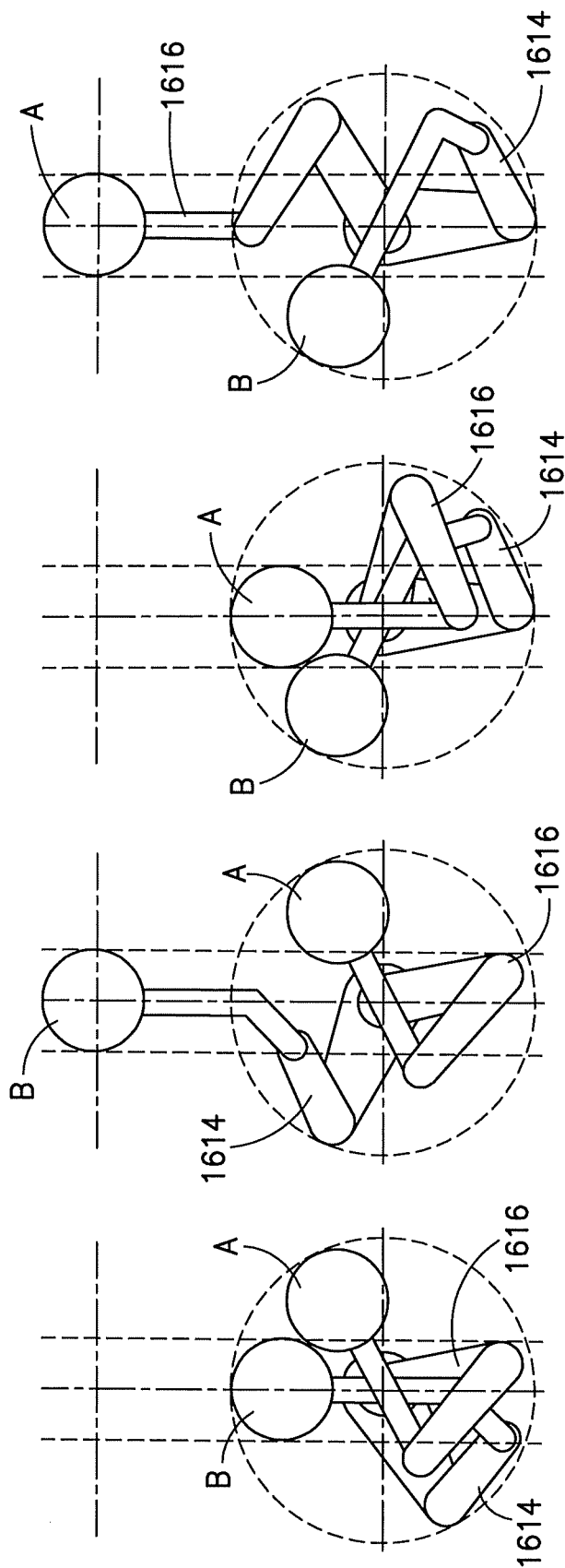
FIGS. 16A-16D are schematic plan top views of the example shown in FIG. 15 illustrating extension of the arms between retracted and extended positions.

Features as described herein may comprises a variable wrist orientation. This is illustrated by the example shown in FIG. 15. Features may be provided, for example, with:
  Independent extension arm movement, 4-axis spindle, both linkages of equal-link geometry, variable orientation of end-effectors during extension and retraction
  Independent extension arm movement, 4-axis spindle, both linkages of unequal-link geometry, variable orientation of end-effectors during extension and retraction Independent extension arm movement, 4-axis spindle, one linkage of equal-link and the other of unequal-link geometry (equal-link upper linkage, unequal-link lower linkage), variable orientation of end-effectors during extension and retraction Referring also to FIGS. 16A-16D, movement is illustrated of an example embodiment of an arm assembly with a variable wrist orientation. In this example there comprises an independent extension arm movement, a 4-axis spindle/drive, one linkage 1614 of unequal-link and the other 1616 of equal-link geometry (unequal-link upper linkage, equal-link lower linkage), variable orientation of end-effectors during extension and retraction. In this example the end-effectors do not point radially in the retracted position.

Figure 17:
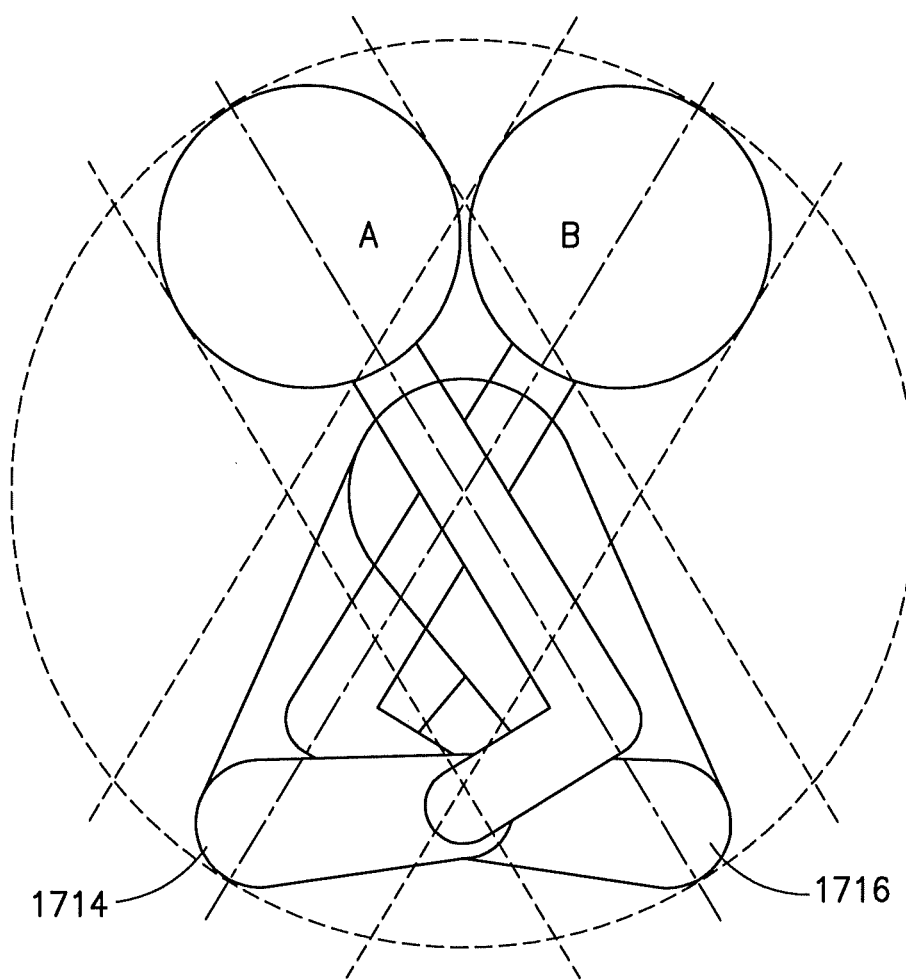
FIG. 17 is a top plan view of an alternate example of the arm assembly with L-shaped end effectors.
Figure 18:
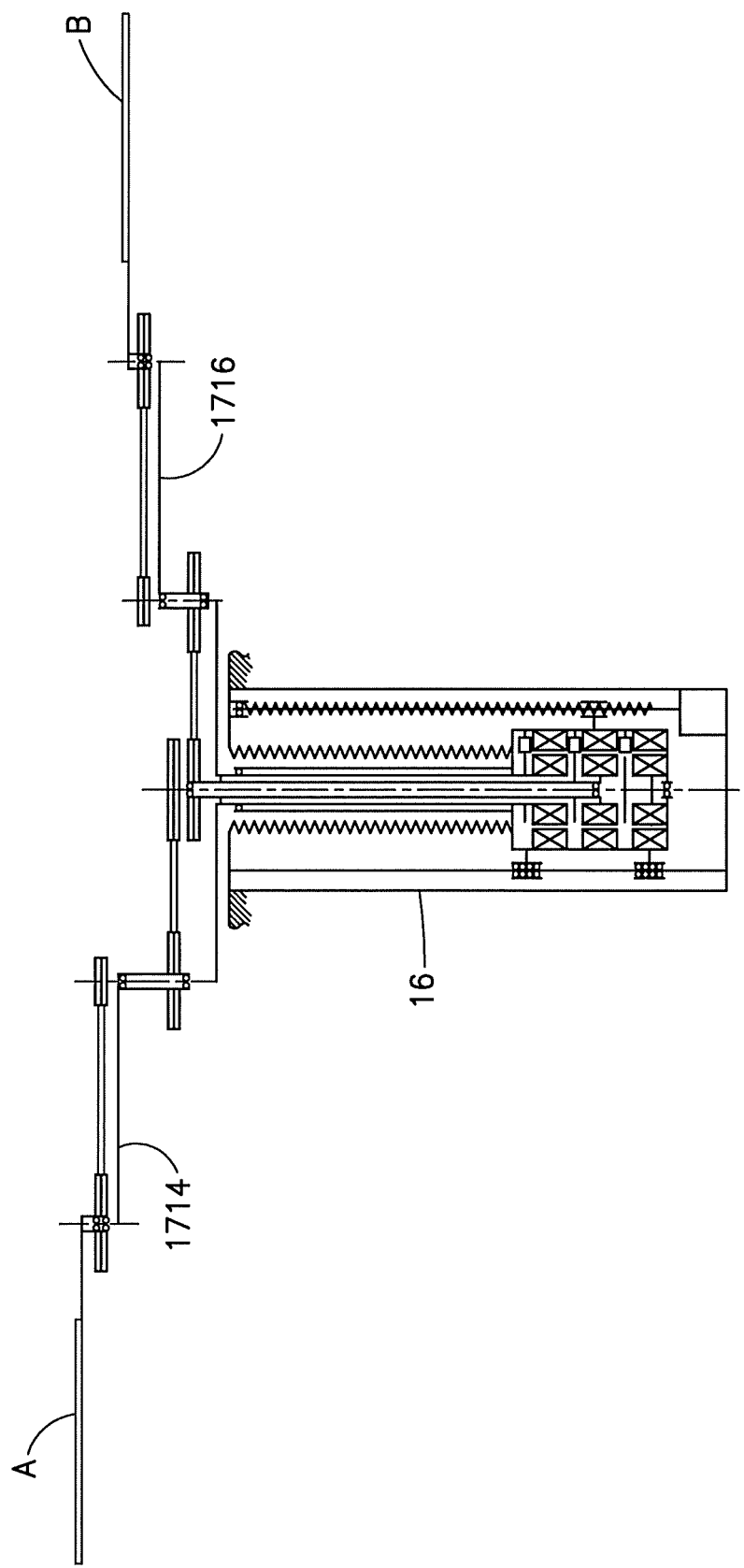
FIG. 18 is a schematic cross sectional view of the robot having the arm assembly shown in FIG. 17.
Figure 19:
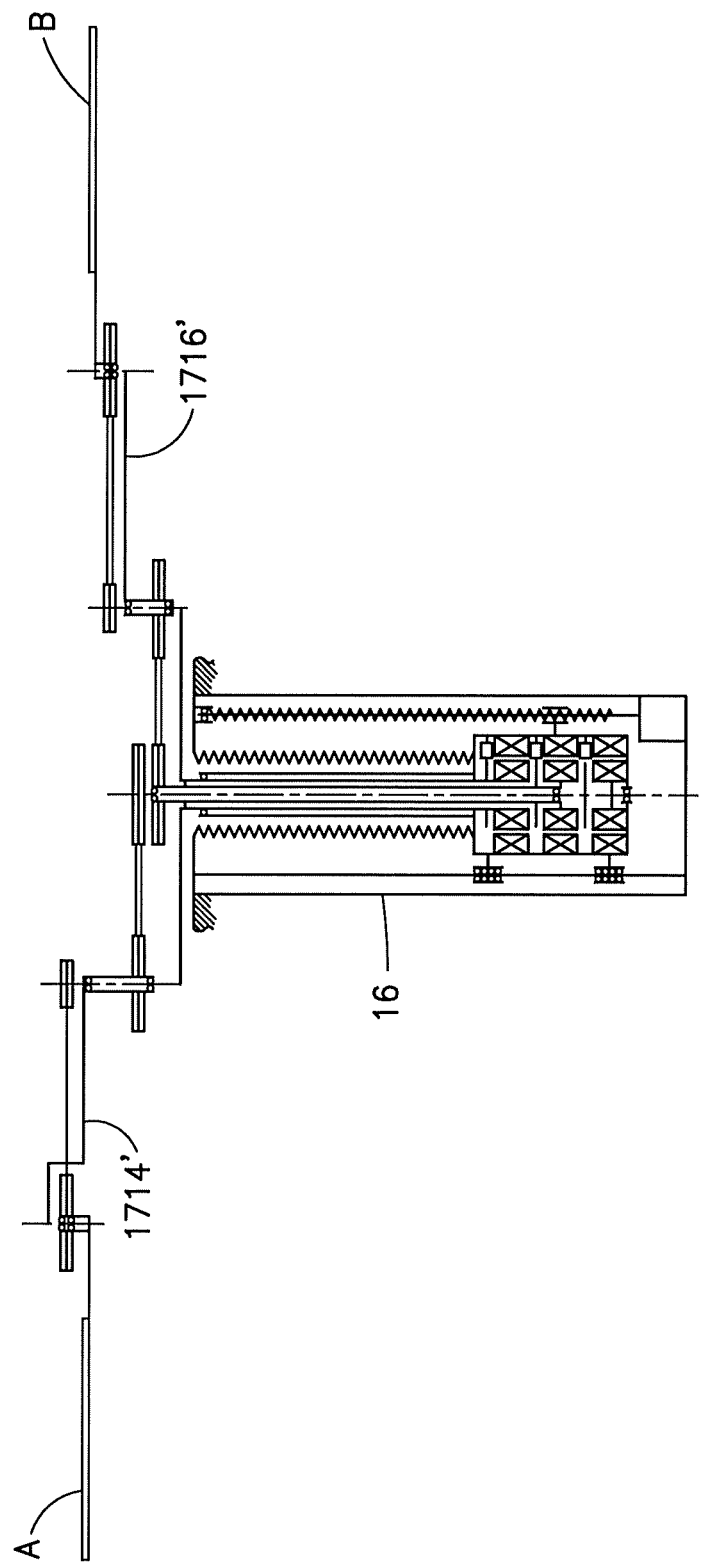
FIG. 19 is a schematic cross sectional view similar to FIG. 18 of an alternate embodiment.
Figure 20:
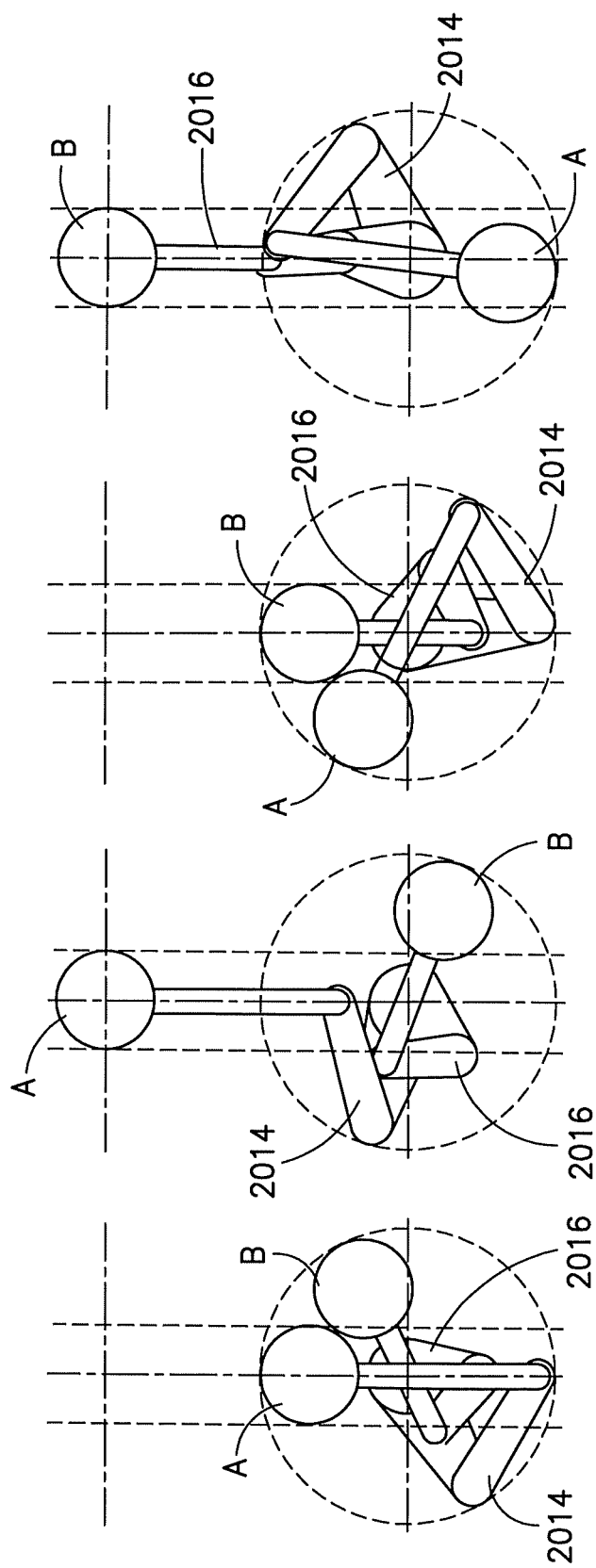
FIGS. 20A-20D are schematic plan top views of an example having straight end effectors illustrating extension of the arms between retracted and extended positions.
Figure 21:
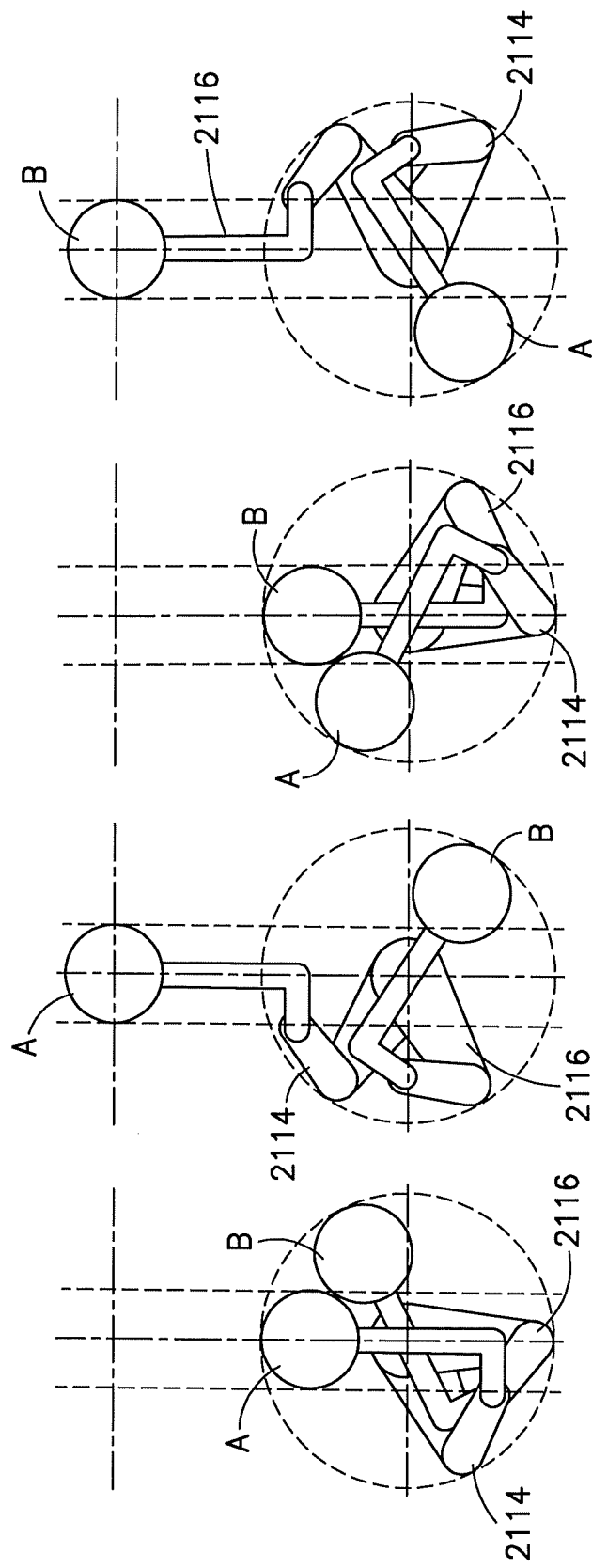
FIGS. 21A-21D are schematic plan top views of an example having L-shaped end effectors illustrating extension of the arms between retracted and extended positions.
Figure 22:
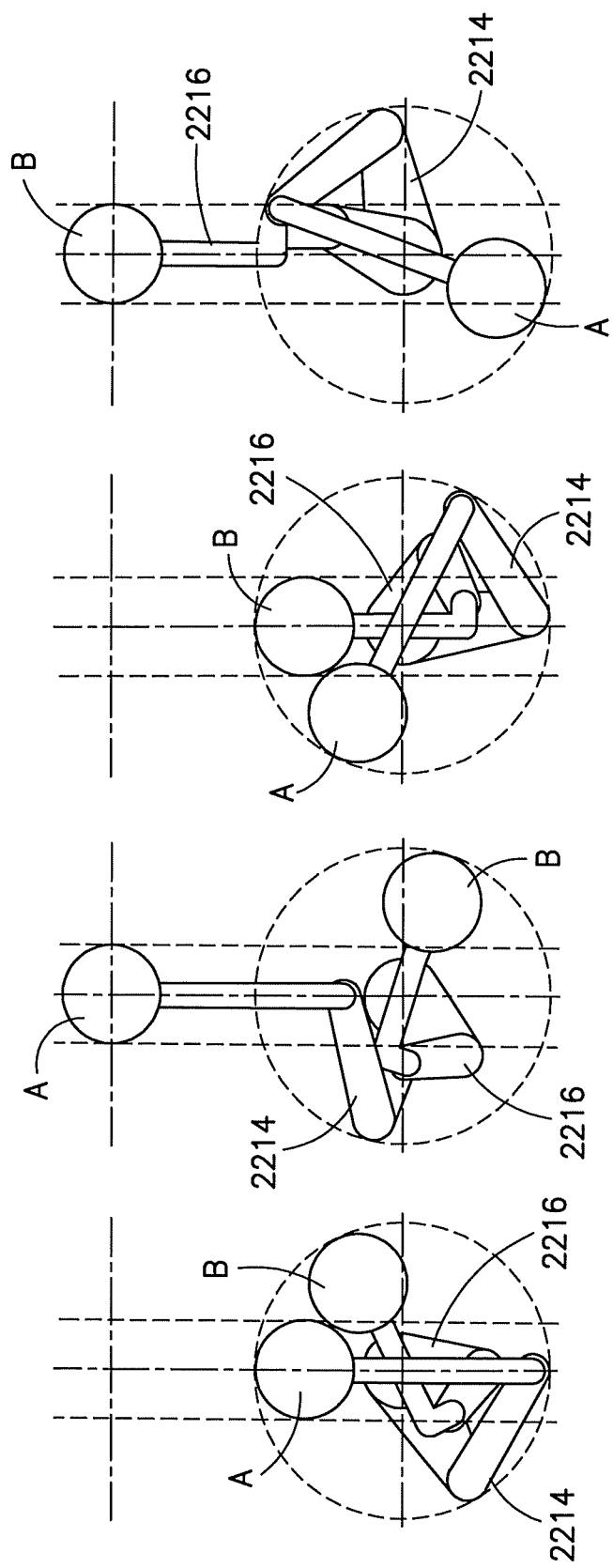
FIGS. 22A-22D are schematic plan top views of an example having one L-shaped end effector and one straight end effector illustrating extension of the arms between retracted and extended positions.
Figure 23:
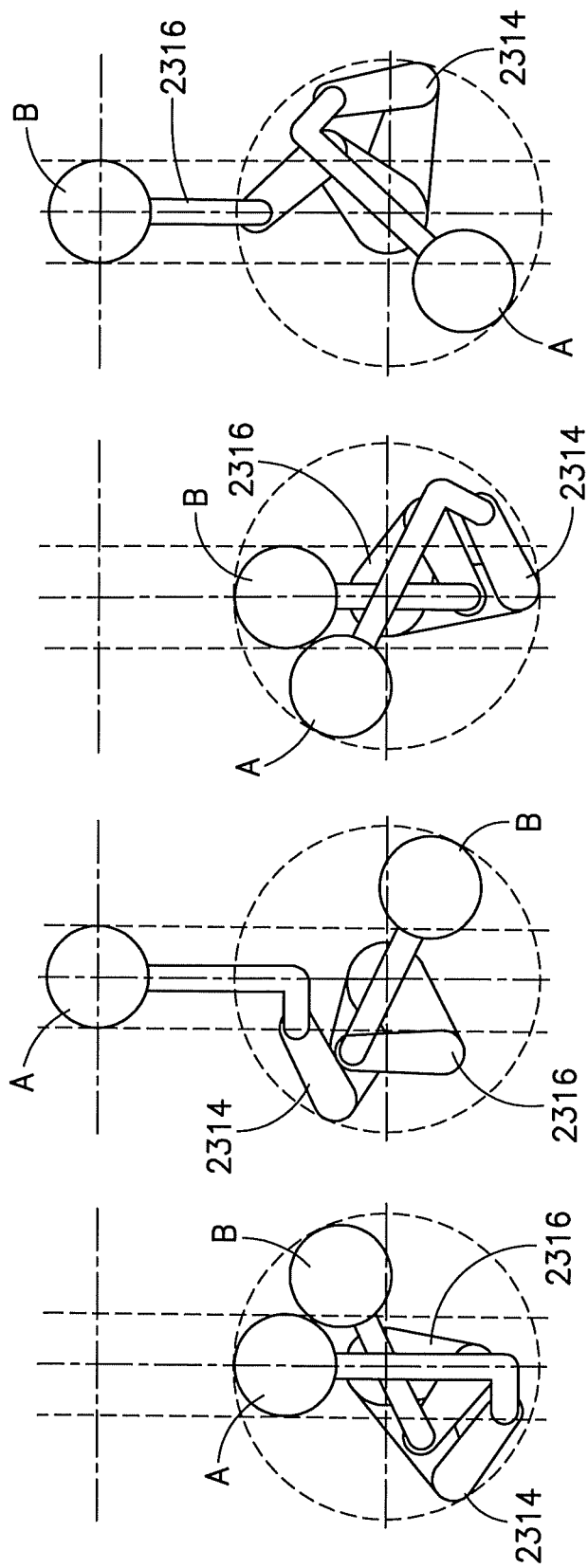
FIGS. 23A-23D are schematic plan top views of another example having one L-shaped end effector and one straight end effector illustrating extension of the arms between retracted and extended positions.

Features as described herein may comprises a coupled dual arm arrangement. This is illustrated by the example shown in FIG. 17 with arms 1714 and 1716. FIG. 18 illustrate an example of connection of the drive 16 to example embodiments of a coupled dual arm arrangement with pulleys and bands as part of the transmission in the arm assemblies. FIG. 19 illustrate another example of connection of the drive 16 to example embodiments of a coupled dual arm arrangement with pulleys and bands as part of the transmission in the arm assemblies 1714' and 1716'.

The coupled dual arm arrangement may comprise a constant wrist orientation. FIGS. 20A-20D illustrate an example comprising a coupled dual arm (rigidly connected upper arms, left and right elbow, left and right forearms), a 3-axis spindle/drive, both linkages 2014, 2016 of equal-link geometry, and a constant orientation of end-effectors during extension and retraction. FIGS. 21A-21D illustrate an example comprising a coupled dual arm (rigidly connected upper arms), 3-axis spindle, both linkages 2114, 2116 of unequal-link geometry, and constant orientation of end-effectors during extension and retraction. FIGS. 22A-22D illustrate an example comprising a coupled dual arm (rigidly connected upper arms), 3-axis spindle, one linkage 2214 of equal-link and the other 2216 of unequal-link geometry, and constant orientation of end-effectors during extension and retraction. FIGS. 23A-23D illustrate an example comprising a coupled dual arm (rigidly connected upper arms), 3-axis spindle, one linkage 2314 of unequal-link and the other 2316 of equal-link geometry, and constant orientation of end-effectors during extension and retraction.

Figure 24:
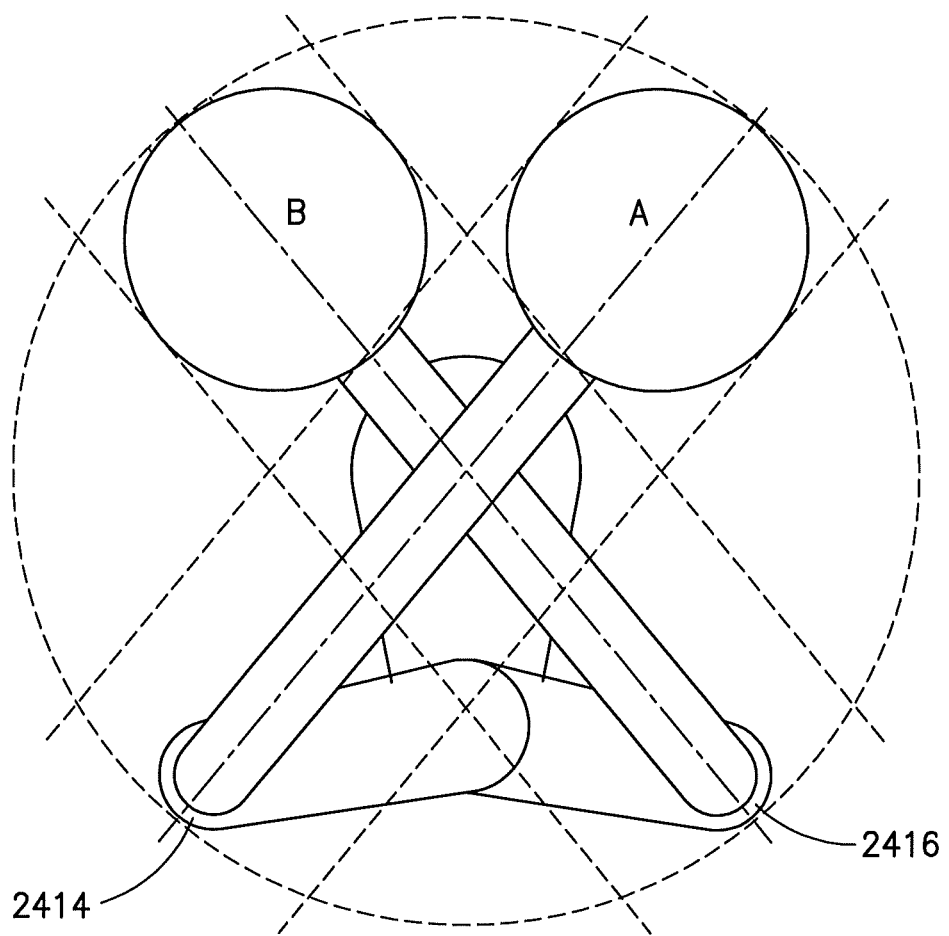
FIG. 24 is a top plan view of an alternate example of the arm assembly with straight end effectors and a single upper arm.
Figure 25A:
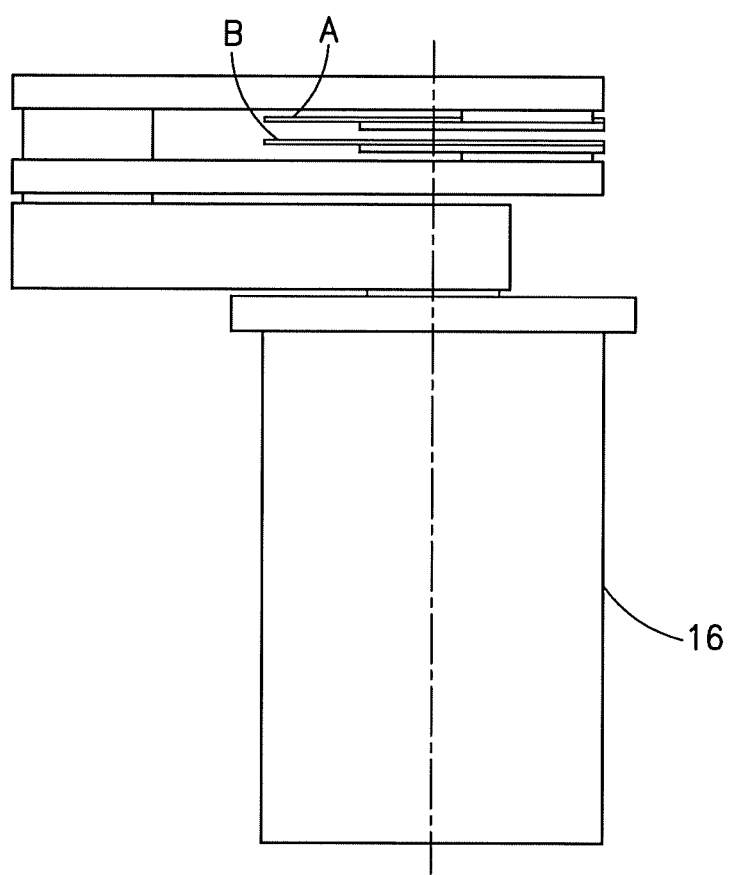
FIGS. 25A-25B are schematic side and cross sectional views of the robot having an arm assembly similar to that shown in FIG. 24.
Figure 25B:
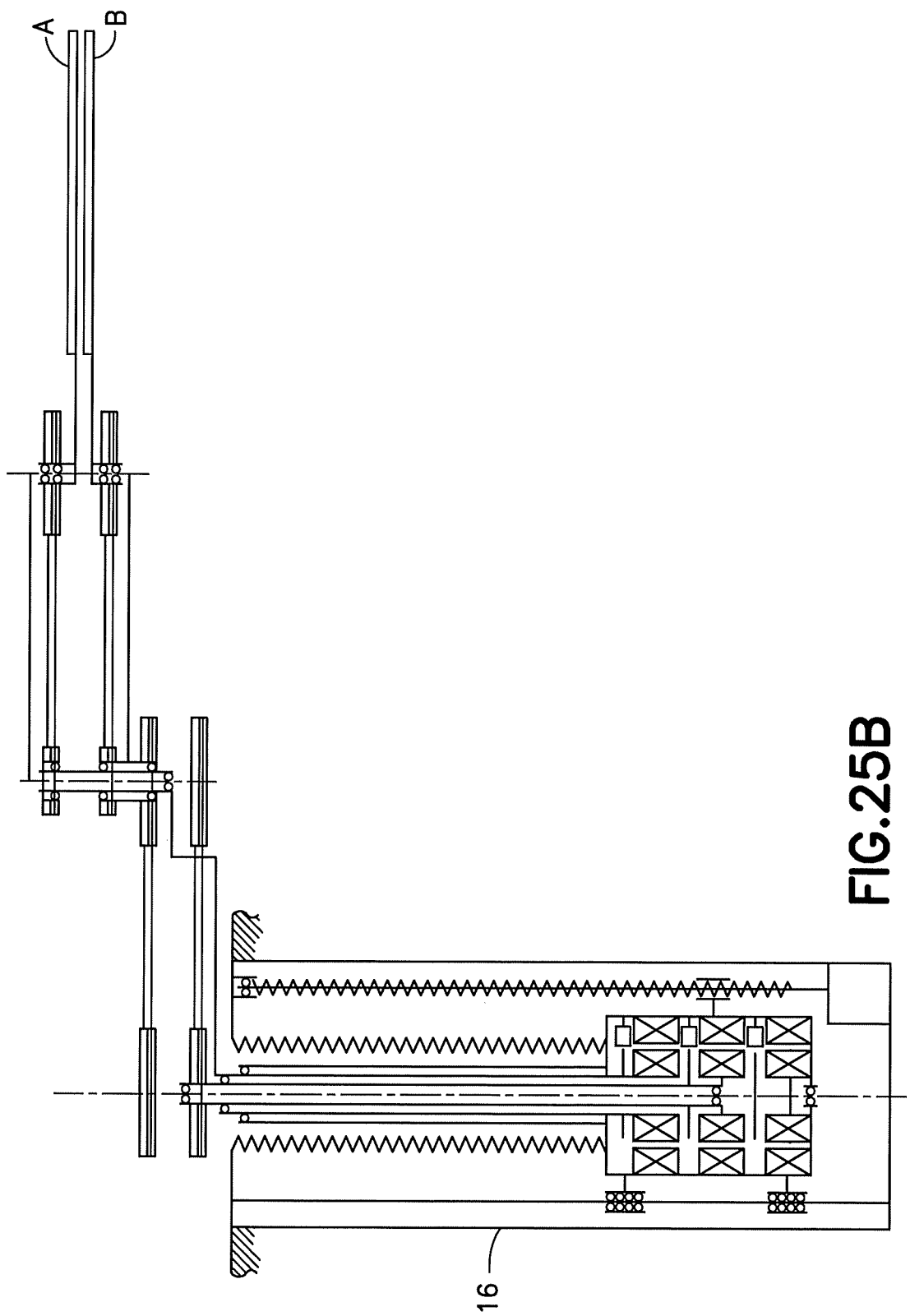
Figure 26A:
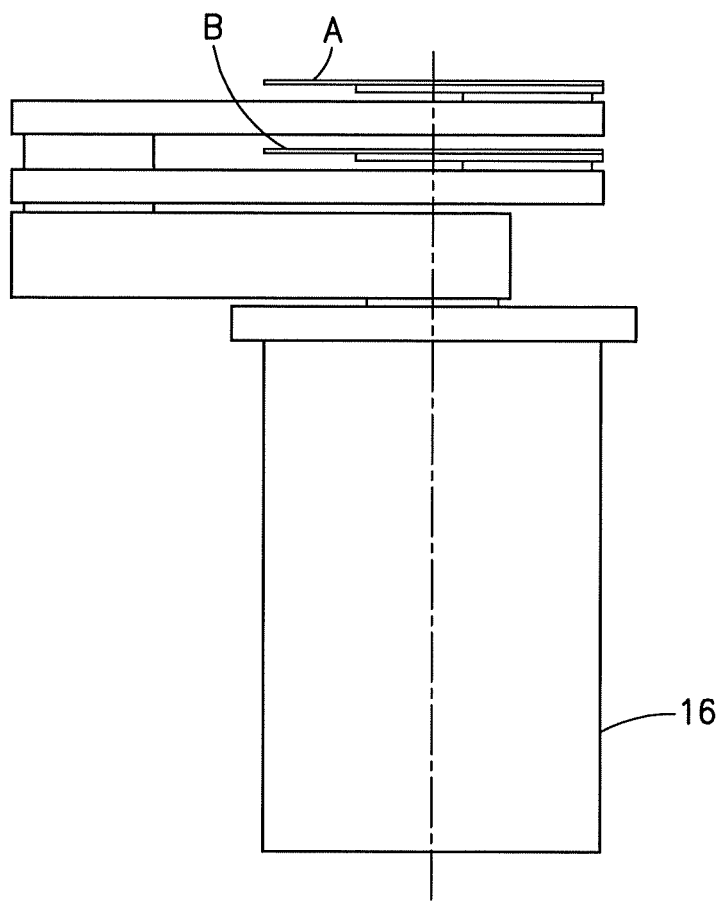

The coupled dual arm arrangement may comprise a variable wrist orientation. Examples comprises:
  Coupled dual arm (rigidly connected upper arms, left and right elbow, left and right forearms), 3-axis spindle, both linkages of equal-link geometry, variable orientation of end-effectors
  Coupled dual arm (rigidly connected upper arms), 3-axis spindle, both linkages of unequal-link geometry, variable orientation of end-effectors
  Coupled dual arm (rigidly connected upper arms), 3-axis spindle, one linkage of equal-link and the other of unequal-link geometry, variable orientation of end-effectors
  Coupled dual arm (rigidly connected upper arms), 3-axis spindle, one linkage of unequal-link and the other of equal-link geometry, variable orientation of end-effectors Features as described herein may comprise a single upper arm single elbow. An example is shown in FIG. 24 with arms 2414 and 2416. FIGS. 25A, 25B and 26A, 26B illustrate examples of connection of the drive 16 to example embodiments of a coupled dual arm arrangement with pulleys and bands as part of the transmission in the arm assemblies similar to FIG. 24.

The single upper arm single elbow arrangement may comprise a constant wrist orientation. FIGS. 27A-27D illustrate an example comprising an arm with common elbow (single upper arm, single elbow, stacked forearms), 3-axis spindle, both linkages 2714, 2716 of equal-link geometry, and constant orientation of end-effectors during extension and retraction. FIGS. 28A-28D illustrate an example comprising an arm with common elbow (single upper arm, single elbow, stacked forearms), 3-axis spindle, both linkages 2814, 2816 of unequal-link geometry, and constant orientation of end-effectors during extension and retraction. FIGS. 29A-29D illustrate an example comprising an arm with common elbow (single upper arm, single elbow, stacked forearms), 3-axis spindle, one linkage 2914 of equal-link and the other 2916 of unequal-link geometry, and constant orientation of end-effectors during extension and retraction. FIGS. 29A-29D illustrate an example comprising an arm with common elbow (single upper arm, single elbow, stacked forearms), 3-axis spindle, one linkage 3014 of unequal-link and the other 3016 of equal-link geometry, and constant orientation of end-effectors during extension and retraction.

The single upper arm single elbow arrangement may comprise a variable wrist orientation. Examples may comprise:
  Arm with common elbow (single upper arm, single elbow, stacked forearms), 3-axis spindle, both linkages of equal-link geometry, variable orientation of end-effectors
  Arm with common elbow (single upper arm, single elbow, stacked forearms), 3-axis spindle, both linkages of unequal-link geometry, variable orientation of end-effectors
  Arm with common elbow (single upper arm, single elbow, stacked forearms), 3-axis spindle, one linkage of equal-link and the other of unequal-link geometry, variable orientation of end-effectors
  Arm with common elbow (single upper arm, single elbow, stacked forearms), 3-axis spindle, one linkage of unequal-link and the other of equal-link geometry, variable orientation of end-effectors.

Figure 31:
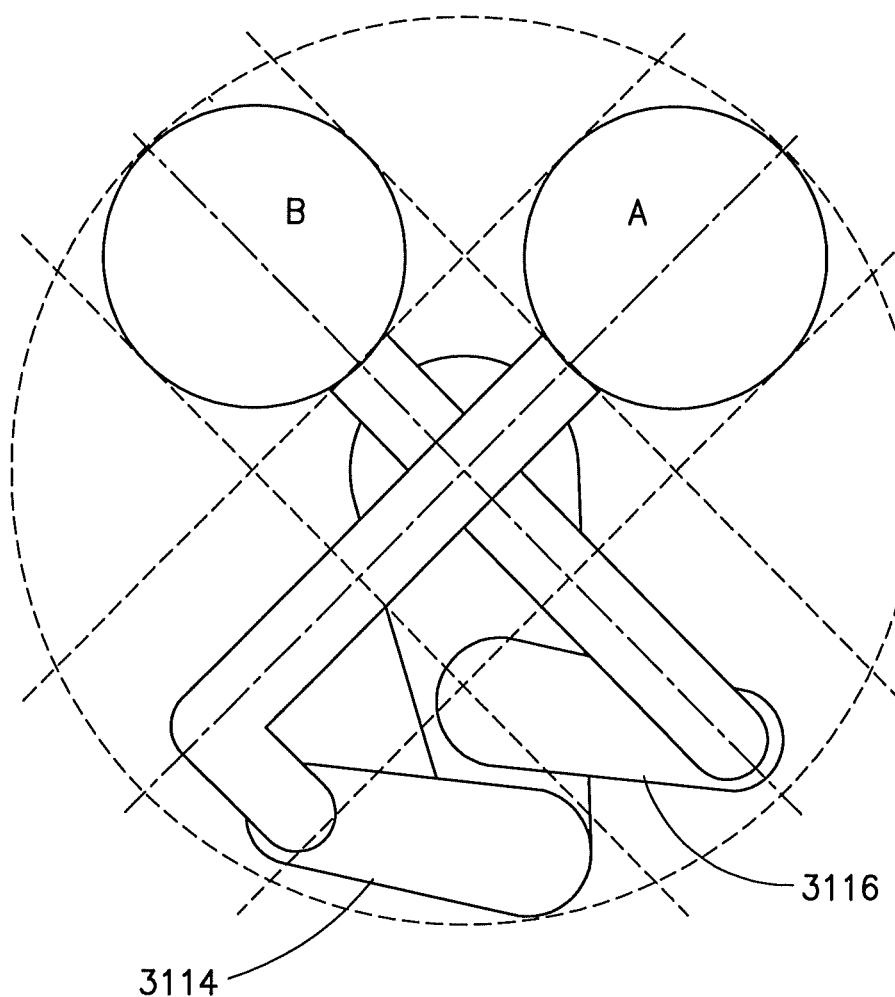
FIG. 31 is a top plan view of an alternate example of the arm assembly with a single upper arm, one straight end effectors and one L-shaped end effector, and where the forearms are connected to the single upper arm at different effective lengths on the upper arm.
Figure 32A:
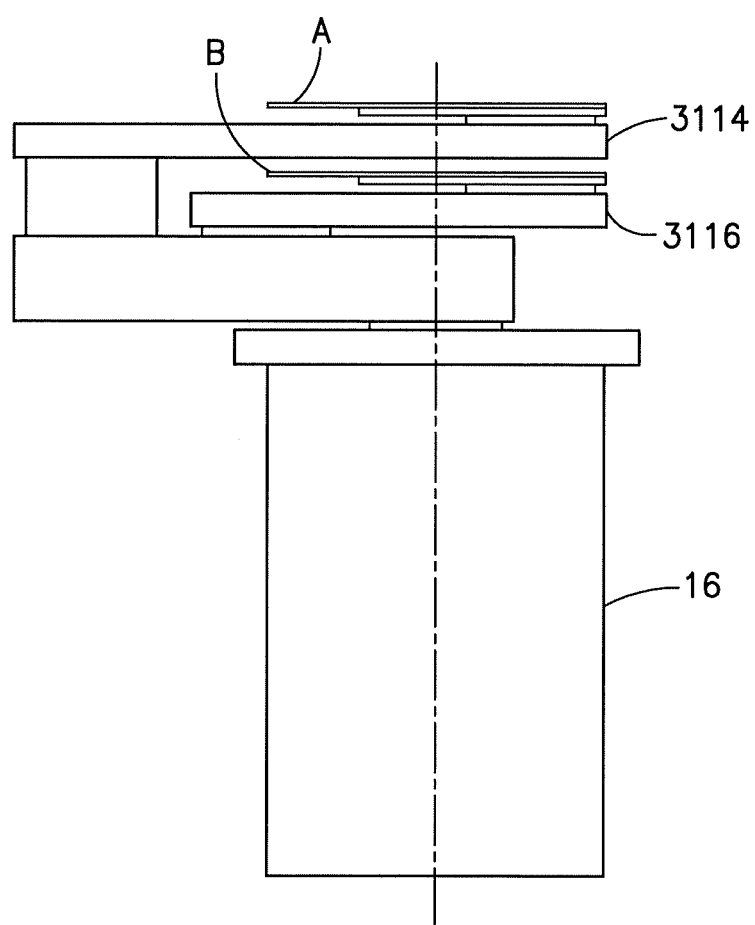
Figures 35A, 35B, 35C, 35D:
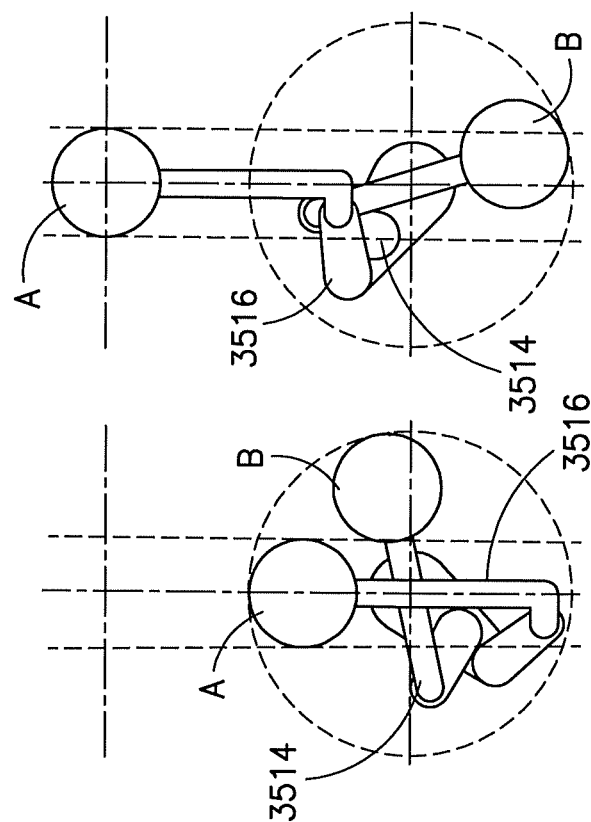
FIGS. 35A-35D are schematic plan top views of an embodiment similar to the arm assembly shown in FIG. 31 with a single upper arm and having one L-shaped end effector and one straight end effector illustrating extension of the arms between retracted and extended positions.

Features as described herein may comprise a single upper arm with offset elbows. An example is shown in FIG. 31 with linkages 3114 and 3116. FIGS. 32A, 32B illustrate examples of connection of the drive 16 to example embodiments of single upper arm with offset elbows arrangement with pulleys and bands as part of the transmission in the arm assemblies.

The single upper arm with offset elbows arrangement may comprise a constant wrist orientation. FIGS. 33A-33D illustrate an example comprising an arm with offset elbows (single upper arm, two elbow joints), 3-axis spindle, both linkages 3314, 3316 of equal-link geometry, constant orientation of end-effectors during extension and retraction. FIGS. 34A-34D illustrate an example comprising an arm with offset elbows (single upper arm, two elbow joints), 3-axis spindle, both linkages 3414, 3416 of unequal-link geometry, constant orientation of end-effectors during extension and retraction. FIGS. 35A-35D illustrate an example comprising an arm with offset elbows (single upper arm, two elbow joints), 3-axis spindle, one linkage 3514 of equal-link and the other 3516 of unequal-link geometry, constant orientation of end-effectors during extension and retraction. FIGS. 36A-36D illustrate an example comprising an arm with offset elbows (single upper arm, two elbow joints), 3-axis spindle, one linkage 3614 of unequal-link and the other 3616 of equal-link geometry, constant orientation of end-effectors during extension and retraction.

The single upper arm with offset elbows arrangement may comprise a variable wrist orientation. Examples may comprise:

Arm with offset elbows (single upper arm, two elbow joints), 3-axis spindle, both linkages of equal-link geometry, variable orientation of end-effectors Arm with offset elbows (single upper arm, two elbow joints), 3-axis spindle, both linkages of unequal-link geometry, variable orientation of end-effectors Arm with offset elbows (single upper arm, two elbow joints), 3-axis spindle, one linkage of equal-link and the other of unequal-link geometry, variable orientation of end-effectors Arm with offset elbows (single upper arm, two elbow joints), 3-axis spindle, one linkage of unequal-link and the other of equal-link geometry, variable orientation of end-effectors In accordance with one example, an apparatus may be provided comprising: a drive comprising motors and coaxial drive shafts; an arm assembly connected to the coaxial drive shafts, where the arm assembly comprises a first arm and a second arm; and a controller configured to control the motors, where the first arm comprises a first upper arm connected to a first one of the coaxial drive shafts, a first forearm connected to the first upper arm, a first end effector connected to the first forearm, and a first transmission for rotating the first end effector on the first forearm, where the first transmission comprises at least one non-circular pulley, where the first end effector comprises a first substrate holding area, where the first upper arm and the first forearm have unequal effective lengths, where the second arm comprises a second upper arm connected to a second one of the coaxial drive shafts, a second forearm connected to the second upper arm, a second end effector connected to the second forearm, and a second transmission for rotating the second end effector on the second forearm, where the second end effector comprises a second substrate holding area, where the second upper arm and the second forearm have substantially equal effective lengths, where the controller is configured to cause the drive to extend and retract the arms to move an upper substrate and a lower substrate on the substrate holding areas such that the arm assembly and upper substrate do not travel over the lower substrate. The effective lengths are the lengths between the respective axes of the pivot locations at the opposite ends of each link.

The controller may be configured to maintain the arm having the upper substrate at a stationary position relative to the drive while the controller causes the other arm to extend and retract. The controller may be configured to maintain the arm having the lower substrate at a stationary position relative to the drive while the controller causes the other arm to extend and retract. The second transmission may comprise pulleys which are not non-circular pulleys. The first end effector may have a substantially bent shape and the second end effector has a substantially straight shape. The effective length of the first upper arm may be longer than the effective length of the first forearm. In retracted positions the of the first and second arms, the second end effector may be located partially over the first end effector, the second forearm may be located partially above the first forearm and the first end effector, and the first end effector may be located partially above second upper arm. The controller, the structures of the first and second arms and the transmissions may be configured to limit movement of the first and second arms relative to each other to prevent the travel of the arm assembly and upper substrate over the lower substrate for all locations of the end effectors.

An example method may be provide comprising: extending and retracting a first arm of an arm assembly between a retracted position to an extended position, where the first arm is connected to a first coaxial drive shaft of a robot drive, and where the first arm comprises a first end effector with a first substrate holding area having a lower substrate thereon; extending and retracting a second arm of the arm assembly between a retracted position to an extended position, where the second arm is connected to a second coaxial drive shaft of the robot drive, and where the second arm comprises a second end effector with a second substrate holding area having an upper substrate thereon; and controlling the extending and retracting of the first and second arms such that the arm assembly and upper substrate do not travel over the lower substrate during the extending and retracting of the first and second arms between their respective retracted and extended positions.

The first arm may comprise a first upper arm connected to the first coaxial drive shaft, a first forearm connected to the first upper arm, the first end effector connected to the first forearm, and a first transmission for rotating the first end effector on the first forearm, where the first transmission comprises at least one non-circular pulley, where the first upper arm and the first forearm have unequal effective lengths, where the method comprises the first transmission causing the first end effector to rotate on the first forearm as the first upper arm is rotated by the first coaxial drive shaft. The second arm may comprise a second upper arm connected to the second coaxial drive shaft, a second forearm connected to the second upper arm, the second end effector connected to the second forearm, and a second transmission for rotating the second end effector on the second forearm, where the second upper arm and the second forearm have substantially equal effective lengths, and where the method comprises the second transmission causing the second end effector to rotate on the second forearm as the second upper arm is rotated by the second coaxial drive shaft, where the second transmission comprises pulleys which are not non-circular pulleys. The controlling of the extending and retracting of the first and second arms may comprise a controller maintaining the second arm at a stationary position relative to the robot drive while the controller causes the first arm to extend and retract. The controlling of the extending and retracting of the first and second arms may comprise the controller maintaining the first arm at a stationary position relative to the robot drive while the controller causes the second arm to extend and retract. The first end effector may have a substantially bent shape and the second end effector may have a substantially straight shape. The first arm may comprise a first upper arm and a first forearm, where an effective length of the first upper arm is longer than an effective length of the first forearm, where the second arm comprises a second upper arm and a second forearm, where an effective length of the second upper arm is longer than an effective length of the second forearm. In the retracted positions the of the first and second arms, the second end effector may be located partially over the first end effector, the second forearm may be located partially above the first forearm and the first end effector, and the first end effector may be located partially above second upper arm. The controlling of the extending and retracting of the first and second arms may comprise a controller, the structures of the first and second arms and transmissions in the arms limiting movement of the first and second arms relative to each other to prevent the travel of the arm assembly and upper substrate over the lower substrate for all locations of the end effectors.

An example may be provided with a non-transitory program storage device readable by a machine, tangibly embodying a program of instructions executable by the machine for performing operations, the operations comprising: causing a robot drive to move a first arm of an arm assembly with extending and retracting the first arm between a retracted position to an extended position, where the first arm is connected to a first coaxial drive shaft of the robot drive, and where the first arm comprises a first end effector with a first substrate holding area having a lower substrate thereon; causing the robot drive to move a second arm of the arm assembly with extending and retracting the second arm between a retracted position to an extended position, where the second arm is connected to a second coaxial drive shaft of the robot drive, and where the second arm comprises a second end effector with a second substrate holding area having an upper substrate thereon; and controlling the extending and retracting of the first and second arms such that the arm assembly and upper substrate do not travel over the lower substrate.

The first arm may comprise a first upper arm connected to the first coaxial drive shaft, a first forearm connected to the first upper arm, the first end effector connected to the first forearm, and a first transmission for rotating the first end effector on the first forearm, where the first transmission comprises at least one non-circular pulley, where the first upper arm and the first forearm have unequal effective lengths, where the operations comprise causing the first transmission to rotate the first end effector on the first forearm as the first upper arm is rotated by the first coaxial drive shaft. The second arm may comprise a second upper arm connected to the second coaxial drive shaft, a second forearm connected to the second upper arm, the second end effector connected to the second forearm, and a second transmission for rotating the second end effector on the second forearm, where the second upper arm and the second forearm have substantially equal effective lengths, and where the operations comprises causing the second transmission to rotate the second end effector on the second forearm as the second upper arm is rotated by the second coaxial drive shaft, where the second transmission comprises pulleys which are not non-circular pulleys.

An example embodiment may be provided comprising: means for extending and retracting a first arm of an arm assembly between a retracted position to an extended position, where the first arm is connected to a first coaxial drive shaft of a robot drive, and where the first arm comprises a first end effector with a first substrate holding area having a lower substrate thereon; means for extending and retracting a second arm of the arm assembly between a retracted position to an extended position, where the second arm is connected to a second coaxial drive shaft of the robot drive, and where the second arm comprises a second end effector with a second substrate holding area having an upper substrate thereon; and means for controlling the extending and retracting of the first and second arms such that the arm assembly and upper substrate do not travel over the lower substrate during the extending and retracting of the first and second arms between their respective retracted and extended positions.

An example embodiment may be provided comprising: circuitry configured to cause a robot drive to move a first arm of an arm assembly with extending and retracting the first arm between a retracted position to an extended position, where the first arm is connected to a first coaxial drive shaft of the robot drive, and where the first arm comprises a first end effector with a first substrate holding area having a lower substrate thereon; circuitry configured to cause the robot drive to move a second arm of the arm assembly with extending and retracting the second arm between a retracted position to an extended position, where the second arm is connected to a second coaxial drive shaft of the robot drive, and where the second arm comprises a second end effector with a second substrate holding area having an upper substrate thereon; and circuitry configured to control the extending and retracting of the first and second arms such that the arm assembly and upper substrate do not travel over the lower substrate.

An example embodiment may be provided with an apparatus comprising at least one processor; and at least one non-transitory memory including computer program code, the at least one memory and the computer program code configured to, with the at least one processor, cause the apparatus to: cause a robot drive to move a first arm of an arm assembly with extending and retracting the first arm between a retracted position to an extended position, where the first arm is connected to a first coaxial drive shaft of the robot drive, and where the first arm comprises a first end effector with a first substrate holding area having a lower substrate thereon; cause the robot drive to move a second arm of the arm assembly with extending and retracting the second arm between a retracted position to an extended position, where the second arm is connected to a second coaxial drive shaft of the robot drive, and where the second arm comprises a second end effector with a second substrate holding area having an upper substrate thereon; and control the extending and retracting of the first and second arms such that the arm assembly and upper substrate do not travel over the lower substrate.

Additional example embodiments may provide a robot with two linkages that can extend independently as described above and, in addition, may be capable of rotating independently. The added capability of independent rotation of the two linkages may allow the arm to transition between a configuration with stacked end-effectors, which may be advantageous when a fast material exchange is required, and a configuration with skewed end-effectors, which may be advantageous from a material contamination perspective. Furthermore, the added capability of independent rotation of the two linkages may improve productivity (system throughput) as one of the linkages may rotate toward the next workstation (or other destination) before the other linkage completes an operation at the current workstation (current location).

The robot drive unit may comprise a four-axis spindle, such as one additional axis of motion compared to the embodiments described above; providing four coaxial drive shafts configured to actuate a robot arm. The robot arm may feature two linkages of fundamentally the same architecture as described above that may, however, rotate independently of each other.

Figure 37A:
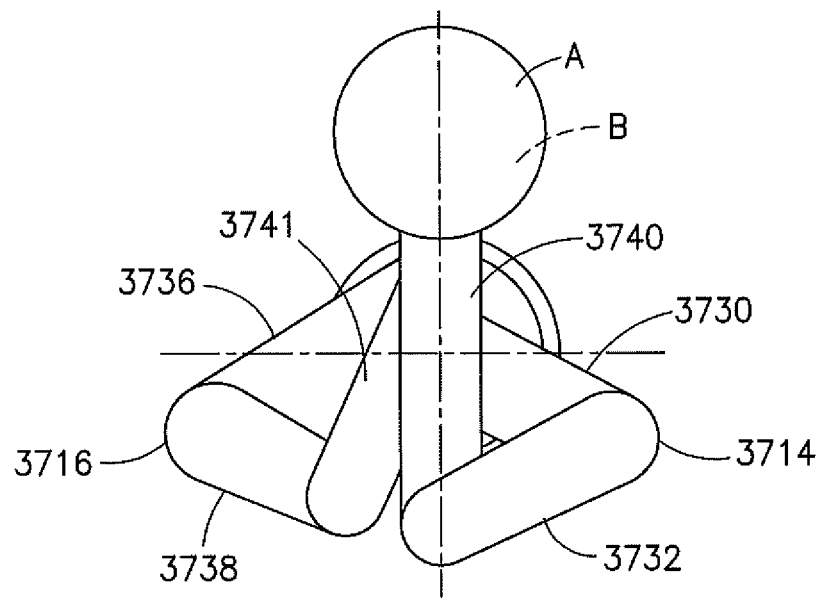
FIGS. 37A-37B are schematic top and side views of a robot.
Figure 37B:
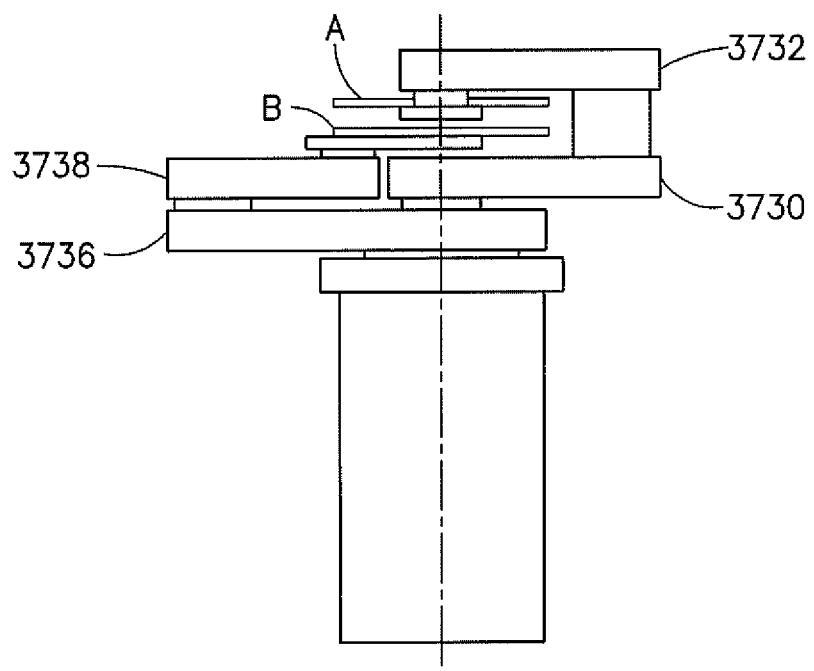
Figure 37C:
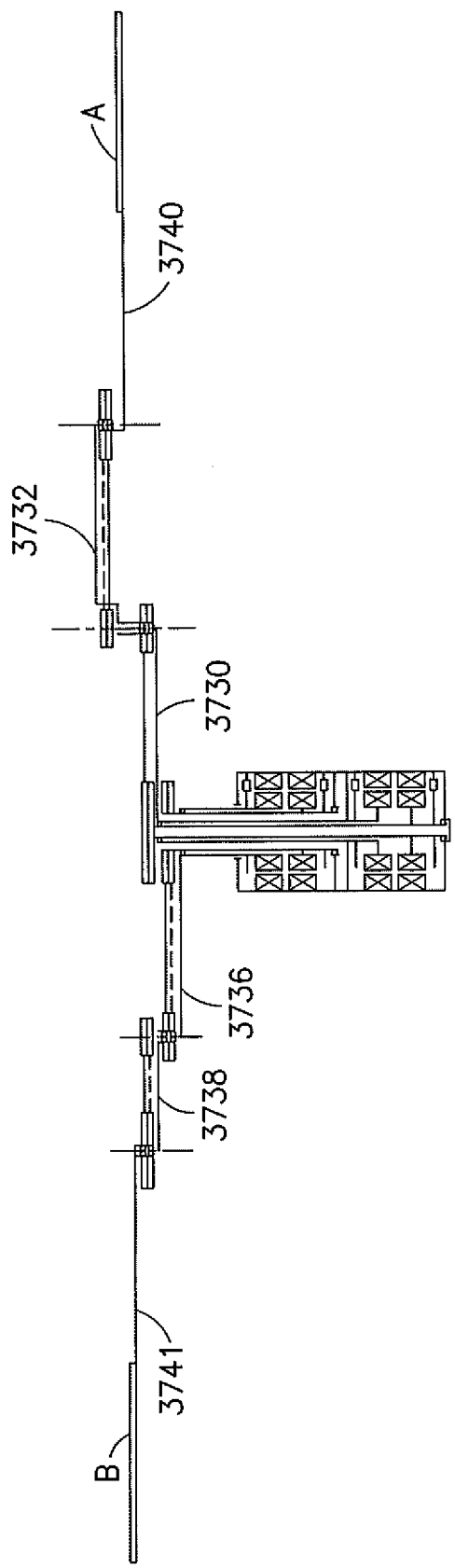
FIG. 37C is a schematic sectional view of the robot shown in FIGS. 37A-37B.

Referring also to FIGS. 37A-37C, an example embodiment is shown with a robot according comprising a robot drive unit and a robot arm. The robot drive unit may consist of a spindle with motors configured to drive four coaxial shafts T1, T2, T3 and T4 (in order from the outer-most shaft to the inner-most shaft). If so desired, the drive unit may further include a vertical lift mechanism (not shown in FIGS. 37A-37C, such as consisting of one or more linear rail-bearing arrangements and a motor-driven ball-screw, configured to lift the spindle up or down in the vertical direction.

The robot arm may consist of a right linkage 3714 and a left linkage 3716. The right linkage 3714 may consist of a right upper arm 3730, right forearm 3732 and wrist assembly with end-effector 3740. The right upper arm 3730 may be connected to shaft T3. The right forearm may be coupled to the upper arm via a rotary joint (elbow joint) and actuated by shaft T4 using a transmission arrangement. The transmission arrangement may comprise a shoulder pulley, which may be attached to shaft T4, first elbow pulley, which may be attached to right forearm A, and a band, belt or cable, which may transmit motion between the two pulleys. Wrist assembly with end-effector 3740 may be coupled to right forearm via another rotary joint (wrist joint) and rotationally constrained by another transmission arrangement. The transmission arrangement may comprise second elbow pulley, which may be attached to right upper arm, wrist pulley, which may be attached to wrist assembly with end-effector, and a band, belt or cable, which may connect the two pulleys.

The joint-to-joint length of right forearm may be equal to the joint-to-joint length of right upper arm. The transmission arrangement between shaft T4 and right forearm may be configured so that wrist joint moves along a substantially straight radial line (going through the axis of rotation of the coaxial drive shafts) when shaft T4 is kept stationary and shaft T3 is rotated. In order to achieve this, shoulder pulley and first elbow pulley may be circular, and the effective diameter of shoulder pulley may be selected to be twice the effective diameter of first elbow pulley. The transmission ratio of the transmission arrangement between right upper arm A and wrist assembly with end-effector may be configured so that the orientation of wrist assembly with end-effector remains substantially constant during this motion. In order to achieve this, second shoulder pulley and wrist pulley may be circular, and the effective diameter of wrist pulley may be selected to be twice the effective diameter of second elbow pulley.

Alternatively, the joint-to-joint length of right forearm may not be equal to the joint-to-joint length of right upper arm. For example, the joint-to-joint length of right forearm may be shorter or longer than the joint-to-joint length of right upper arm. The transmission arrangement between shaft T4 and right forearm may be configured so that wrist joint moves along a substantially straight line (parallel to a line going through the axis of rotation of the coaxial drive shafts) when shaft T4 is kept stationary and shaft T3 is rotated. In order to achieve this, at least one of the pulleys of the transmission arrangement may feature a non-circular profile. In addition, the transmission ratio of the transmission arrangement between right upper arm and wrist assembly with end-effector may be configured so that the orientation of wrist assembly with end-effector remains substantially constant during this motion. In order to achieve this, at least one of the pulleys of the transmission arrangement may feature a non-circular profile.

Left linkage 3716 may consist of left upper arm 3736, left forearm 3738 and wrist assembly with end-effector 3741. Left upper arm 3736 may be attached to shaft T1. Left forearm 3738 may be coupled to upper arm via a rotary joint (elbow joint). Wrist assembly with end-effector 3741 may be coupled to forearm 3738 via another rotary joint (wrist joint).

The joint-to-joint length of left forearm may be smaller than the joint-to-joint length of left upper arm. In particular, the length of left forearm may be conveniently selected so that wrist joint can pass by shoulder joint of the right linkage 3714, thus allowing for a vertically compact arm package. Left forearm may be actuated by shaft T2 using a transmission arrangement. The transmission arrangement may comprise shoulder pulley, which may be attached to shaft T2, first elbow pulley, which may be attached to left forearm, and a band, belt or cable, which may transmit motion between the two pulleys. At least one of the two pulleys may feature a non-circular profile to provide a variable (position-dependent) transmission ratio. Wrist assembly with end-effector 3741 may be rotationally constrained by another transmission arrangement. The transmission arrangement may comprise second elbow pulley, which may be attached to upper arm 3736, wrist pulley, which may be attached to wrist assembly with end-effector 3741, and a band, belt or cable, which may couple the two pulleys. Again, at least one of the two pulleys may feature a non-circular profile to provide a variable (position-dependent) transmission ratio.

The transmission arrangement between shaft T2 and left forearm 3738 may be configured so that wrist joint moves along a substantially straight line (parallel to a line going through the axis of rotation of the coaxial drive shafts) when shaft T2 is kept stationary and shaft T1 is rotated. This may be achieved via the non-circular profile of at least one of the two pulleys in the transmission arrangement. The transmission ratio of the transmission arrangement between left upper arm 3736 and wrist and end-effector assembly 3741 may be configured so that the orientation of wrist assembly with end-effector 3741 remains substantially constant during this motion. Again, this may be achieved via the non-circular profile of at least one of the two pulleys in the transmission arrangement.

The T1, T2, T3 and T4 shafts of the robot drive unit may be rotated so that end-effector 3740 and end-effector 3741 can access various workstations.

In order for the entire robot arm to rotate, all drive shafts, i.e., T1, T2, T3 and T4, need to move in the desired direction of rotation of the arm by the same amount. In order for right linkage to rotate independently, drive shafts T3 and T4 need to move in the desired direction of rotation of the arm by the same amount. Similarly, in order for left linkage to rotate independently, drive shafts T1 and T2 need to move in the desired direction of rotation of the arm by the same amount.

The capability of rotating the two linkages independently may allow the arm to transition between a configuration with stacked end-effectors (see FIG. 38A), which may be advantageous when a fast material exchange is required, and a configuration with skewed end-effectors (see FIG. 38B), which may be advantageous from a material contamination perspective.

Figure 38C:
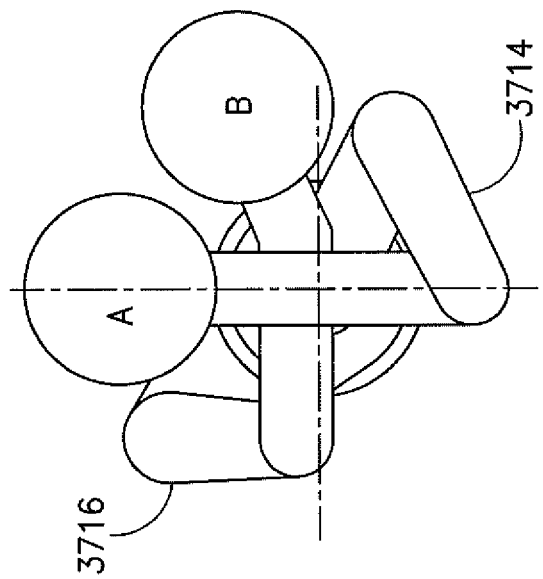
FIGS. 38A-38I are top plan views illustrating various positions of the arms of the embodiments shown in FIGS. 37A-37C.
Figure 38B:
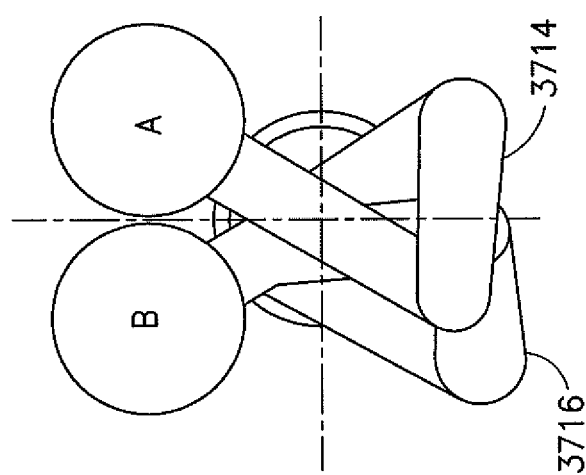
Figure 38A:
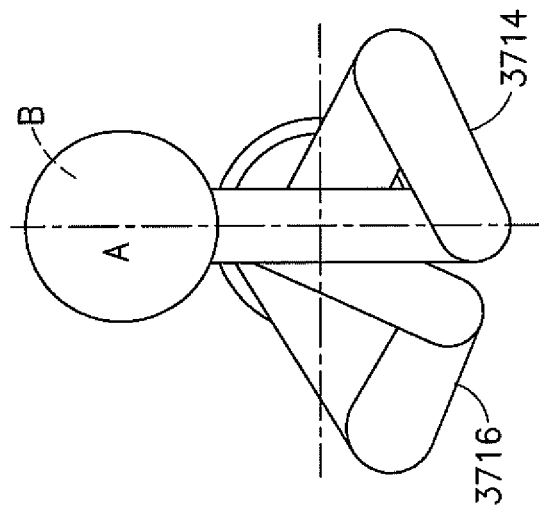
Figure 38F:
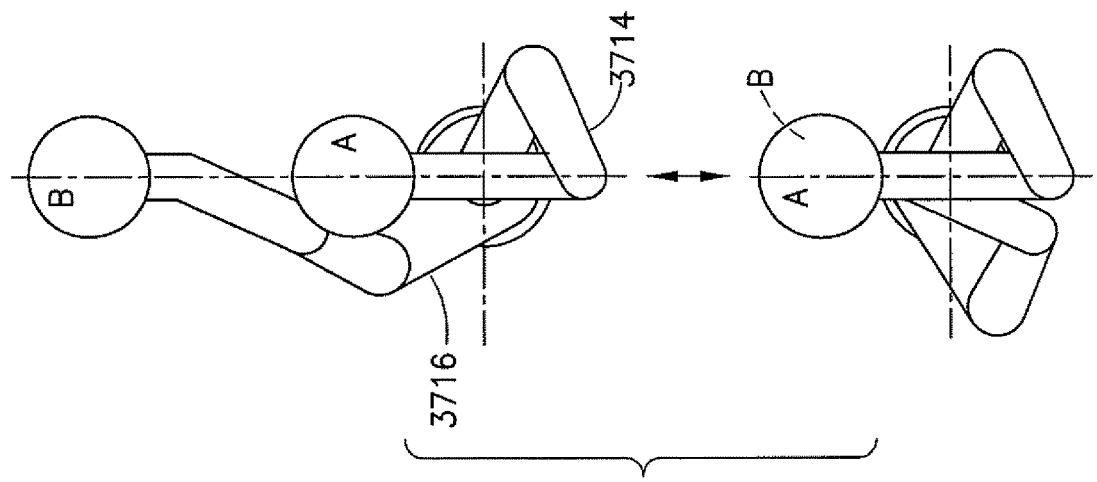
Figure 38E:
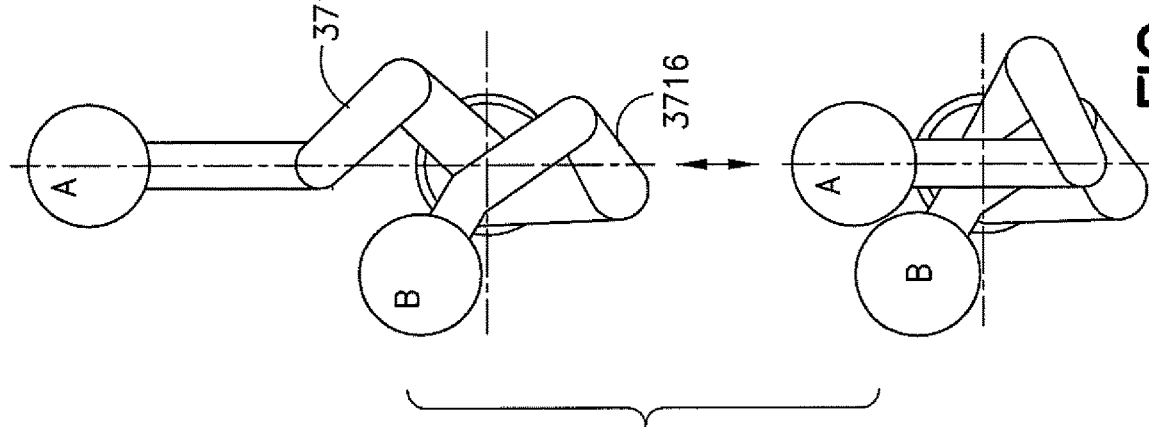
Figure 38D:
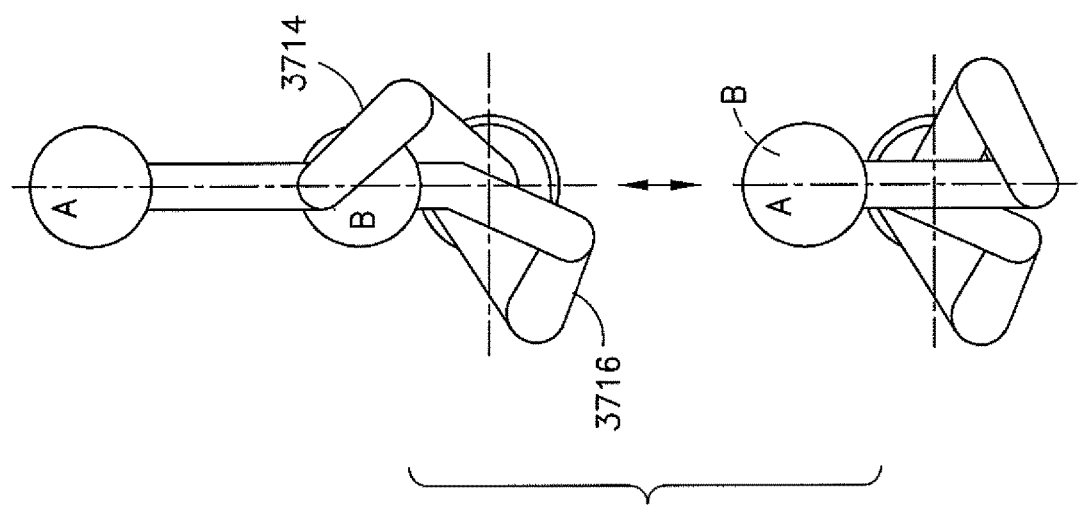
Figure 38I:
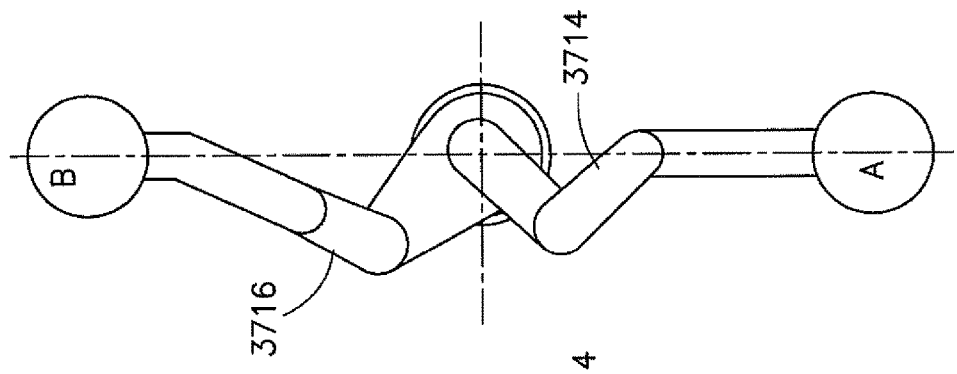
Figure 38H:
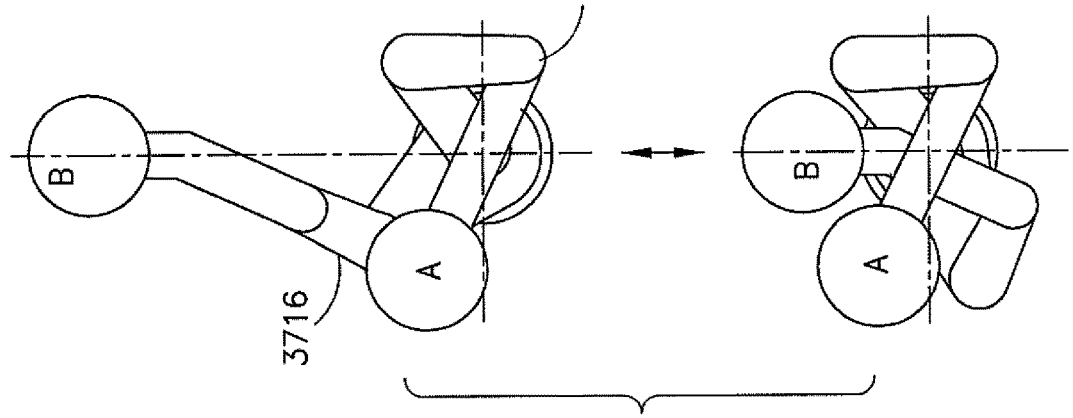
Figure 38G:
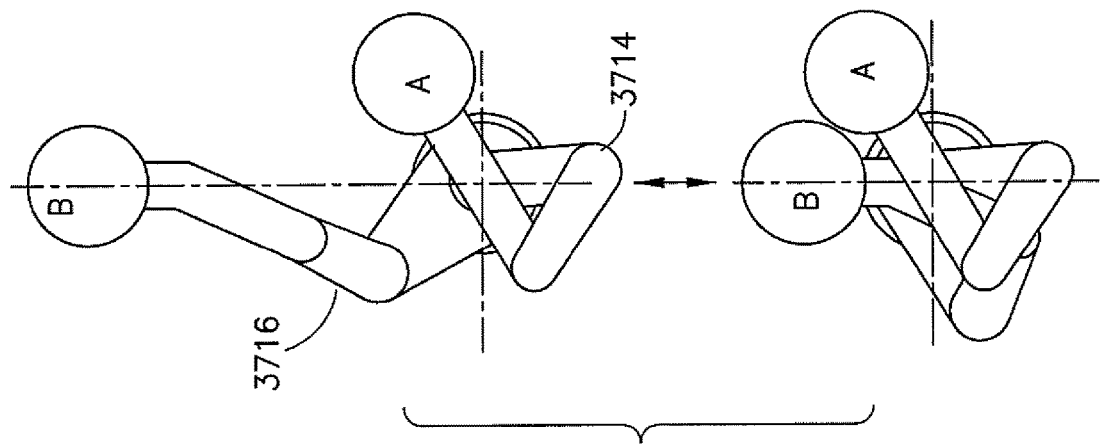

Reference is also made to FIGS. 38D-38I which shown the arms of FIGS. 38A-38C at different positions, orientations and relative movements. In order for end-effector 3740 to extend from the retracted position to a workstation along a substantially straight-line path, shaft T4 may be kept stationary and shaft T3 may be rotated in the counterclockwise directions. In order for end-effector 3741 to extend from the retracted position to a workstation along a substantially straight-line path, shaft T2 may be kept stationary and shaft T1 may be rotated in the clockwise directions.

The above operations may be utilized to pick/place material from/to a workstation. A sequence of a pick operation with one end-effector followed by a place operation with the other end-effector may be used to quickly exchange material at a workstation (rapid exchange operation). As an example, end-effector 3740 may be extended to a workstation, pick material, and retract. End-effector 3741, which may carry another piece of material, may then extend to the same station, place the material, and retract.

The capability of rotating the two linkages independently see FIG. 38C versus FIGS. 38A-38B) may further improve productivity (system throughput) as one of the linkages may rotate toward the next workstation (or other destination) before the other linkage completes an operation at the current workstation (current location). For instance, considering the above example of a rapid exchange operation, right linkage 3714 may start to rotate toward the next workstation (or other destination) before left linkage 3716 completes the place operation.

Referring also to FIG. 40, in another example embodiment the transmission arrangement between drive shaft T4 and right forearm may again comprise shoulder pulley, which may be attached to shaft T4, first elbow pulley, which may be attached to right forearm, and a band, belt or cable, which may transmit motion between the two pulleys. However, unlike the embodiment of FIGS. 37-38, the two pulleys may feature a conventional circular profile with any constant, position-independent transmission ratio. For instance, the two pulleys may be of the same effective diameter, resulting in 1:1 transmission ratio. Wrist assembly with end-effector 3740 may be rotationally constrained by another transmission arrangement, which may be identical to that of embodiment 1.

Similarly, the transmission arrangement between drive shaft T2 and left forearm may again comprise shoulder pulley, which may be attached to shaft T2, first elbow pulley, which may be attached to left forearm, and a band, belt or cable, which may transmit motion between the two pulleys. However, in contrast to the embodiment of FIGS. 37-38, the two pulleys may feature a conventional circular profile, resulting in a constant, position-independent transmission ratio. For instance, the two pulleys may be of the same effective diameter, resulting in 1:1 transmission ratio. Alternatively, any suitable transmission ratio may be used. Wrist assembly with end-effector 3741 may be rotationally constrained by another transmission arrangement, which may be identical to that of embodiment 1.

Since the transmission arrangement between drive shaft T4 and right forearm may have any constant, position-independent transmission ratio, e.g., 1:1 transmission ratio, shoulder pulley and, consequently, shoulder joint may have smaller diameters. A smaller shoulder joint may provide more space for left forearm, allowing for a larger joint-to-joint length of left forearm, which in turn may provide a longer extension of end-effector 3741.

In order for the entire robot arm to rotate, all drive shafts, i.e., T1, T2, T3 and T4, need to move in the desired direction of rotation of the arm by the same amount. In order for right linkage to rotate independently, drive shafts T3 and T4 need to move in the desired direction of rotation of the arm by the same amount. Similarly, in order for left linkage to rotate independently, drive shafts T1 and T2 need to move in the desired direction of rotation of the arm by the same amount. This is the same as in the case of the embodiment of FIGS. 37-38.

In order for end-effector 3740 to extend from the retracted position to a workstation along a predefined path, such as a straight-line radial path, drive shafts T3 and T4 may rotate in a coordinated manner in the counterclockwise and clockwise directions, respectively. The inverse kinematic equations for right linkage 3714 may be utilized to determine the orientation of drive shafts T3 and T4 as a function of the position of right end-effector 3740. Right end-effector 3740 may be retracted by rotating drive shafts T3 and T4 backward in a similar manner.

In the special case when left upper arm and left forearm have the same joint-to-joint length and shoulder pulley and first elbow pulley have the same effective diameter, end-effector may be extended and retracted along a straight-line radial path by rotating drive shafts T3 and T4 in opposite directions by the same amount in a synchronized manner.

In order for end-effector 3741 to extend from the retracted position to a workstation along a predefined path, such as a straight-line radial path, drive shafts T1 and T2 may rotate in a coordinated manner in the clockwise and counterclockwise directions, respectively. The inverse kinematic equations for left linkage may be utilized to determine the orientation of drive shafts T1 and T2 as a function of the position of left end-effector 3741. Left end-effector 3741 may be retracted by rotating drive shafts T1 and T2 backward in a similar manner.

The main functional difference between embodiments of FIG. 37C and FIG. 39 can be summarized as follows: In embodiment of FIG. 37C, each linkage of the arm can be retracted and extended by rotating a single drive shaft. This is possible because the transmission arrangement between the forearm and the corresponding drive shaft is configured to automatically control the angular position of the forearm as a function of the angular passion of the corresponding upper arm. This is not the case in embodiment of FIG. 39 where coordinated rotations of the drive shafts that actuate the upper arm and forearm are required. However, in embodiment of FIG. 39, the shoulder pulleys and, consequently, the shoulder joints may have smaller diameters. A smaller shoulder joint may provide more space for left forearm, allowing for a larger joint-to-joint length of left forearm, which in turn may provide a longer extension of end-effector 3741.

While the depictions of the above embodiments show right upper arm attached to shaft T3 and right forearm coupled to shaft T4 (inner-most shaft), right upper arm may be attached to shaft T4 (inner-most shaft) and right forearm may be coupled to shaft T3. Similarly, while left upper arm is shown attached to shaft T1 (outer-most shaft) and left forearm is shown coupled to shaft T2, left upper arm may be attached to shaft T2 and left forearm may be coupled to shaft T1 (outer-most shaft). Alternatively, the links of the linkages of the arm may be connected to the shafts of the drive unit in any suitable manner.

It should be noted that the features of the above example embodiments may be combined. For example, right linkage may be configured in accordance with embodiment of FIG. 37C and left linkage may be configured in accordance with embodiment of FIG. 39, or right linkage may be configured in accordance with embodiment of FIG. 39 and left linkage may be configured in accordance with embodiment of FIG. 37C.

Also, the arm may be designed as a mirror image of the example embodiments described above, i.e., the mechanism described above as part of right linkage A may be utilized in the left linkage of the arm, and the mechanism described above as part of left linkage may be utilized in the right linkage of the arm.

Alternatively, the features of the above example embodiments may be utilized in any suitable arrangements and their combinations.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a drive comprising motors and coaxial drive shafts;
   an arm assembly connected to the coaxial drive shafts, where the arm assembly comprises a first arm and a second arm; and
   a controller configured to control the motors,
   where the first arm comprises a first upper arm connected to a first one of the coaxial drive shafts, a first forearm connected to the first upper arm, a first end effector connected to the first forearm, and a first transmission for rotating the first end effector on the first forearm, where the first transmission comprises at least one non-circular pulley, where the first end effector comprises a first substrate holding area, where the first upper arm and the first forearm have unequal effective lengths,
   where the second arm comprises a second upper arm connected to a second one of the coaxial drive shafts, a second forearm connected to the second upper arm, a second end effector connected to the second forearm, and a second transmission for rotating the second end effector on the second forearm, where the second end effector comprises a second substrate holding area, where the second upper arm and the second forearm have substantially equal effective lengths,
   where the first end effector is skewed relative to the second end effector such that the first end effector and the second end effector are asymmetric,
   where the controller is configured to cause the drive to extend and retract the arms to move an upper substrate and a lower substrate on the substrate holding areas such that the arm assembly and upper substrate do not travel over the lower substrate.

2. The apparatus as in claim 1 where the controller is configured to maintain the arm having the upper substrate at a stationary position relative to the drive while the controller causes the other arm to extend and retract.

3. The apparatus as in claim 2 where the controller is configured to maintain the arm having the lower substrate at a stationary position relative to the drive while the controller causes the other arm to extend and retract.

4. The apparatus as in claim 1 where the second transmission comprises pulleys which are not non-circular pulleys.

5. The apparatus as in claim 1 where the first end effector has a substantially bent shape and the second end effector has a substantially straight shape.

6. The apparatus as in claim 1 where the effective length of the first upper arm is longer than the effective length of the first forearm.

7. The apparatus as in claim 1 where, in retracted positions of the first and second arms, the second end effector is located partially over the first end effector, the second forearm is located partially above the first forearm and the first end effector, and the first end effector is located partially above second upper arm.

8. The apparatus as in claim 1 where the controller, the structures of the first and second arms and the transmissions are configured to limit movement of the first and second arms relative to each other to prevent the travel of the arm assembly and upper substrate over the lower substrate for all locations of the end effectors.

9. A method comprising:
   extending and retracting a first arm of an arm assembly between a retracted position to an extended position, where the first arm is connected to a first coaxial drive shaft of a robot drive, and where the first arm comprises a first end effector with a first substrate holding area having a lower substrate thereon;
   extending and retracting a second arm of the arm assembly between a retracted position to an extended position, where the second arm is connected to a second coaxial drive shaft of the robot drive, and where the second arm comprises a second end effector with a second substrate holding area having an upper substrate thereon, the first end effector being skewed relative to the second end effector such that the first end effector and the second end effector are asymmetric; and
   controlling the extending and retracting of the first and second arms such that the arm assembly and upper substrate do not travel over the lower substrate during the extending and retracting of the first and second arms between their respective retracted and extended positions.

10. The method as in claim 9 where the first arm comprises a first upper arm connected to the first coaxial drive shaft, a first forearm connected to the first upper arm, the first end effector connected to the first forearm, and a first transmission for rotating the first end effector on the first forearm, where the first transmission comprises at least one non-circular pulley, where the first upper arm and the first forearm have unequal effective lengths, where the method comprises the first transmission causing the first end effector to rotate on the first forearm as the first upper arm is rotated by the first coaxial drive shaft.

11. The method as in claim 10 where the second arm comprises a second upper arm connected to the second coaxial drive shaft, a second forearm connected to the second upper arm, the second end effector connected to the second forearm, and a second transmission for rotating the second end effector on the second forearm, where the second upper arm and the second forearm have substantially equal effective lengths, and where the method comprises the second transmission causing the second end effector to rotate on the second forearm as the second upper arm is rotated by the second coaxial drive shaft, where the second transmission comprises pulleys which are not non-circular pulleys.

12. The method as in claim 9 where the controlling of the extending and retracting of the first and second arms comprises a controller maintaining the second arm at a stationary position relative to the robot drive while the controller causes the first arm to extend and retract.

13. The method as in claim 12 where the controlling of the extending and retracting of the first and second arms comprises the controller maintaining the first arm at a stationary position relative to the robot drive while the controller causes the second arm to extend and retract.

14. The method as in claim 9 where the first end effector has a substantially bent shape and the second end effector has a substantially straight shape.

15. The method as in claim 9 where the first arm comprises a first upper arm and a first forearm, where an effective length of the first upper arm is longer than an effective length of the first forearm, where the second arm comprises a second upper arm and a second forearm, where an effective length of the second upper arm is longer than an effective length of the second forearm.

16. The method as in claim 15 where, in the retracted positions the of the first and second arms, the second end effector is located partially over the first end effector, the second forearm is located partially above the first forearm and the first end effector, and the first end effector is located partially above second upper arm.

17. The method as in claim 9 where the controlling of the extending and retracting of the first and second arms comprises a controller, the structures of the first and second arms and transmissions in the arms limiting movement of the first and second arms relative to each other to prevent the travel of the arm assembly and upper substrate over the lower substrate for all locations of the end effectors.

18. A non-transitory program storage device readable by a machine, tangibly embodying a program of instructions executable by the machine for performing operations, the operations comprising:

causing a robot drive to move a first arm of an arm assembly with extending and retracting the first arm between a retracted position to an extended position, where the first arm is connected to a first coaxial drive shaft of the robot drive, and where the first arm comprises a first end effector with a first substrate holding area having a lower substrate thereon;

causing the robot drive to move a second arm of the arm assembly with extending and retracting the second arm between a retracted position to an extended position, where the second arm is connected to a second coaxial drive shaft of the robot drive, and where the second arm comprises a second end effector with a second substrate holding area having an upper substrate thereon, the first end effector being skewed relative to the second end effector such that the first end effector and the second end effector are asymmetric; and controlling the extending and retracting of the first and second arms such that the arm assembly and upper substrate do not travel over the lower substrate.

19. The non-transitory program storage device as claimed in claim 18 where the first arm comprises a first upper arm connected to the first coaxial drive shaft, a first forearm connected to the first upper arm, the first end effector connected to the first forearm, and a first transmission for rotating the first end effector on the first forearm, where the first transmission comprises at least one non-circular pulley, where the first upper arm and the first forearm have unequal effective lengths, where the operations comprise causing the first transmission to rotate the first end effector on the first forearm as the first upper arm is rotated by the first coaxial drive shaft.

20. The non-transitory program storage device as claimed in claim 19 where the second arm comprises a second upper arm connected to the second coaxial drive shaft, a second forearm connected to the second upper arm, the second end effector connected to the second forearm, and a second transmission for rotating the second end effector on the second forearm, where the second upper arm and the second forearm have substantially equal effective lengths, and where the operations comprises causing the second transmission to rotate the second end effector on the second forearm as the second upper arm is rotated by the second coaxial drive shaft, where the second transmission comprises pulleys which are not non-circular pulleys.

* * * * *